US011508661B2

(12) United States Patent
Wang et al.

(10) Patent No.: US 11,508,661 B2
(45) Date of Patent: Nov. 22, 2022

(54) INTEGRATED CIRCUIT AND METHOD OF MANUFACTURING SAME

(71) Applicant: TAIWAN SEMICONDUCTOR MANUFACTURING COMPANY, LTD., Hsinchu (TW)

(72) Inventors: Pochun Wang, Hsinchu (TW); Ting-Wei Chiang, New Taipei (TW); Chih-Ming Lai, Hsinchu (TW); Hui-Zhong Zhuang, Kaohsiung (TW); Jung-Chan Yang, Longtan Township (TW); Ru-Gun Liu, Zhubie (TW); Ya-Chi Chou, Hsinchu (TW); Yi-Hsiung Lin, Zhubei (TW); Yu-Xuan Huang, Hsinchu (TW); Yu-Jung Chang, Hsinchu (TW); Guo-Huei Wu, Hsinchu (TW); Shih-Ming Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 301 days.

(21) Appl. No.: 16/936,249

(22) Filed: Jul. 22, 2020

(65) Prior Publication Data

US 2020/0350250 A1 Nov. 5, 2020

Related U.S. Application Data

(62) Division of application No. 16/135,684, filed on Sep. 19, 2018, now Pat. No. 10,734,321.

(Continued)

(51) Int. Cl.
*H01L 23/48* (2006.01)
*H01L 23/535* (2006.01)
(Continued)

(52) U.S. Cl.
CPC .......... *H01L 23/535* (2013.01); *G06F 30/39* (2020.01); *G06F 30/392* (2020.01);
(Continued)

(58) Field of Classification Search
CPC ................ H01L 23/535; H01L 27/0924; H01L 27/0886
See application file for complete search history.

(56) References Cited

U.S. PATENT DOCUMENTS 7,271,488 B2   9/2007  Arakawa
7,855,414 B2 * 12/2010  Ito ..................... H01L 29/7835
                                                    257/335

(Continued)

FOREIGN PATENT DOCUMENTS

JP      2015057856      3/2015
TW       201338135      9/2013
(Continued)

OTHER PUBLICATIONS

Office Action dated Jul. 5, 2019 from corresponding application No. TW 107133934.

(Continued)

*Primary Examiner* — Hoa B Trinh
(74) *Attorney, Agent, or Firm* — Hauptman Ham, LLP

(57) ABSTRACT

An integrated circuit includes a set of active regions in a substrate, a first set of conductive structures, a shallow trench isolation (STI) region, a set of gates and a first set of vias. The set of active regions extend in a first direction and is located on a first level. The first set of conductive structures and the STI region extend in at least the first direction or a second direction, is located on the first level, and is between the set of active regions. The STI region is between the set of active regions and the first set of conductive structures. The set of gates extend in the second direction and overlap the first set of conductive structures.

(Continued)

The first set of vias couple the first set of conductive structures to the set of gates.

20 Claims, 26 Drawing Sheets

Related U.S. Application Data

(60) Provisional application No. 62/564,663, filed on Sep. 28, 2017.

(51) Int. Cl.
| | | |
|---|---|---|
| *H01L 21/768* | (2006.01) | |
| *H01L 27/088* | (2006.01) | |
| *H01L 27/092* | (2006.01) | |
| *H01L 21/8238* | (2006.01) | |
| *G06F 30/39* | (2020.01) | |
| *G06F 30/392* | (2020.01) | |

(52) U.S. Cl.
CPC ............... *H01L 21/76895* (2013.01); *H01L 21/823821* (2013.01); *H01L 27/0886* (2013.01); *H01L 27/0924* (2013.01)

(56) References Cited

U.S. PATENT DOCUMENTS

| | | |
|---|---|---|
| 9,136,393 B2 * | 9/2015 | Liu .................... H01L 21/30604 |
| 9,887,186 B2 | 2/2018 | Chang |
| 10,396,063 B2 | 8/2019 | Chang |
| 10,402,529 B2 | 9/2019 | Hanchinal |
| 2006/0151883 A1 | 7/2006 | Arakawa |
| 2009/0224317 A1 | 9/2009 | Becker |
| 2013/0174112 A1 | 7/2013 | Ho |
| 2013/0201749 A1 | 8/2013 | Chung |
| 2014/0367799 A1 | 12/2014 | Becker et al. |
| 2015/0048447 A1 * | 2/2015 | Sharma ............... H01L 29/7816 |
| | | 438/259 |
| 2015/0340448 A1 * | 11/2015 | Babcock ........... H01L 29/66712 |
| | | 257/340 |

FOREIGN PATENT DOCUMENTS

| | | |
|---|---|---|
| TW | 201421472 | 6/2014 |
| TW | 201711151 | 3/2017 |

OTHER PUBLICATIONS

OA dated Nov. 28, 2019 from corresponding application No. KR 10-2018-0116307.

Office Action dated Sep. 27, 2020 from corresponding application No. CN 201811112150.6, pp. 1-8.

* cited by examiner

INTEGRATED CIRCUIT AND METHOD OF MANUFACTURING SAME

PRIORITY CLAIM

The present application is a divisional of U.S. application Ser. No. 16/135,684, filed Sep. 19, 2018, which claims the benefit of U.S. Provisional Application No. 62/564,663, filed Sep. 28, 2017, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
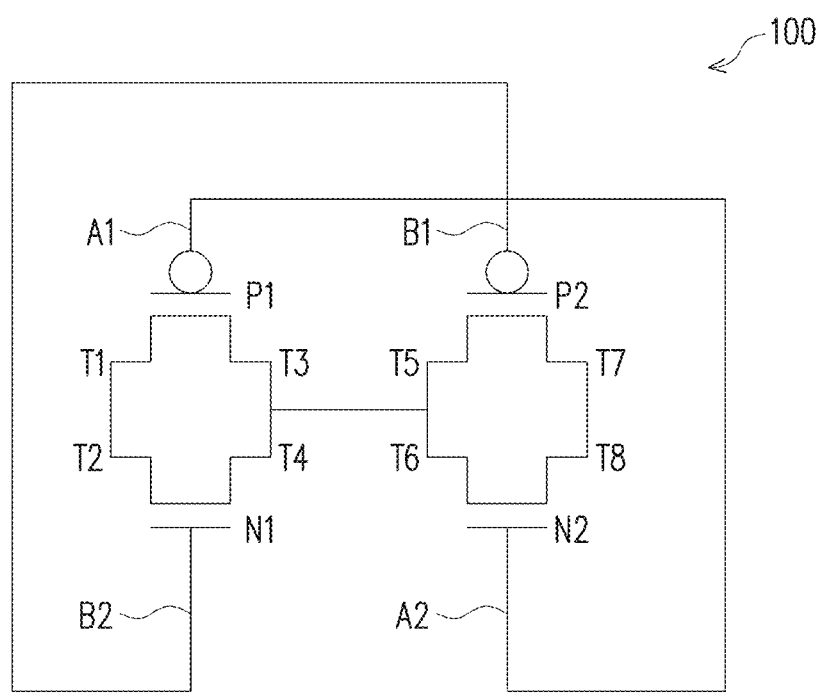
FIG. 1 is a circuit diagram of an integrated circuit, in accordance with some embodiments.

The patent or application file contains drawings/photographs executed in color. Copies of this patent with color drawing(s)/photograph(s) will be provided by the Office upon request and payment of the necessary fee.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a set of active regions in a substrate, a first set of conductive structures, a shallow trench isolation (STI) region, a set of gates and a first set of vias. In some embodiments, the first set of conductive structures are located below the set of gates and the metal-0 (M0) layer of the integrated circuit. In some embodiments, the first set of conductive structures are referred to as "a buried track," as the conductive structures of the first set of conductive structures are buried in the substrate, and beneath at least the M0-layer, the MD layer or the POLY layer. In some embodiments, by using the buried track beneath the M0-layer, one M0 track is reduced yielding a standard cell with a smaller height and smaller area compared with other approaches. In some embodiments, the height of a standard cell of the present disclosure is reduced by up to 50% compared with other approaches.

In some embodiments, the first set of conductive structures includes a single conductive structure that extends in a first direction or a second direction. In some embodiments, the single conductive structure extends in only a single direction (e.g., first direction or second direction) and is referred to as a one directional (1D) structure. In some embodiments, the first set of conductive structures includes a first and a second conductive structure. In some embodiments, the first conductive structure extends in the first direction, and the second conductive structure extends in the second direction, and the first and the second conductive structure are referred to as a two directional (2D) structure.

In some embodiments, the STI region is between the set of active regions and the first set of conductive structures. In some embodiments, a top surface of the set of conductive structures is below a top surface of the active region of the integrated circuit or a top surface of a fin of the integrated circuit. In some embodiments, the integrated circuit comprises a transmission gate.

In some embodiments, by utilizing the first set of conductive structures of the integrated circuit of the present disclosure the gate density of a standard cell is increased by up to 30% by offering more routing flexibility than other approaches. In some embodiments, the first set of conductive structures increases routing resources for standard cells compared to other approaches. In some embodiments, the current resistance (IR) and Electromigration (EM) of the present disclosure are improved compared to other approaches.

FIG. 1 is a circuit diagram of an integrated circuit 100, in accordance with some embodiments. In some embodiments, integrated circuit 100 corresponds to a transmission gate.

Integrated circuit 100 includes two P-type metal oxide semiconductor (PMOS) transistors P1 and P2, and two N-type metal oxide semiconductor (NMOS) transistors N1 and N2.

PMOS transistor P1 includes a gate terminal A1, a terminal T1 and a terminal T3.

NMOS transistor N1 includes a gate terminal B2, a terminal T2 and a terminal T4.

Terminal T1 of PMOS transistor P1 is electrically coupled to terminal T2 of NMOS transistor N1. Terminal T3 of PMOS transistor P1 is electrically coupled to terminal T4 of NMOS transistor N1. NMOS transistor N1 and PMOS transistor P1 are coupled to each other to form a first transistor pair.

PMOS transistor P2 includes a gate terminal B1, a terminal T5 and a terminal T7.

NMOS transistor N2 includes a gate terminal A2, a terminal T6 and a terminal T8. Terminal T7 of PMOS transistor P2 is electrically coupled to terminal T8 of NMOS transistor N2. Terminal T5 of PMOS transistor P2 is electrically coupled to the terminal T6 of NMOS transistor N2. NMOS transistor N2 and PMOS transistor P2 are coupled to each other to form a second transistor pair.

The gate terminal A1 of PMOS transistor P1 is electrically coupled to the gate terminal A2 of NMOS transistor N2. The gate terminal B1 of PMOS transistor P2 is electrically coupled to the gate terminal B2 of NMOS transistor N1. Terminal T3 of PMOS transistor P1 and terminal T4 of NMOS transistor N1 are electrically coupled to the terminal T6 of NMOS transistor N2 and the terminal T5 of PMOS transistor P2.

In some embodiments, at least one terminal of terminals T1, T2, T3, T4, T5, T6, T7 or T8 corresponds to a source terminal. In some embodiments, at least one terminal of terminals T1, T2, T3, T4, T5, T6, T7 or T8 corresponds to a drain terminal. Other configurations of terminals in integrated circuit 100 are within the scope of the present disclosure.

In some embodiments, at least integrated circuit 100, integrated circuit 400 (FIGS. 4A-4E), layout design 200 (FIG. 2), layout design 300 (FIG. 3), layout design 500A (FIG. 5A), layout design 600A (FIG. 6A), layout design 700A (FIG. 7A), layout design 800A (FIG. 8A) or layout design 900A (FIG. 9A) corresponds to one or more standard cells. In some embodiments, the standard cell is a transmission gate. In some embodiments, a standard cell is a logic gate cell. In some embodiments, a logic gate cell includes an AND, OR, NAND, NOR, XOR, INV, AND-OR-Invert (AOI), OR-AND-Invert (OAD, MUX, Flip-flop, BUFF, Latch, delay, clock cells, or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM), a read only memory (ROM), or the like. In some embodiments, a standard cell includes one or more active or passive elements. Examples of active elements include, but are not limited to, transistors, diodes, or the like. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drain, or the like. Examples of passive elements include, but are not limited to, capacitors, inductors, fuses, resistors or the like. In some embodiments, IC 100 includes other features not shown for ease of illustration.

Figure 2:
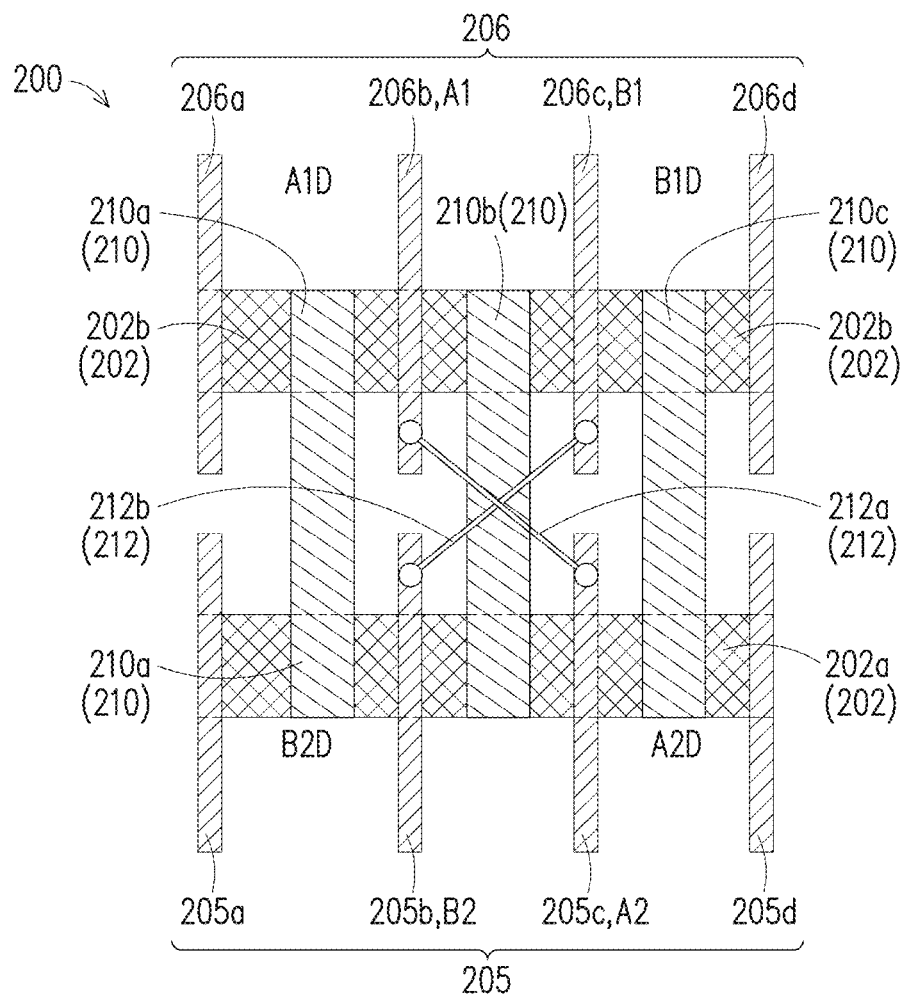
FIG. 2 is a diagram of a layout design of an integrated circuit, in accordance with some embodiments.

FIG. 2 is a diagram of a layout design 200 of an integrated circuit, in accordance with some embodiments.

Figure 3:
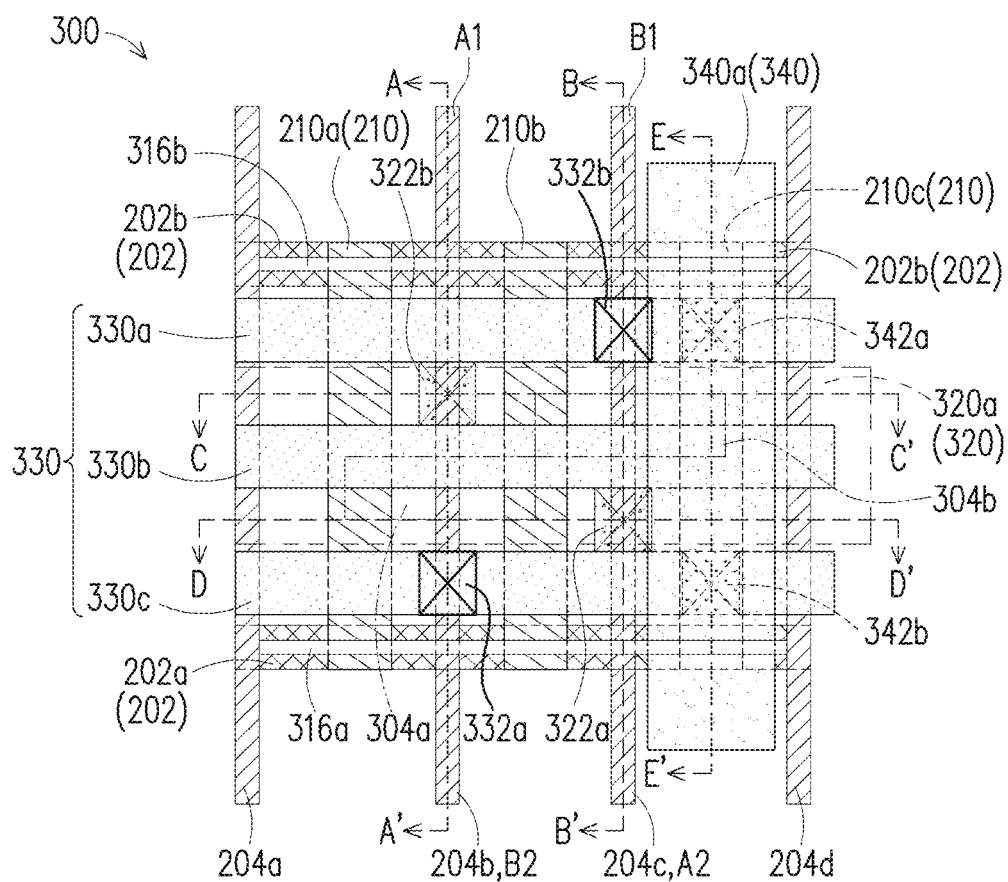
FIG. 3 is a diagram of a layout design of an integrated circuit, in accordance with some embodiments.
Figure 4A:
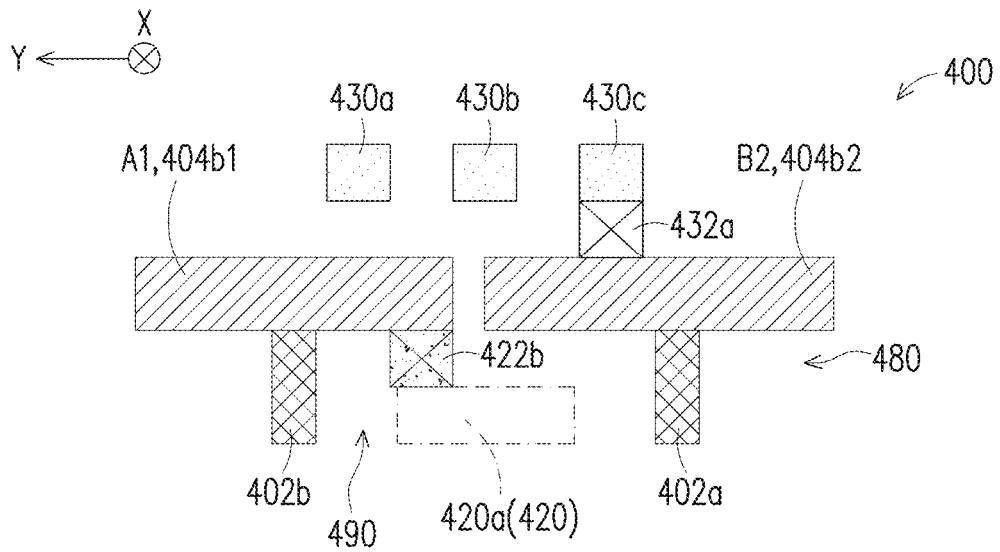
FIGS. 4A, 4B, 4C, 4D and 4E are cross-sectional views of an integrated circuit, in accordance with some embodiments.
Figure 4B:
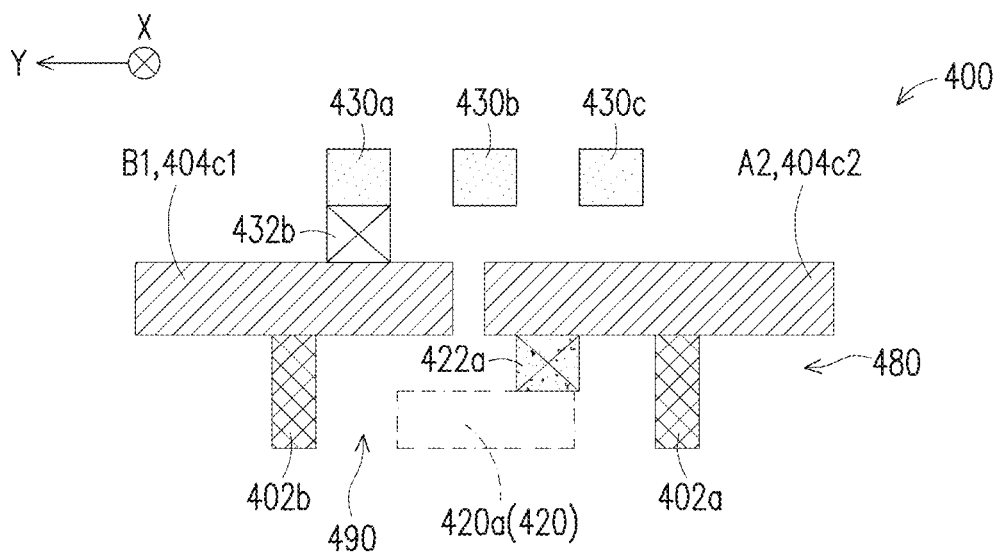
Figure 4C:
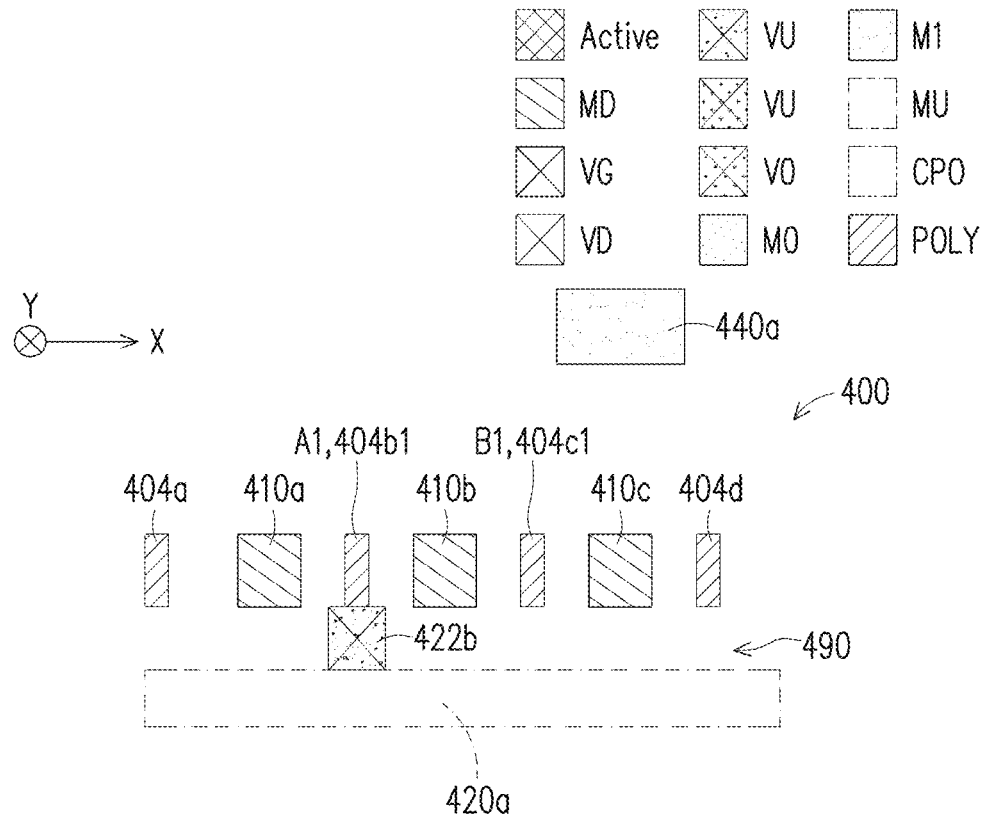
Figure 4D:
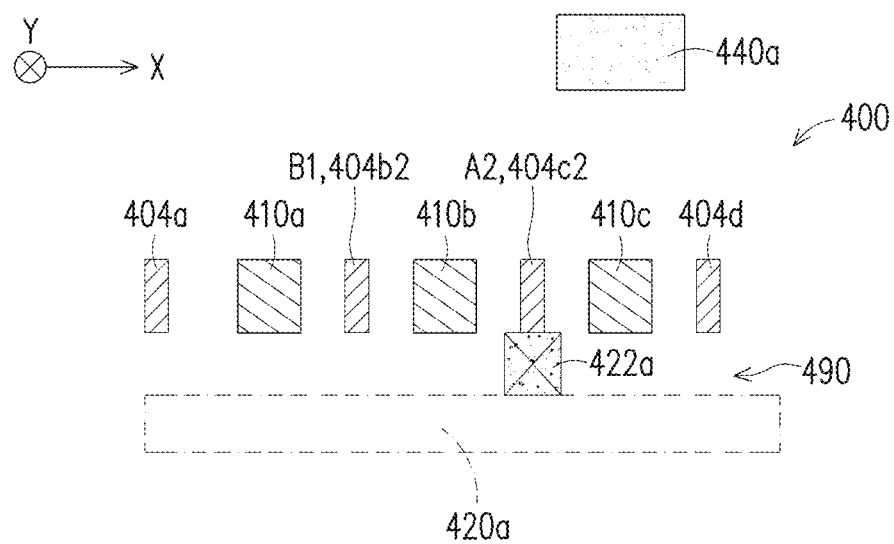
Figure 4E:
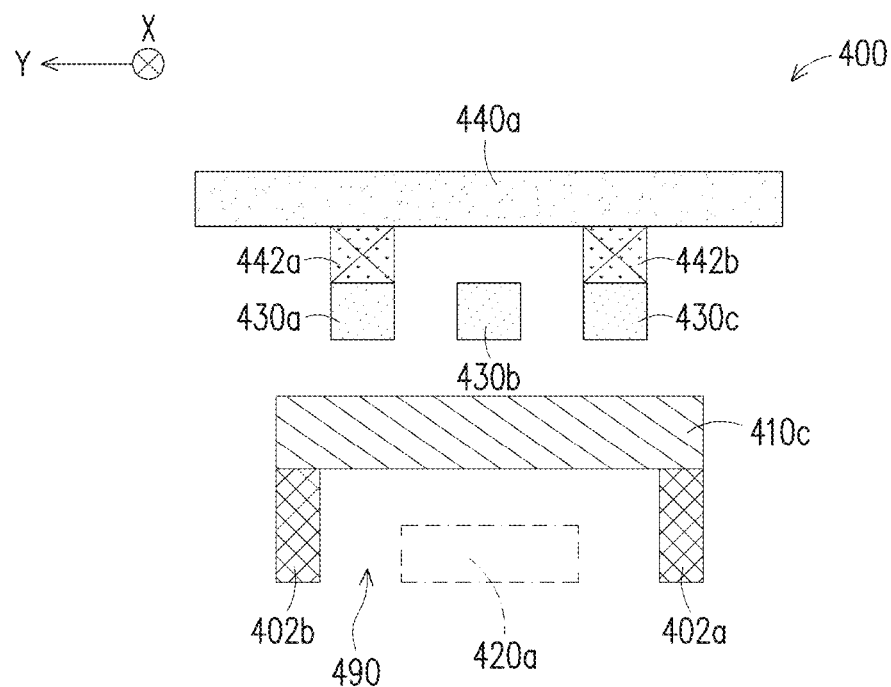
Figure 5A:
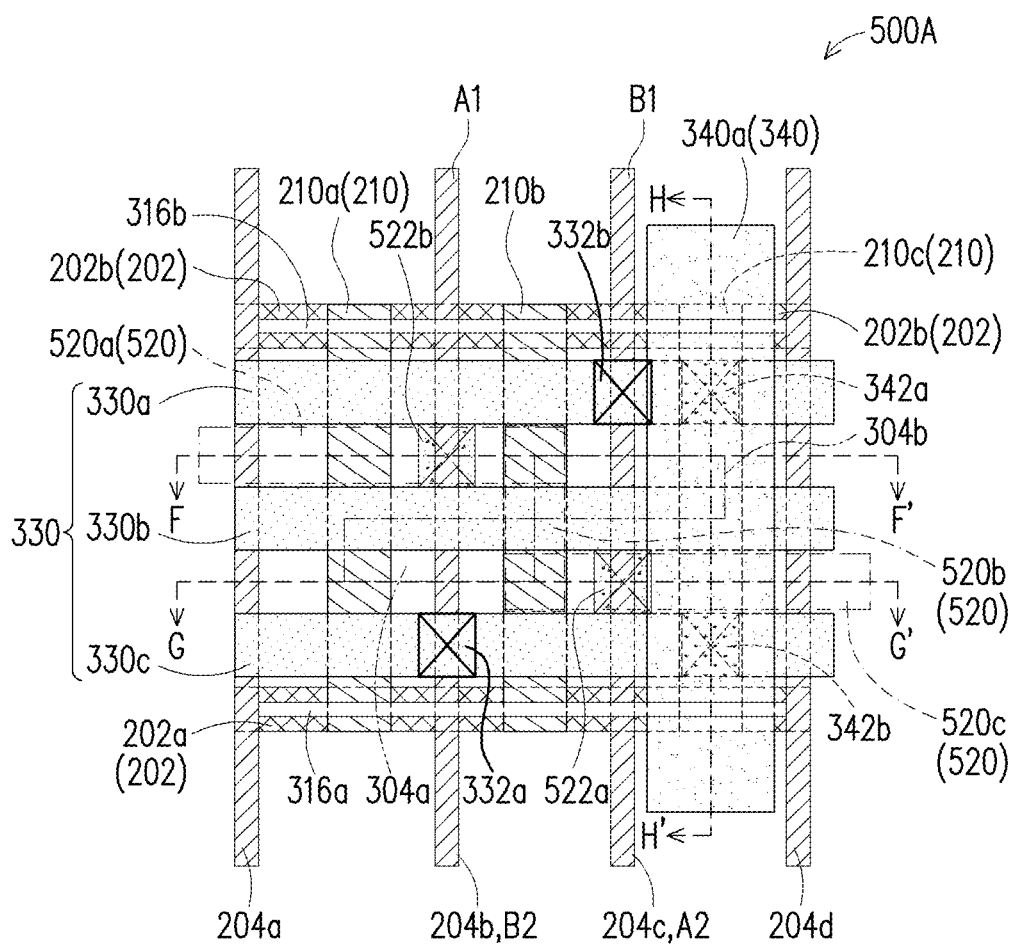
FIG. 5A is a diagram of a layout design of an integrated circuit, in accordance with some embodiments.
Figure 5B:
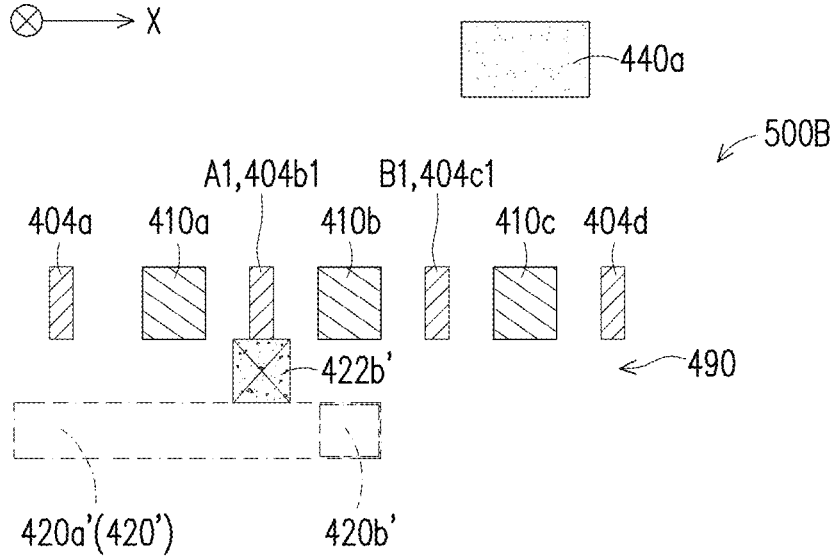
FIGS. 5B, 5C and 5D are cross-sectional views of an integrated circuit, in accordance with some embodiments.
Figure 5C:
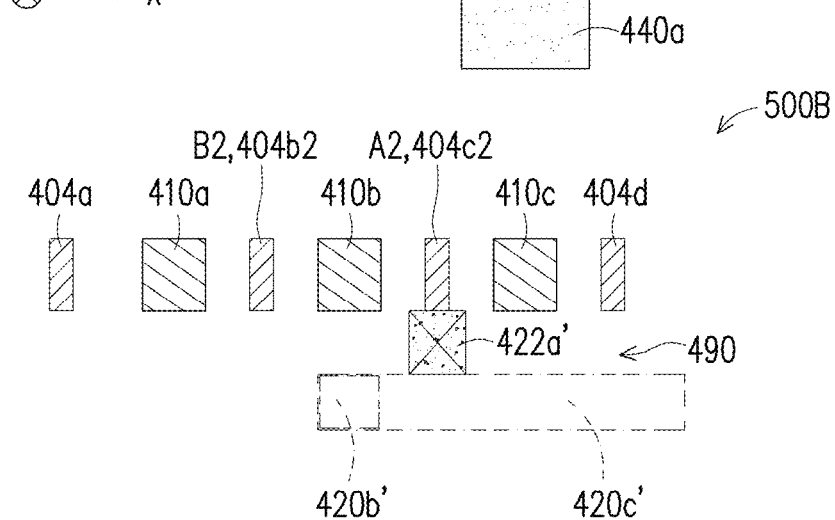
Figure 5D:
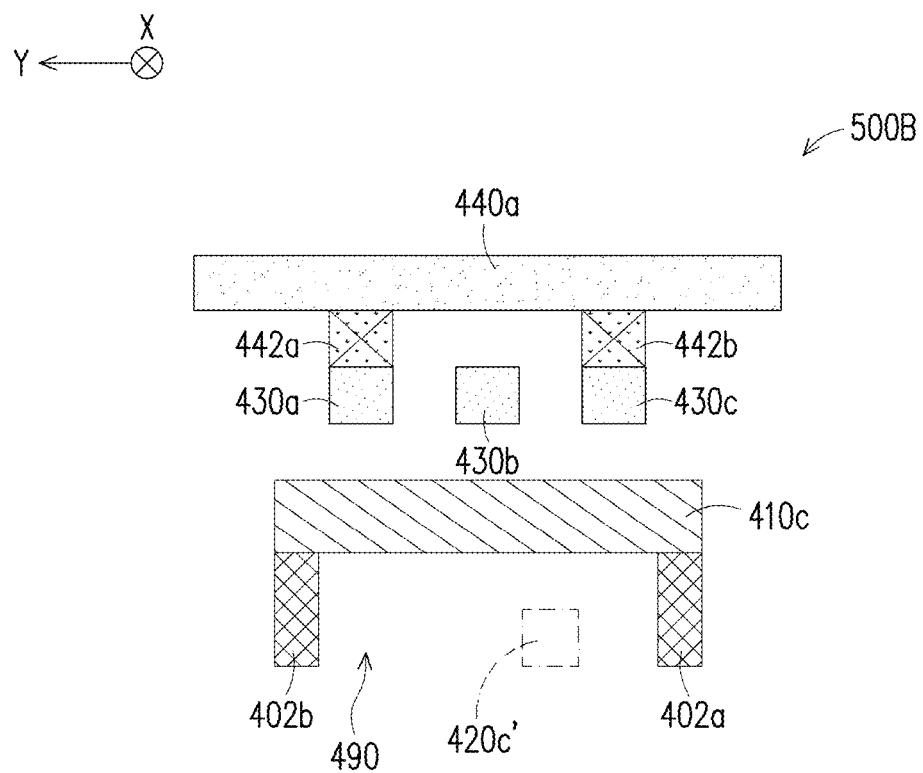
Figure 6A:
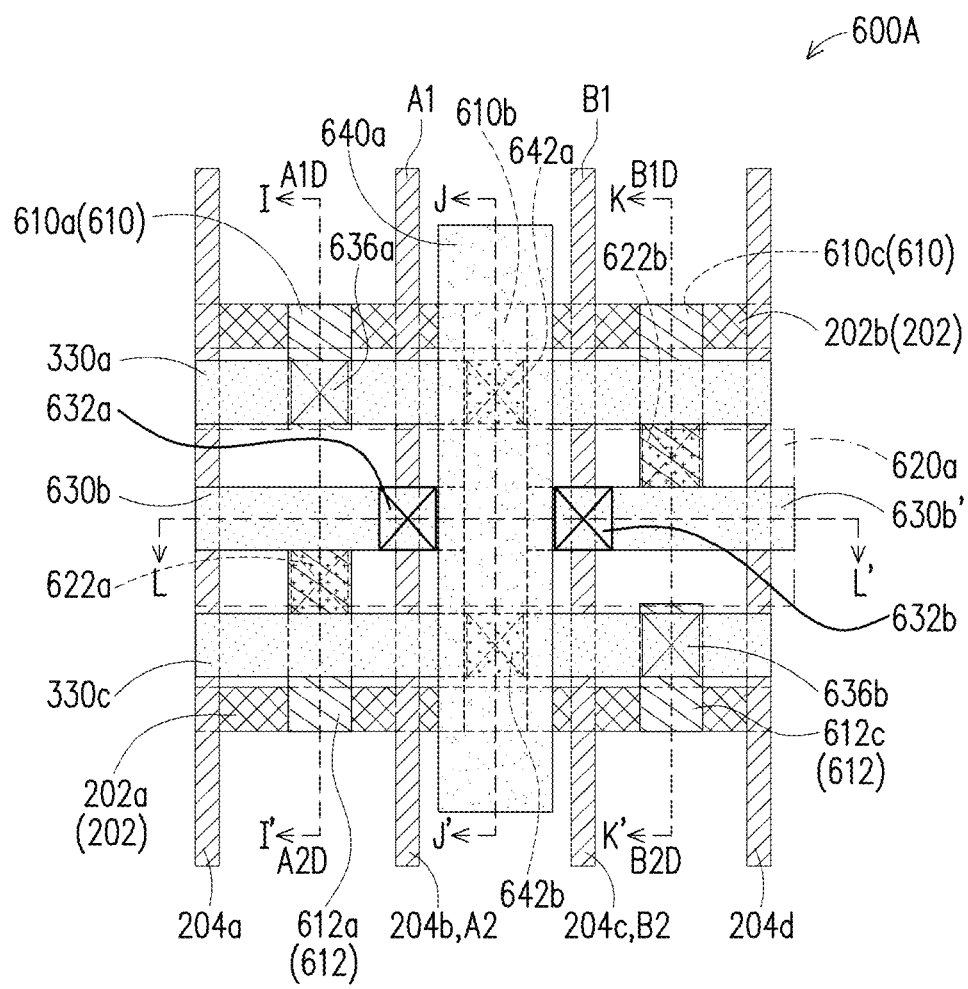
FIG. 6A is a diagram of a layout design of an integrated circuit, in accordance with some embodiments.
Figure 6B:
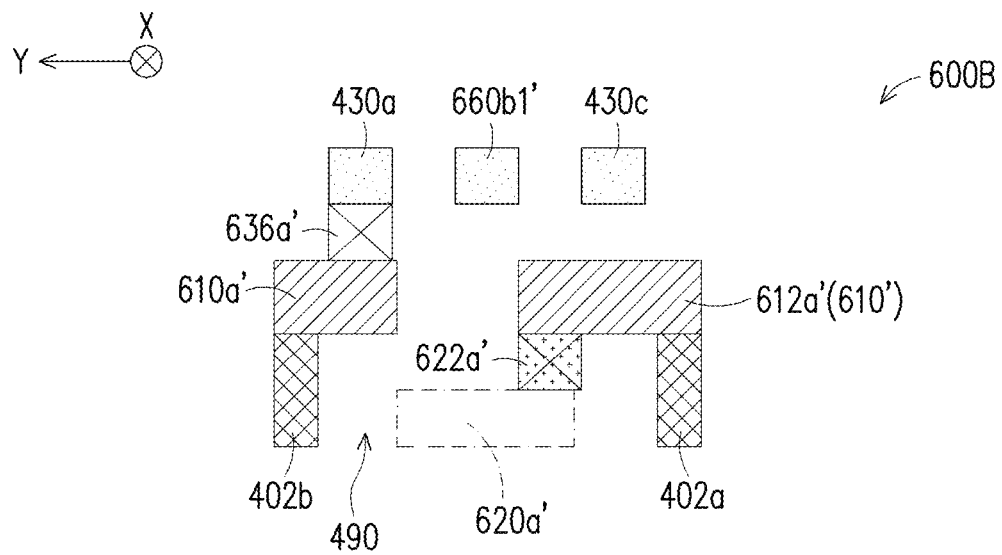
FIGS. 6B, 6C, 6D and 6E are cross-sectional views of an integrated circuit, in accordance with some embodiments.
Figure 6C:
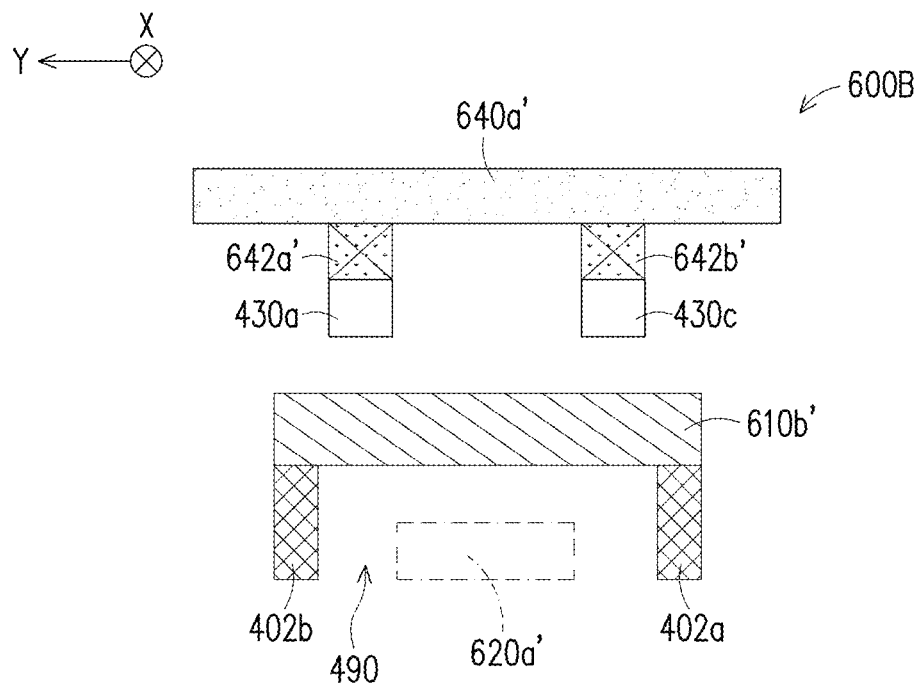
Figure 6D:
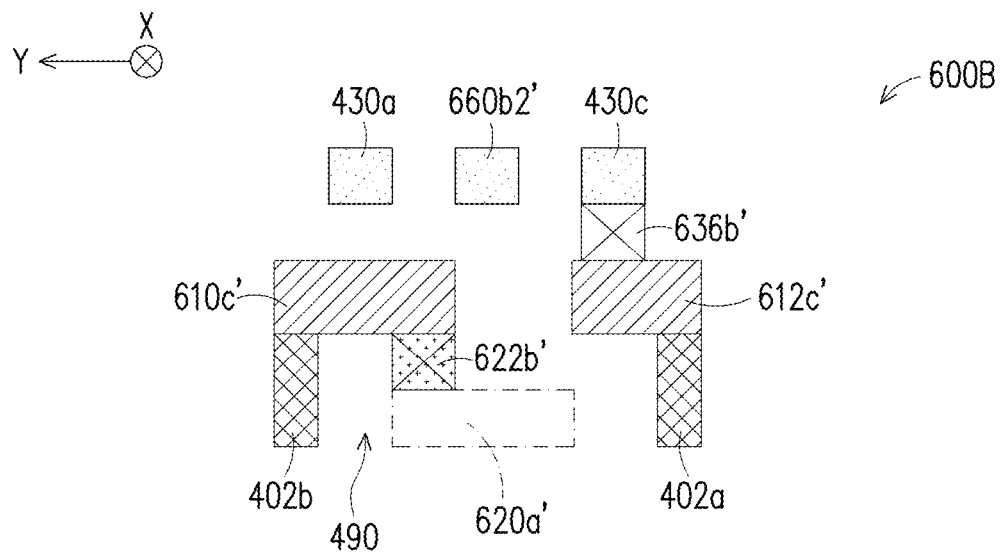
Figure 6E:
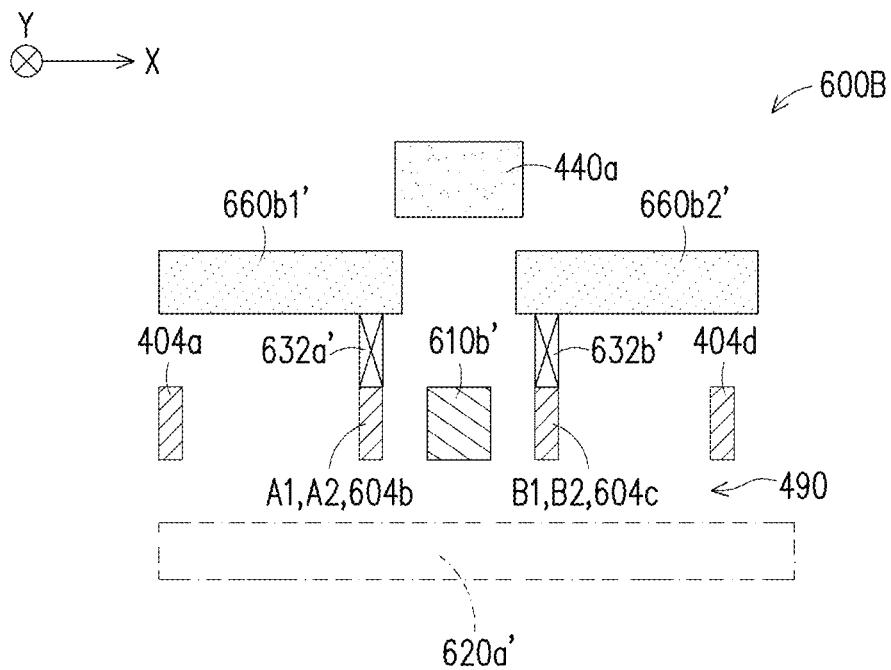
Figure 7A:
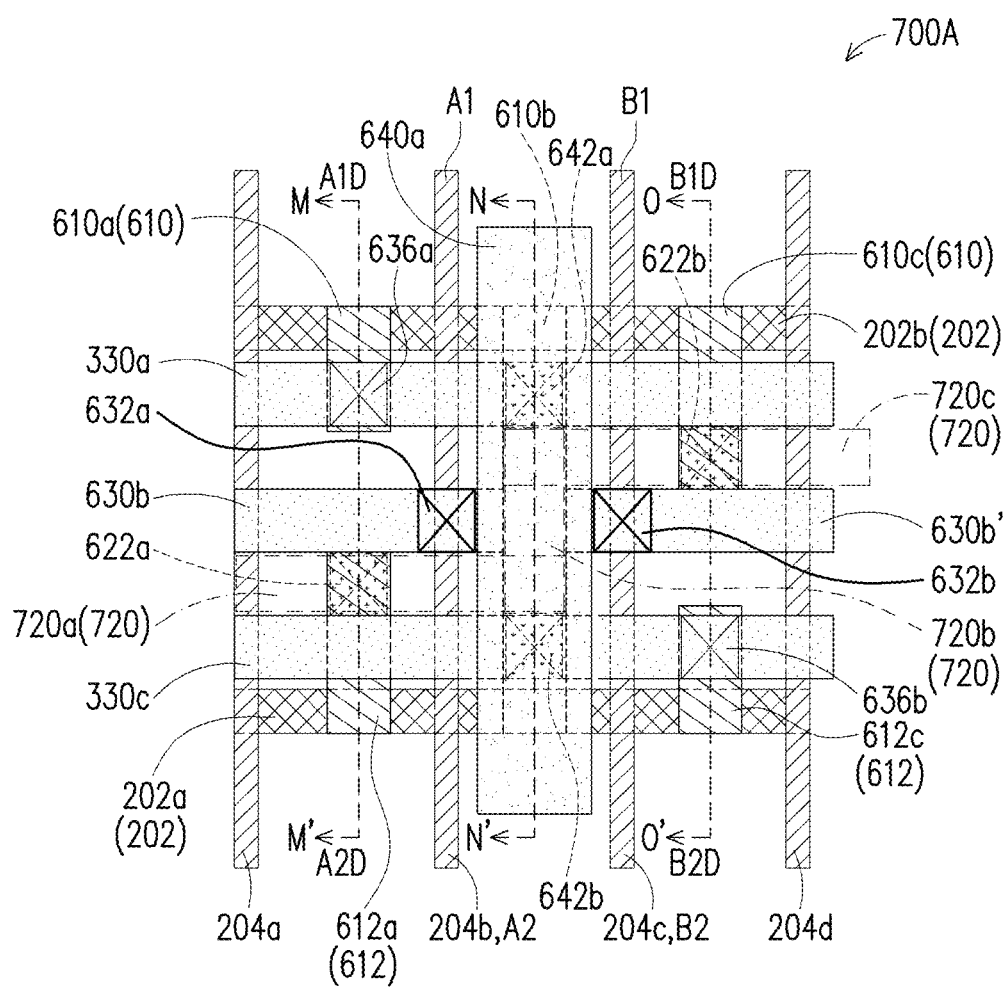
FIG. 7A is a diagram of a layout design of an integrated circuit, in accordance with some embodiments.
Figure 7B:
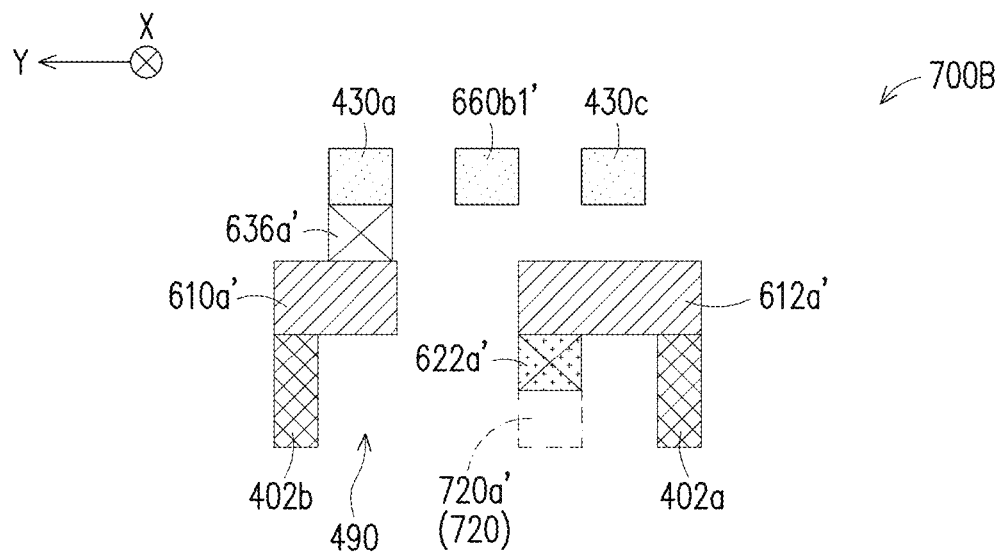
FIGS. 7B, 7C and 7D are cross-sectional views of an integrated circuit, in accordance with some embodiments.
Figure 7C:
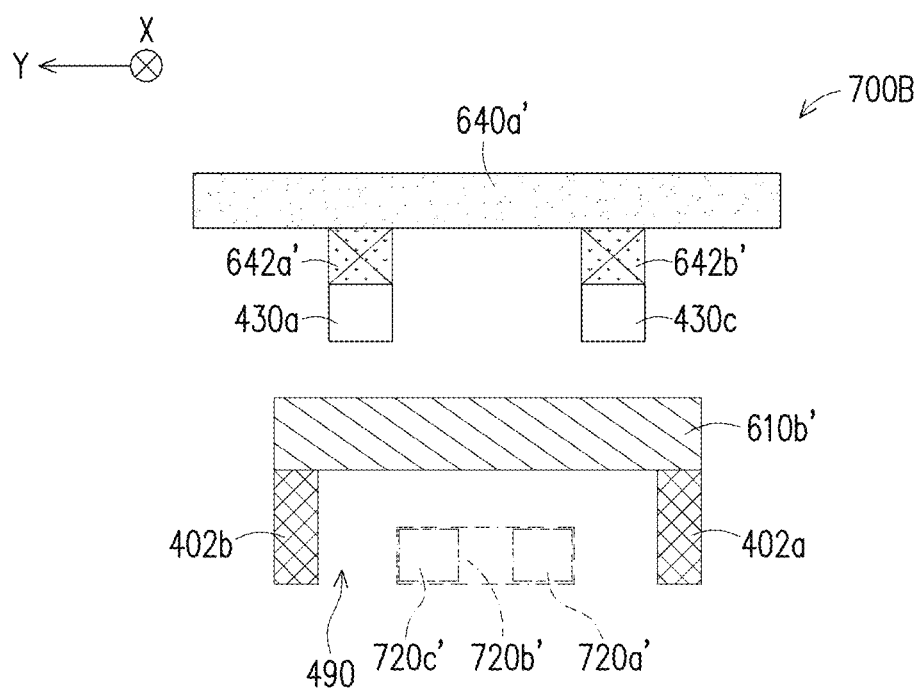
Figure 7D:
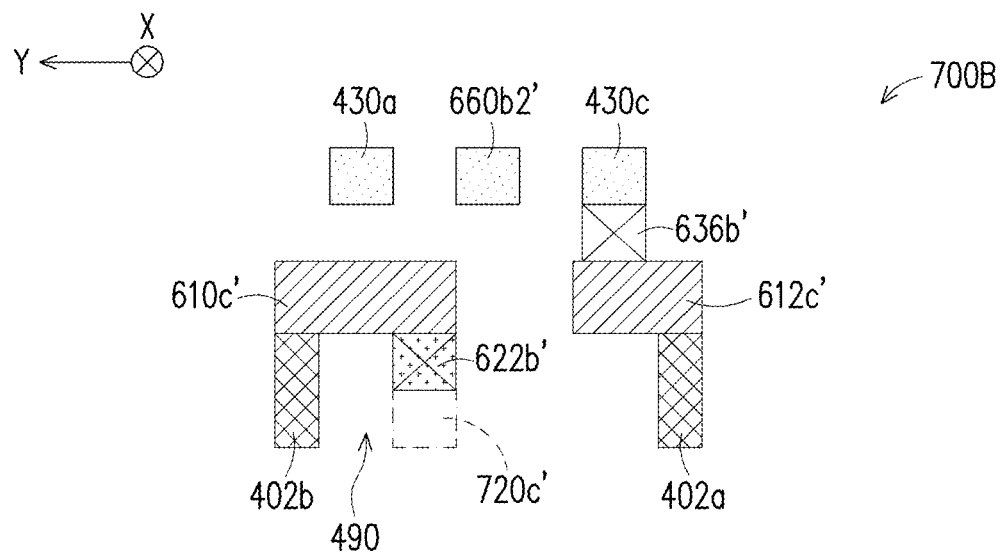

Layout design 200 is usable to manufacture integrated circuit 100 of FIG. 1, integrated circuit 400 of FIGS. 4A-4E, integrated circuit 500B of FIGS. 5B-5D, integrated circuit 600B of FIGS. 6B-6E, integrated circuit 700B of FIGS. 7B-7D, integrated circuit 800B of FIGS. 8B-8G or integrated circuit 900B of FIGS. 9B-9E. Components that are the same or similar to those in each of FIG. 2-3 or 5A-9E are given the same reference numbers, and detailed description thereof is thus omitted.

Layout design 200 includes active region layout patterns 202a, 202b (collectively referred to as a "set of active region layout patterns 202") extending in a first direction X. Active region layout patterns 202a, 202b of the set of active region layout patterns 202 are separated from one another in a second direction Y different from the first direction X. The set of active region layout patterns 202 is usable to manufacture a corresponding set of active regions 402 (FIGS. 4A-4E) of integrated circuit 400. In some embodiments, the set of active region layout patterns 202 is located on a first layout level.

Layout design 200 further includes gate layout patterns 205a, 205b, 205c, 205d (collectively referred to as a "set of gate layout patterns 205") and gate layout patterns 206a, 206b, 206c, 206d (collectively referred to as a "set of gate layout patterns 206") each extending in the second direction Y. Each of the layout patterns of the set of gate layout patterns 205 is separated from an adjacent layout pattern of the set of gate layout patterns 205 in the first direction X by a first pitch. Each of the layout patterns of the set of gate layout patterns 206 is separated from an adjacent layout pattern of the set of gate layout patterns 206 in the first direction X by the first pitch. Set of gate layout patterns 205 and 206 are separated from each other in the second direction Y. In some embodiments, the set of gate layout patterns 205 and 206 are not separated from each other in the second direction Y forming a single set of gate layout patterns 204 (as shown in FIGS. 3 and 5A-9E). The set of gate layout patterns 204, 205 or 206 is usable to manufacture a corresponding set of gates 404 (FIGS. 4A-4E) of integrated circuit 400. The set of gate layout patterns 204, 205 and 206 are positioned on a second layout level (POLY) different from the first layout level. The set of active region layout patterns 202 is below the set of gate layout patterns 204, 205 or 206.

Gate layout pattern 206b is usable to manufacture the gate terminal A1 of PMOS transistor P1 of FIG. 1. Gate layout pattern 206c is usable to manufacture the gate terminal B1 of PMOS transistor P2 of FIG. 1. Gate layout pattern 205b is usable to manufacture the gate terminal B2 of NMOS transistor N1 of FIG. 1. Gate layout pattern 205c is usable to manufacture the gate terminal A2 of NMOS transistor N2 of FIG. 1.

Layout design 200 further includes metal over diffusion layout patterns 210a, 210b, 210c (collectively referred to as a "set of metal over diffusion layout patterns 210") extending in the second direction Y. Each of the layout patterns of the set of metal over diffusion layout patterns 210 is separated from an adjacent layout pattern of the set of metal over diffusion layout patterns 210 in the first direction X. The set of metal over diffusion layout patterns is located on the second layout level. The set of metal over diffusion layout patterns 210 is usable to manufacture a corresponding set of contacts 410 (FIGS. 4A-4E) of integrated circuit 400.

In some embodiments, metal over diffusion layout pattern 210a is usable to manufacture terminal T1 of PMOS transistor P1 of FIG. 1, and terminal T2 of NMOS transistor N1 of FIG. 1. In some embodiments, metal over diffusion layout pattern 210a is usable to manufacture terminal T7 of PMOS transistor P2 of FIG. 1, and terminal T8 of NMOS transistor N2 of FIG. 1. In some embodiments, metal over diffusion layout pattern 210b is usable to manufacture terminal T3 of PMOS transistor P1 of FIG. 1, terminal T4 of NMOS transistor N1 of FIG. 1, terminal T5 of PMOS transistor P2 of FIG. 1, and terminal T6 of NMOS transistor N2 of FIG. 1. In some embodiments, metal over diffusion layout pattern 210c is usable to manufacture terminal T7 of PMOS transistor P2 of FIG. 1, and terminal T8 of NMOS transistor N2 of FIG. 1. In some embodiments, metal over diffusion layout pattern 210c is usable to manufacture terminal Ti of PMOS transistor P1 of FIG. 1, and terminal T2 of NMOS transistor N1 of FIG. 1.

Layout design 200 further includes conductive feature layout patterns 212a, 212b (collectively referred to as a "set of conductive feature layout patterns 212") extending in at least the first direction X or the second direction Y. In some embodiments, the set of conductive feature layout patterns 212 is located on at least the first layout level, the second layout level or a third layout level. In some embodiments, the third layout level is different from the first layout level and the second layout level. The set of conductive feature layout patterns 212 is usable to manufacture a corresponding set of conductive structures (e.g., set of conductive structures 420 or set of conductive structures 430 (FIGS. 4A-4E)) of integrated circuit 400. In some embodiments, the set of conductive feature layout patterns 212 is usable to manufacture a corresponding set of conductive structures 420' of integrated circuit 500B, set of conductive structures 620' of integrated circuit 600B, set of conductive structures 720' of integrated circuit 700B, set of conductive structures 820' of integrated circuit 800B or set of conductive structures 920' of integrated circuit 900B. The conductive feature layout pattern 212a corresponds to fabricating a conductive structure (e.g., conductive structure 420a or conductive structures 430a, 430b, 430c) used to electrically couple the gate terminal A1 of PMOS transistor P1 to the gate terminal A2 of NMOS transistor N2 of FIG. 1. The conductive feature layout pattern 212b corresponds to fabricating a conductive structure (e.g., conductive structure 420a or conductive structures 430a, 430b, 430c) used to electrically couple the gate terminal B1 of PMOS transistor P2 to the gate terminal B2 of NMOS transistor N1 of FIG. 1. In some embodiments, the set of conductive feature layout patterns 212 is not included in layout design 200.

FIG. 3 is a diagram of a layout design 300 of an integrated circuit, in accordance with some embodiments. Layout design 300 is usable to manufacture integrated circuit 100 (FIG. 1) or integrated circuit 400 (FIGS. 4A-4E).

Layout design 300 is a variation of layout design 200 (FIG. 2). Layout design 300 is usable to manufacture an integrated circuit similar to integrated circuit 100 (FIG. 1) or integrated circuit 400 (FIGS. 4A-4E).

In comparison with layout design 200 of FIG. 2, layout design 300 further includes one or more of cut feature layout patterns 304a and 304b, fin layout patterns 316a and 316b, conductive feature layout patterns 320a, 330a, 330b, 330c and 340a, and via layout patterns 322a, 322b, 332a, 332b, 342a and 342b.

In comparison with layout design 200 of FIG. 2, set of gate layout patterns 204 of layout design 300 replaces set of gate layout patterns 205 and 206. Set of gate layout patterns 204 corresponds to the set of gate layout patterns 205 and 206 not being separated from each other in the second direction Y thus forming a single set of gate layout patterns (e.g., set of gate layout patterns 204). The set of gate layout patterns 204 is similar to the set of gate layout patterns 205 and 206, and similar detailed description is therefore omitted.

Cut feature layout patterns 304a, 304b (collectively referred to as a "set of cut feature layout patterns 304") extend in the first direction X. The set of cut feature layout patterns 304 overlaps at least a first gate layout pattern of the set of gate layout pattern 204. Cut feature layout patterns 304a, 304b overlap corresponding gate layout patterns 204b, 204c of the set of gate layout patterns 204. Each layout pattern of the set of cut feature layout patterns 304 has a pattern width in the second direction Y, and a pattern length in the first direction X.

Figure 10:
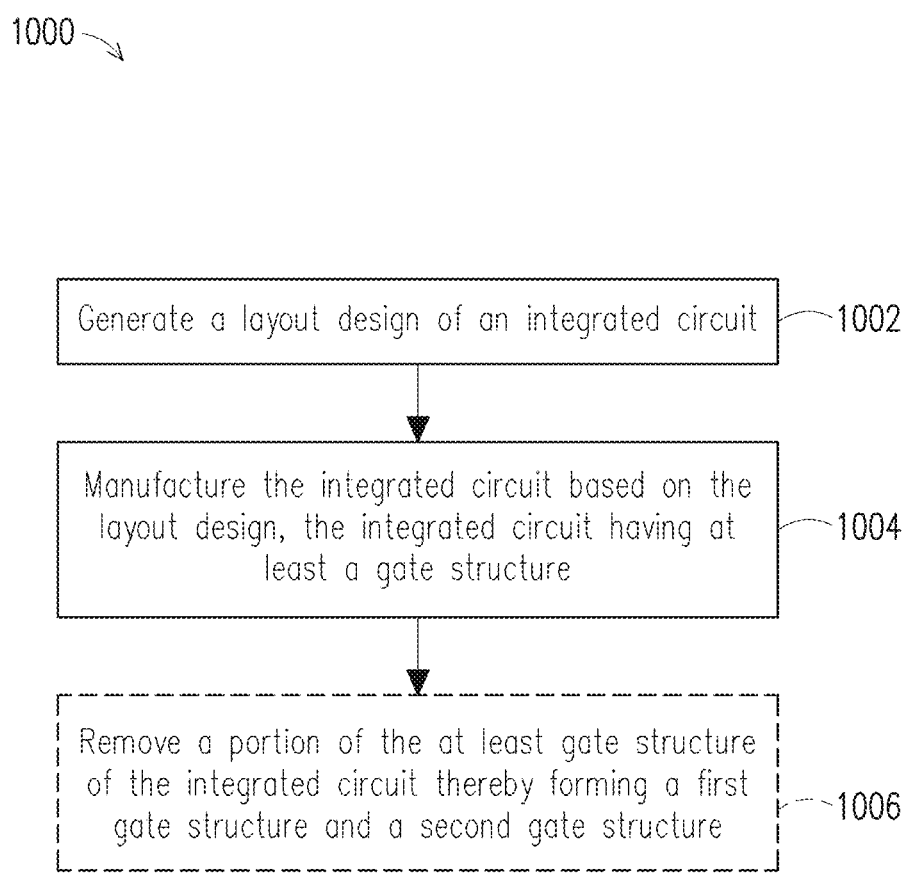
FIG. 10 is a flowchart of a method of manufacturing an IC, in accordance with some embodiments.

In some embodiments, cut feature layout pattern 304a is usable to identify a location of gates 404b1 and 404b2 (FIGS. 4A-4E) of integrated circuit 400 that are removed during operation 1006 of method 1000 (FIG. 10). In some embodiments, cut feature layout pattern 304b is usable to identify a location of gates 404c1 and 404c2 (FIGS. 4A-4E) of integrated circuit 400 that are removed during operation 1006 of method 1000 (FIG. 10). The removed gate portion of gates 404b1 and 404b2 and gates 404c1 and 404c2 is also referred to as a cut region. In some embodiments, the set of gate layout patterns 204 and the cut feature layout pattern 304 are located on the second layout level. In some embodiments, the second layout level corresponds to a poly layout level (POLY). Other configurations or quantities of patterns in the set of cut feature layout patterns 304 are within the scope of the present disclosure.

Fin layout patterns 316a, 316b (collectively referred to as "set of fin layout patterns 316") each extend in the first direction X. Fin layout patterns 316a, 316b are over corresponding active region layout pattern 202a, 202b. The set of fin layout patterns 316 are below the set of gate layout patterns 204. Each of the layout patterns of the set of fin layout patterns 316 is separated from an adjacent layout pattern of the set of fin layout patterns 316 in the second direction Y by a fin pitch. The set of fin layout patterns 316 is usable to manufacture a corresponding set of fins of integrated circuit 400. Other configurations or quantities of fins in the set of fin layout patterns 316 are within the scope of the present disclosure.

Conductive feature layout pattern 320a (hereinafter referred to as a "set of conductive feature layout patterns 320") extends in at least the first direction X or the second direction Y. In some embodiments, the set of conductive feature layout patterns 320 extends in a single direction (e.g., first direction X or second direction Y). In some embodiments, the set of conductive feature layout patterns 320 extends in two directions (e.g., first direction X and second direction Y (FIG. 5A)). The set of conductive feature layout patterns 320 includes one or more conductive feature layout patterns. The set of conductive feature layout patterns 320 is located on the first layout level. In some embodiments, the first layout level of layout design 300 is the active region. In some embodiments, the first layout level of layout design 300 is divided into a metal under (MU) portion and a via under (VU) portion. In some embodiments, the MU portion is below the VU portion. In some embodiments, the set of conductive feature layout patterns 320 is located on the MU portion of the first layout level. In some embodiments, the MU portion is positioned beneath at least the M0 level, the POLY level or the MD level of layout design 300.

The set of conductive feature layout patterns 320 is between the set of active region layout patterns 202. Conductive feature layout pattern 320a is positioned between active region layout pattern 202a and active region layout pattern 202b. The set of conductive feature layout patterns 320 is usable to manufacture a corresponding set of conductive structures 420 (FIGS. 4A-4E) of integrated circuit 400. The set of conductive feature layout patterns 320 is below the set of gate layout patterns 204 and the set of metal over diffusion layout patterns 210. In some embodiments, the set of metal over diffusion layout patterns 210 overlaps the set of conductive feature layout patterns 320. The set of gate layout patterns 204 overlaps at least the set of conductive feature layout patterns 320. Other configurations or quantities of patterns in the set of conductive feature layout patterns 320 are within the scope of the present disclosure.

Via layout patterns 322a, 322b (collectively referred to as a "set of via layout patterns 322") are between the set of conductive feature layout patterns 320 and the set of gate layout patterns 204. Via layout patterns 322a, 322b of the set of via layout patterns 322 are between corresponding gate layout pattern 204c, 204b of the set of gate layout patterns 204 and the set of conductive feature layout patterns 320. Via layout patterns 322a, 322b are positioned at a VU portion of the first layout level of layout design 300. In some embodiments, the VU portion is above the MU portion. In some embodiments, the VU portion is positioned beneath at least the V0 level, the VG level or the VD level of layout design 300.

The set of via layout patterns 322 is usable to manufacture a corresponding set of vias 422 (FIGS. 4A-4E). The set of vias 422 couple the set of conductive structures 420 to the set of gates 404.

In some embodiments, a via layout pattern 322a, 322b of the set of via layout patterns 322 is located where a corresponding gate layout pattern 204c, 204b of the set of gate layout patterns 204 overlaps a corresponding layout pattern of the set of conductive feature layout patterns 320. In some embodiments, a center of via layout pattern 322a, 322b of the set of via layout patterns 322 is below a center of a corresponding gate layout pattern 204c, 204b of the set of gate layout patterns 204. In some embodiments, a center of via layout pattern 322a, 322b of the set of via layout patterns 322 is aligned in at least the first direction X or the second direction Y with a center of a corresponding gate layout pattern 204c, 204b of the set of gate layout patterns 204. Other configurations of via layout patterns 322a, 322b of the set of via layout patterns 322 are within the scope of the present disclosure.

Conductive feature layout patterns 330a, 330b, 330c (collectively referred to as a "set of conductive feature layout patterns 330") extend in the first direction X. The set of conductive feature layout patterns 330 is positioned between the set of active region layout patterns 202. Each of conductive feature layout patterns 330a, 330b, 330c is positioned between active region layout pattern 202a and active region layout pattern 202b. In some embodiments, each of the layout patterns 330a, 330b, 330c of the set of conductive feature layout patterns 330 is separated from an adjacent layout pattern of the set of conductive feature layout patterns 330 in the second direction Y. The set of conductive feature layout patterns 330 is usable to manufacture a corresponding set of conductive structures 430 (FIGS. 4A-4E) of integrated circuit 400.

The set of conductive feature layout patterns 330 is located on a third layout level different from the first layout level and the second layout level. In some embodiments, the third layout level corresponds to the metal zero (M0) layout level. In some embodiments, the third layout level corresponds to an upper metal layer including the metal one (M1) layout level, metal two (M2) layout level, metal three (M3) layout level, or the like. The set of conductive feature layout patterns 330 overlaps at least the set of gate layout patterns 204 or the set of metal over diffusion layout patterns 210. The set of conductive feature layout patterns 330 is above the set of conductive feature layout patterns 320 and the set of active region layout patterns 202.

Via layout patterns 332a, 332b (collectively referred to as a "set of via layout patterns 332") are between the set of conductive feature layout patterns 330 and the set of gate layout patterns 204. Via layout patterns 332a, 332b are positioned at a via over gate (VG) level of layout design 300. Via layout patterns 332a, 332b of the set of via layout patterns 332 are between a corresponding conductive feature layout pattern 330c, 330a of the set of conductive feature layout patterns 330 and a corresponding gate layout pattern 204b, 204c of the set of gate layout patterns 204. The set of via layout patterns 332 is usable to manufacture a corresponding set of vias 432 (FIGS. 4A-4E). The set of vias 432 couples the set of conductive structures 430 to the set of gates 404.

In some embodiments, a via layout pattern 332a, 332b of the set of via layout patterns 332 is located where a corresponding layout pattern 330c, 330a of the set of conductive feature layout patterns 330 overlaps a corresponding gate layout pattern 204b, 204c of the set of gate layout patterns 204. In some embodiments, a center of via layout pattern 332a, 332b of the set of via layout patterns 332 is over a center of a corresponding gate layout pattern 204b, 204c of the set of gate layout patterns 204. In some embodiments, a center of via layout pattern 332a, 332b of the set of via layout patterns 332 is below a center of a corresponding conductive feature layout pattern 330c, 330a of the set of conductive feature layout patterns 330. In some embodiments, a center of via layout pattern 332a, 332b of the set of via layout patterns 332 is aligned in at least the first direction X or the second direction Y with a center of a corresponding gate layout pattern 204b, 204c of the set of gate layout patterns 204. In some embodiments, a center of via layout pattern 332a, 332b of the set of via layout patterns 332 is aligned in at least the first direction X or the second direction Y with a center of a corresponding conductive feature layout pattern 330c, 330a of the set of conductive feature layout patterns 330. Other configurations of via layout patterns 332a, 332b of the set of via layout patterns 332 are within the scope of the present disclosure.

Conductive feature layout pattern 340a (hereinafter referred to as a "set of conductive feature layout patterns 340") extends in the second direction Y. The set of conductive feature layout patterns 340 includes one or more conductive feature layout patterns. The set of conductive feature layout patterns 340 is between the set of gate layout patterns 204. In some embodiments, conductive feature layout pattern 340a is positioned between gate layout pattern 204c and gate layout pattern 204d. In some embodiments, each of the layout patterns of the set of conductive feature layout patterns 340 is separated from an adjacent layout pattern of the set of conductive feature layout patterns 340 in the first direction X. The set of conductive feature layout patterns 340 is usable to manufacture a corresponding set of conductive structures 440 (FIGS. 4A-4E) of integrated circuit 400.

The set of conductive feature layout patterns 340 overlaps at least the set of conductive feature layout patterns 320, the set of conductive feature layout patterns 330, the set of metal over diffusion layout patterns 210 or the set of active region layout patterns 202. The set of conductive feature layout patterns 340 is located on a fourth layout level different from the first layout level, the second layout level and the third layout level. In some embodiments, the fourth layout level corresponds to a metal one (M1) level of layout design 300. Other configurations or quantities of patterns in the set of conductive feature layout patterns 340 are within the scope of the present disclosure.

Via layout patterns 342a, 342b (collectively referred to as a "set of via layout patterns 342") are between the set of conductive feature layout patterns 330 and the set of conductive feature layout patterns 340. Via layout patterns 342a, 342b of the set of via layout patterns 342 are between corresponding conductive feature layout pattern 330a, 330c of the set of conductive feature layout patterns 330 and the set of conductive feature layout patterns 340. Via layout patterns 342a, 342b are positioned at a via zero (V0) level of layout design 300. The set of via layout patterns 342 is usable to manufacture a corresponding set of vias 442 (FIGS. 4A-4E). The set of vias 442 couples the set of conductive structures 430 to the set of conductive structures 440.

In some embodiments, a via layout pattern 342a, 342b of the set of via layout patterns 342 is located where a corresponding conductive feature layout pattern 330a, 330c of the set of conductive feature layout patterns 330 is overlapped by a layout pattern of the set of conductive feature layout patterns 340. In some embodiments, a center of via layout pattern 342a, 342b of the set of via layout patterns 342 is above a center of a corresponding conductive feature layout pattern 330a, 330c of the set of conductive feature layout patterns 330. In some embodiments, a center of via layout pattern 342a, 342b of the set of via layout patterns 342 is aligned in at least the first direction X or the second direction Y with a center of a corresponding conductive feature layout pattern 330a, 330c of the set of conductive feature layout patterns 330. Other configurations of via layout patterns 342a, 342b of the set of via layout patterns 342 are within the scope of the present disclosure.

In some embodiments, gate terminal A1, 404b1 (FIG. 4C) (manufactured by gate layout pattern 204b) of layout design 300 is electrically coupled to gate terminal A2, 404c2 (FIG. 4B) (manufactured by gate layout pattern 204c). For example, in some embodiments, gate terminal A1, 404b1 (manufactured by gate layout pattern 204b) is electrically connected through via 422b (FIG. 4C) (manufactured by via layout pattern 322b) to conductive structure 420a (manufactured by conductive feature layout pattern 320a), and conductive structure 420a is electrically coupled through via 422a (FIG. 4B) (manufactured by via layout pattern 322a) to gate terminal A2, 404c2 (manufactured by gate layout pattern 204c).

In some embodiments, gate terminal B 1, 404c1 (manufactured by gate layout pattern 204c) of layout design 300 is electrically coupled to gate terminal B2, 404b2 (manufactured by gate layout pattern 204b). For example, in some embodiments, gate terminal B1, 404c1 (FIG. 4B) (manufactured by gate layout pattern 204c) is electrically connected through via 432b (manufactured by via layout pattern 332b) to a conductive structure 430a (manufactured by conductive feature layout pattern 330a). In some embodiments, conductive structure 430a is electrically coupled through via 442a, V0 (manufactured by via layout pattern 342a) to a conductive structure 440a, M1 (manufactured by conductive feature layout pattern 340a). In some embodiments, conductive structure 440a is electrically coupled through via 442b, V0 (manufactured by via layout pattern 342b) to conductive structure 430c (manufactured by conductive feature layout pattern 330c). In some embodiments, conductive structure 430c is electrically coupled through via 432a (manufactured by via layout pattern 332a) to gate terminal B2, 404b2 (manufactured by gate layout pattern 204b).

In some embodiments, the set of conductive feature layout patterns 320 are located below at least the set of gate layout patterns 304, the metal-0 (M0) level or the MD level of layout design 300. In some embodiments, by using the set of conductive feature layout patterns 320, at least one upper metal layer track is reduced in the set of conductive feature layout patterns 330 compared to other approaches. In some embodiments, an upper metal layer track includes one or more of M0, M1 or M2, or the like. In some embodiments, the set of conductive feature layout patterns 330 includes an upper metal layer track layout pattern located on the M1 level, M2 level, or the like. In some embodiments, by using one less upper metal layer track in the set of conductive feature layout patterns 330, a standard cell with a smaller height and smaller area results compared with other approaches. In some embodiments, since one upper metal layer track in the set of conductive feature layout patterns 330 is reduced, the width of one or more layout patterns in the set of conductive feature layout patterns 330 is increased, yielding a standard cell with better current resistance (IR) and Electromigration (EM) compared with other approaches. In some embodiments, by utilizing the set of conductive feature layout patterns 320 of the present disclosure, the gate density of the set of gate layout patterns of a standard cell is increased by up to 30% compared with other approaches. In some embodiments, by utilizing the set of conductive feature layout patterns 320 of the present disclosure, layout design 200 offers more routing flexibility and increases routing resources compared to other approaches.

FIGS. 4A, 4B, 4C, 4D and 4E are cross-sectional views of an integrated circuit 400, in accordance with some embodiments. FIG. 4A is a cross-sectional view of an integrated circuit 400 corresponding to layout design 300 as intersected by plane A-A', FIG. 4B is a cross-sectional view of an integrated circuit 400 corresponding to layout design 300 as intersected by plane B-B', FIG. 4C is a cross-sectional view of an integrated circuit 400 corresponding to layout design 300 as intersected by plane C-C', FIG. 4D is a cross-sectional view of an integrated circuit 400 corresponding to layout design 300 as intersected by plane D-D', and FIG. 4E is a cross-sectional view of an integrated circuit 400 corresponding to layout design 300 as intersected by plane E-E', in accordance with some embodiments. Integrated circuit 400 is manufactured by layout design 300.

Integrated circuit 400 is manufactured by layout design 300. Structural relationships including alignment, lengths and widths, as well as configurations of integrated circuit 400 are similar to the structural relationships and configurations of layout design 200 of FIG. 2 and layout design 300 of FIG. 3, and will not be described in FIGS. 4A-4E for brevity.

Integrated circuit 400 includes active regions 402a, 402b (collectively referred to as "set of active regions 402") in a substrate 480. The set of active regions 402 extends in the first direction X and is located on a first level of integrated circuit 400. Each active region of the set of active regions 402 is separated from each other in the second direction Y. In some embodiments, set of active regions 402 of integrated circuit 400 is referred to as an oxide definition (OD) region which defines the source or drain diffusion regions of integrated circuit 400. In some embodiments, the first level of integrated circuit 400 is referred to as the Active/Fin level. In some embodiments, active region 402a, 402b includes a set of fins (not shown) extending in the first direction and being below the set of gates 404. In some embodiments, each of the fins (not shown) is separated from an adjacent fin of the set of fins (not shown) in the second direction Y by a fin pitch (not shown). Other quantities or configurations of the set of active region 402 are within the scope of the present disclosure.

Integrated circuit 400 further includes a conductive structure 420a (collectively referred to as a "set of conductive structures 420") extending in at least the first direction X or the second direction Y. The set of conductive structures 420 is located on the first level of integrated circuit 400. The set of conductive structures 420 is between the set of active regions 402. In some embodiments, conductive structure 420a is positioned between active regions 402a, 402b. In some embodiments, a top surface of conductive structure 420a of the set of conductive structures 420 is below a top surface of active region 402a, 402b of the set of active regions 402 or a top surface of a fin (not shown) of the set of fins (not shown).

In some embodiments, the first level of integrated circuit 400 is the active region of integrated circuit 400. In some embodiments, the first level of integrated circuit 400 is divided into a metal under (MU) region and a via under (VU) region. In some embodiments, the MU region is below the VU region. In some embodiments, the set of conductive structures 420 is in the MU region of the first level of integrated circuit 400. In some embodiments, the conductive structures of the set of conductive structures 420 are buried inside the substrate 480, and positioned beneath at least the M0 layer, the POLY layer, the MD layer of integrated circuit 400. In some embodiments, each conductive structure 420a in the set of conductive structures 420 has a width (not shown) in the second direction Y ranging from about 1-50 nm. In some embodiments, each conductive structure 420a in the set of conductive structures 420 has a length (not shown) in the first direction X ranging from about 1-10 μm.

Other quantities or configurations of the set of conductive structures 404 are within the scope of the present disclosure.

Integrated circuit 400 further includes a shallow trench isolation (STI) region 490 extending in at least the first direction X or the second direction Y. STI region 490 is located on at least the first level of integrated circuit 400. In some embodiments, STI region 490 is positioned between the set of active regions 402 and the set of conductive structures 420. In some embodiments, conductive structure 420a is separated from each of active regions 402a, 402b by STI region 490. Other quantities or configurations of the STI region 490 are within the scope of the present disclosure.

Integrated circuit 400 further includes gates 404b1, 404b2, 404c1, 404c2 (collectively referred to as "set of gates 404") extending in the second direction Y, overlapping at least the set of conductive structures 420 and being located on a second level of integrated circuit 400. In some embodiments, the second level of integrated circuit 400 is different from the first level. Each of the gates of the set of gates 404 is separated from an adjacent gate of the set of gates 404 in the first direction X by a first pitch. In some embodiments, the second level of integrated circuit 400 is referred to as the Poly level. Other quantities or configurations of the set of gates 404 are within the scope of the present disclosure.

Integrated circuit 400 further includes contacts 410a, 410b, 410c (collectively referred to as a "set of contacts 410") extending in the second direction Y, overlapping the set of conductive structures 420, and being located on the second level of integrated circuit 400. Each of the contacts 410a, 410b, 410c of the set of contacts 410 is separated from an adjacent contact of the set of contacts 410 in the first direction X. In some embodiments, the set of contacts 410 is located on the MD level of integrated circuit 400. In some embodiments, at least a contact of the set of contacts 410 is electrically coupled to at least a source or a drain of the active regions 402a, 402b. Other quantities or configurations of the set of contacts 410 are within the scope of the present disclosure.

Integrated circuit 400 further includes vias 422a, 422b (collectively referred to as a "set of vias 422") coupling the set of conductive structures 420 to the set of gates 404. The set of vias 422 is between the set of conductive structures 420 and the set of gates 404. Via 422b is located where gates 404b1, 404b2 overlap conductive structure 420a. Via 422a is located where gates 404c1, 404c2 overlap conductive structure 420a. In some embodiments, set of vias 422 is in the VU level of integrated circuit 400. The VU level of integrated circuit 400 is between the first level and the second level. Other quantities or configurations of the set of vias 422 are within the scope of the present disclosure.

Integrated circuit 400 further includes conductive structures 430a, 430b, 430c (collectively referred to as a "set of conductive structures 430") extending in the first direction X, being between the set of active regions 402, overlapping at least the set of gates 404, and being located on a third level of integrated circuit 400. In some embodiments, the third level of integrated circuit 400 is different from the first level and the second level. In some embodiments, the third level of integrated circuit 400 is referred to as the M0 level. Each of the conductive structures 430a, 430b, 430c of the set of conductive structures 430 is separated from an adjacent conductive structure of the set of conductive structures 430 in the second direction Y. Other quantities or configurations of the set of conductive structures 430 are within the scope of the present disclosure.

Integrated circuit 400 further includes vias 432a, 432b (collectively referred to as a "set of vias 432") coupling the set of conductive structures 430 to the set of gates 404. The set of vias 432 is between the set of conductive structures 430 and the set of gates 404. Via 432a is located where conductive structure 430c overlaps gates 404b1, 404b2. Via 432b is located where conductive structure 430a overlaps gates 404c1, 404c2. In some embodiments, set of vias 432 is in the VG level of integrated circuit 400. The VG level of integrated circuit 400 is between the second level and the third level. Other quantities or configurations of the set of vias 432 are within the scope of the present disclosure.

Integrated circuit 400 further includes conductive structure 440a (collectively referred to as "set of conductive structures 440") extending in the second direction Y, being between the set of gates 404, overlapping at least the set of conductive structures 420, and being located on a fourth level of integrated circuit 400. In some embodiments, the fourth level of integrated circuit 400 is different from the first level, the second level and the third level. In some embodiments, the fourth level of integrated circuit 400 is referred to as the M1 level. In some embodiments, each of the structures of the set of conductive structures 440 is separated from an adjacent structure of the set of conductive structures 440 in the first direction X. Other quantities or configurations of the set of conductive structures 440 are within the scope of the present disclosure.

Integrated circuit 400 further includes vias 442a, 442b (collectively referred to as "set of vias 442") coupling the set of conductive structures 440 to the set of conductive structures 430. The set of vias 442 is between the set of conductive structures 440 and the set of conductive structures 430. Via 442a is located where conductive structure 440a overlaps conductive structure 430a. Via 442b is located where conductive structure 440a overlaps conductive structure 430c. In some embodiments, set of vias 442 are in the V0 level of integrated circuit 400. The V0 level of integrated circuit 400 is between the third level and the fourth level. Other quantities or configurations of the set of vias 442 are within the scope of the present disclosure.

In some embodiments, one or more conductive structure of the set of conductive structures 420, 430 or 440 includes a metal, a metal compound or a doped semiconductor. In some embodiments, one or more vias of the set of vias 422, 432, 442 includes a metal, a metal compound or a doped semiconductor. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, gate terminal A1, 404b1 is electrically coupled to gate terminal A2, 404c2. For example, gate terminal A1, 404b1 is electrically connected through via 422b to conductive structure 420a, and conductive structure 420a is electrically coupled through via 422a to gate terminal A2, 404c2.

In some embodiments, gate terminal B1, 404c1 is electrically coupled to gate terminal B2, 404b2. For example, in some embodiments, gate terminal B1, 404c1 is electrically connected through via 432b to conductive structure 430a. In some embodiments, conductive structure 430a is electrically coupled through via 442a, V0 to conductive structure 440a, M1. In some embodiments, conductive structure 440a is electrically coupled through via 442b, V0 to conductive structure 430c. In some embodiments, conductive structure 430c is electrically coupled through via 432a to gate terminal B2, 404b2.

In some embodiments, the set of conductive structures 420 is located below at least the set of gates 404, the metal 0 (M0) layer or the MD layer of integrated circuit 400. In some embodiments, the set of conductive structures 420 is referred to as a buried metal track (BMT), as the conductive structures of the set of conductive structures 420 are buried inside the substrate 480, and positioned beneath at least the M0 layer, the POLY layer, the MD layer of integrated circuit 400.

In some embodiments, by using the set of conductive structures 420, one upper metal layer track (e.g., MD track, M0 track, M1 track, or the like) is reduced in the set of conductive structures 430 yielding a standard cell with a smaller height and smaller area compared with other approaches. In some embodiments, by using the set of conductive structures 420, one upper metal layer track (e.g., MD track, M0 track, M1 track, or the like) is reduced in the set of conductive structures 430, and the space occupied by the removed upper layer metal track can be utilized by increasing a width of at least one conductive structure in the set of conductive structures 430, yielding a standard cell with better current resistance (IR) and EM compared with other approaches.

In some embodiments, by reducing one upper metal layer track of the present disclosure, the cell height can be reduced resulting in an increase in the gate density of a standard cell by up to 30% compared with other approaches. In some embodiments, by reducing one upper metal layer track of the present disclosure, integrated circuit 400 offers more routing flexibility and increases routing resources compared to other approaches.

FIG. 5A is a diagram of a layout design 500A of an integrated circuit, in accordance with some embodiments.

FIGS. 5B, 5C and 5D are cross-sectional views of integrated circuit 500B, in accordance with some embodiments.

Layout design 500A is a variation of layout design 300 (FIG. 3). For example, layout design 500A illustrates an example of where the MU layer (e.g., set of conductive feature layout patterns 520) extends in two directions.

Layout design 500A is usable to manufacture an integrated circuit similar to integrated circuit 100 (FIG. 1), integrated circuit 400 (FIGS. 4A-4E) or 500B.

500A

In comparison with layout design 300 of FIG. 3, conductive feature layout patterns 520a, 520b, and 520c of layout design 500A replace conductive feature layout pattern 320a.

Conductive feature layout patterns 520a, 520b, 520c (hereinafter referred to as a "set of conductive feature layout patterns 520") are located on the first layout level. The set of conductive feature layout patterns 520 is usable to manufacture a corresponding set of two-dimensional (2D) conductive structures 420 or 420' of integrated circuit 100, 400 or 500B.

In some embodiments, the set of conductive feature layout patterns 520 is located on the MU portion of the first layout level. The set of conductive feature layout patterns 520 extends in two directions (e.g., first direction X and second direction Y). Conductive feature layout pattern 520a and 520c each extend in the first direction X. Conductive feature layout pattern 520b extends in the second direction Y.

The set of conductive feature layout patterns 520 is between the set of active region layout patterns 202. Conductive feature layout pattern 520a is positioned between conductive feature layout pattern 330a and conductive feature layout pattern 330b. Conductive feature layout pattern 520c is positioned between conductive feature layout pattern 330b and conductive feature layout pattern 330c.

Conductive feature layout pattern 520b is positioned between gate layout patterns 204b and 204c. In some embodiments, conductive feature layout pattern 520b is positioned between conductive feature layout pattern 330a and conductive feature layout pattern 330c. In some embodiments, metal over diffusion layout pattern 210a, 210b, 210c overlaps a corresponding conductive feature layout pattern 520a, 520b, 520c.

The set of gate layout patterns 204 overlaps the set of conductive feature layout patterns 520. In some embodiments, gate layout patterns 204a, 204b overlap conductive feature layout pattern 520a. In some embodiments, gate layout patterns 204c, 204d overlap conductive feature layout pattern 520c. Other configurations or quantities of patterns in the set of conductive feature layout patterns 520 are within the scope of the present disclosure.

In comparison with layout design 300 of FIG. 3, via layout patterns 522a, 522b of layout design 500A replace corresponding via layout patterns 322a, 322b. The set of via layout patterns 522 is similar to the set of via layout patterns 322, and similar detailed description is therefore omitted. In some embodiments, the set of via layout patterns 522 is usable to manufacture a corresponding set of vias 422' (FIGS. 5A-5D) coupled between the set of gates 404 and the set of conductive structures 420' manufactured by the set of conductive feature layout patterns 520.

FIG. 5B is a cross-sectional view of integrated circuit 500B corresponding to layout design 500A as intersected by plane F-F', FIG. 5C is a cross-sectional view of integrated circuit 500B corresponding to layout design 500A as intersected by plane G-G', and FIG. 5D is a cross-sectional view of integrated circuit 500B corresponding to layout design 500A as intersected by plane H-H' in accordance with some embodiments. Structural relationships including alignment, lengths and widths, as well as configurations of integrated circuit 500B are similar to the structural relationships and configurations of layout design 500A of FIG. 5A, and will not be described in FIGS. 5B-5D for brevity.

Integrated circuit 500B is manufactured by layout design 500A. In some embodiments, integrated circuit 500B is similar to integrated circuit 400, and similar detailed description is therefore omitted for brevity.

In comparison with integrated circuit 400 of FIGS. 4A-4E, set of conductive structures 420' of integrated circuit 500B replaces set of conductive structures 420, and set of vias 422' of integrated circuit 500B replaces set of vias 422.

In some embodiments, the set of conductive structures 420' includes one or more of conductive structures 420a', 420b' and 420c'. In some embodiments, the set of vias 422' includes one or more of vias 422a' and 422b'.

Conductive structures 420a' and 420c' extend in the first direction X, and are separated from each other in the second direction Y. Conductive structure 420b' extends in the second direction Y. Conductive structure 420b' directly contacts conductive structures 420a' and 420c'. In some embodiments, conductive structures 420a', 420b' and 420c' are part of a same continuous conductive structure. In some embodiments, set of conductive structures 420' is referred to as a 2D conductive structure.

In some embodiments, gate terminal A1 or gate 404b1 (manufactured by gate layout pattern 204b) of integrated circuit 500B is electrically coupled to gate terminal A2 or gate 404c2 (manufactured by gate layout pattern 204c). For example, in some embodiments, gate terminal A1 or gate 404b1 (manufactured by gate layout pattern 204b) is electrically connected through via 422b' (manufactured by via layout pattern 522b) to the two dimensional (2-D) conductive structure 420a', 420b' and 420c' (manufactured by conductive feature layout patterns 520a, 520b 520c), and the 2-D conductive structure 420a', 420b' and 420c' is electrically coupled through via 422a' (manufactured by via layout pattern 522a) to gate terminal A2 or gate 404c2 (manufactured by gate layout pattern 204c).

In some embodiments, gate terminal B1 or gate 404c1 (manufactured by gate layout pattern 204c) of integrated circuit 500B is electrically coupled to gate terminal B2 or gate 404b2 (manufactured by gate layout pattern 204b) similar to integrated circuit 400 (FIGS. 4A-4E), and similar detailed description is therefore omitted.

FIG. 6A is a diagram of a layout design 600A of an integrated circuit 600B, in accordance with some embodiments.

FIGS. 6B, 6C, 6D and 6E are cross-sectional views of integrated circuit 600B, in accordance with some embodiments.

Layout design 600A is a variation of layout design 300 (FIG. 3). For example, layout design 600A illustrates an example of where the gate layout pattern (e.g., gate layout patterns 204b, 204c) is continuous, and the MU layer (e.g., a set of conductive feature layout patterns 620) extends in a single direction.

Layout design 600A is usable to manufacture an integrated circuit similar to integrated circuit 100 (FIG. 1), integrated circuit 400 (FIGS. 4A-4E) or 600B (FIGS. 6B-6E).

In comparison with layout design 300 of FIG. 3, layout design 600A does not include set of cut feature layout patterns 304. By not including the set of cut feature layout patterns 304, layout design 600A is usable to manufacture integrated circuit 600B having gate terminal A1 directly coupled to gate terminal A2, and gate terminal B1 directly coupled to gate terminal B2. For ease of illustration, each of layout design 600A of FIG. 6A, layout design 700A of FIG. 7A, layout design 800A of FIG. 8A and layout design 900A of FIG. 9A do not show set of fin layout patterns 316 of FIG. 3.

In comparison with layout design 300 of FIG. 3, a set of metal over diffusion layout patterns 610 of layout design 600A replaces set of metal over diffusion layout patterns 210, and similar detailed description is therefore omitted. The set of metal over diffusion layout patterns 610 is usable to manufacture a corresponding set of contacts 610' (FIGS. 6B-6E) of integrated circuit 600B.

Set of metal over diffusion layout patterns 610 includes one or more of metal over diffusion layout patterns 610a, 610b, 610c, 612a or 612c. Metal over diffusion layout patterns 610a, 610b, 610c, 612a and 612c are usable to manufacture corresponding contacts 610a', 610b', 610c', 612a' and 612c' (FIGS. 6B-6E) of integrated circuit 600B.

In comparison with layout design 300 of FIG. 3, metal over diffusion layout patterns 610a, 612a of layout design 600A replace metal over diffusion layout pattern 210a, metal over diffusion layout pattern 610b replaces metal over diffusion layout pattern 210b, and metal over diffusion layout patterns 610c, 612c replace metal over diffusion layout pattern 210c, and similar detailed description is therefore omitted.

Metal over diffusion layout patterns 610a, 612a are similar to metal over diffusion layout patterns 210a. Metal over diffusion layout pattern 610a is separated or discontinuous from metal over diffusion layout patterns 612a. In some embodiments, metal over diffusion layout pattern 610a extends in the second direction Y from an edge of active region layout pattern 202b to an edge of conductive feature layout pattern 330a. In some embodiments, metal over diffusion layout pattern 612a extends in the second direction Y from an edge of active region layout pattern 202a to an edge of a conductive feature layout pattern 630b.

Metal over diffusion layout pattern 610b is similar to metal over diffusion layout pattern 210b with the reference numeral increased by 400, and similar detailed description is therefore omitted.

Metal over diffusion layout patterns 610c, 612c are similar to metal over diffusion layout patterns 210c. Metal over diffusion layout pattern 610c is separated or discontinuous from metal over diffusion layout patterns 612c. In some embodiments, metal over diffusion layout pattern 610c extends in the second direction Y from an edge of active region layout pattern 202b to an edge of conductive feature layout pattern 630b'. In some embodiments, metal over diffusion layout pattern 612c extends in the second direction Y from an edge of active region layout pattern 202a to an edge of conductive feature layout pattern 330c or 630b'.

In comparison with layout design 300 of FIG. 3, a set of via layout patterns 622, 632 or 642 of layout design 600A replaces corresponding set of via layout patterns 322, 332 or 342, and similar detailed description is therefore omitted. The set of via layout patterns 622, 632 or 642 is usable to manufacture a corresponding set of vias 622', 632' or 642' (FIGS. 6B-6E) of integrated circuit 600B.

Set of via layout patterns 622 includes one or more of via layout patterns 622a or 622b. Set of via layout patterns 632 includes one or more of via layout patterns 632a or 632b. Set of via layout patterns 642 includes one or more of via layout patterns 642a or 642b.

Via layout patterns 622a, 622b, 632a, 632b, 642a and 642b are usable to manufacture a corresponding via 622a', 622b', 632a', 632b', 642a' and 642b' (FIGS. 6B-6E) of integrated circuit 600B.

In comparison with layout design 300 of FIG. 3, via layout patterns 622a, 622b of layout design 600A replace corresponding via layout patterns 322a, 322b, via layout patterns 632a, 632b replace corresponding via layout patterns 332a, 332b, and via layout patterns 642a, 642b replace corresponding via layout patterns 342a, 342b, and similar detailed description is therefore omitted.

Via layout patterns 622a, 622b are similar to corresponding via layout patterns 322a, 322b. Via layout patterns 622a, 622b (collectively referred to as a "set of via layout patterns 622") are between conductive feature layout pattern 620a and corresponding metal over diffusion layout patterns 612a, 610c. The set of via layout patterns 622 is usable to manufacture a corresponding set of vias 622' (VU) that couple the set of conductive structures 620' to the set of contacts 610'.

In some embodiments, a via layout pattern 622a, 622b of the set of via layout patterns 622 is located where a corresponding layout pattern 612a, 610c of the set of metal over diffusion layout patterns 610 overlaps conductive feature layout pattern 620a of the set of conductive feature layout patterns 620. In some embodiments, a center of via layout patterns 622a, 622b of the set of via layout patterns 622 is below a center of a corresponding metal over diffusion layout pattern 612a, 610c of the set of metal over diffusion layout patterns 610. In some embodiments, a center of via layout patterns 622a, 622b of the set of via layout patterns 622 is aligned in at least the first direction X or the second direction Y with a center of a corresponding metal over diffusion layout pattern 612a, 610c of the set of metal over diffusion layout patterns 610. Other configurations of via layout patterns 622a, 622b of the set of via layout patterns 622 are within the scope of the present disclosure.

Via layout patterns 632a, 632b (collectively referred to as a "set of via layout patterns 632") are similar to corresponding via layout patterns 332a, 332b. The set of via layout patterns 632 are between the set of conductive feature layout patterns 630 and the set of gate layout patterns 204. Via layout pattern 632a, 632b of the set of via layout patterns 632 is between a corresponding conductive feature layout pattern 630b, 630b' and a corresponding gate layout pattern 204b, 204c of the set of gate layout patterns 204. The set of via layout patterns 632 is usable to manufacture a corresponding set of vias 632' (FIGS. 6B-6E). As shown in FIGS. 6B-6E, vias 632a', 632b' couple the corresponding conductive structures 660b1', 660b2' to corresponding gates 604b, 604c.

In some embodiments, a via layout pattern 632a, 632b of the set of via layout patterns 632 is located where a corresponding layout pattern 630b, 630b' overlaps a corresponding gate layout pattern 204b, 204c of the set of gate layout patterns 204. In some embodiments, a center of via layout pattern 632a, 632b of the set of via layout patterns 632 is over a center of a corresponding gate layout pattern 204b, 204c of the set of gate layout patterns 204. In some embodiments, a center of via layout pattern 632a, 632b of the set of via layout patterns 632 is below a center of a corresponding conductive feature layout pattern 630b, 630b'. In some embodiments, a center of via layout pattern 632a, 632b of the set of via layout patterns 632 is aligned in at least the first direction X or the second direction Y with a center of a corresponding gate layout pattern 204b, 204c of the set of gate layout patterns 204. In some embodiments, a center of via layout pattern 632a, 632b of the set of via layout patterns 632 is aligned in at least the first direction X or the second direction Y with a center of a corresponding conductive feature layout pattern 630b, 630b'. Other configurations of via layout patterns 632a, 632b of the set of via layout patterns 632 are within the scope of the present disclosure.

Via layout patterns 642a, 642b are similar to corresponding via layout patterns 342a, 342b. Via layout pattern 642a, 642b (collectively referred to as "set of via layout patterns 642") is between conductive feature layout pattern 640a and corresponding conductive feature layout patterns 330a, 330c. Via layout patterns 642a, 642b are usable to manufacture corresponding vias 642a', 642b'. As shown in FIGS. 6B-6E, vias 642a', 642b' couple conductive structure 640a' to corresponding conductive structures 430a, 430c.

In some embodiments, a via layout pattern 642a, 642b of the set of via layout patterns 642 is located where layout pattern 640a of the set of conductive feature layout patterns 640 overlaps a corresponding conductive feature layout pattern 330a, 330c. In some embodiments, a center of via layout patterns 642a, 642b of the set of via layout patterns 642 is below a center of conductive feature layout pattern 640a. In some embodiments, a center of via layout patterns 642a, 642b of the set of via layout patterns 642 is above a center of a corresponding conductive feature layout pattern 330a, 330c. In some embodiments, a center of via layout patterns 642a, 642b of the set of via layout patterns 642 is aligned in at least the first direction X or the second direction Y with a center of a corresponding conductive feature layout pattern 330a, 330c. Other configurations of via layout patterns 642a, 642b of the set of via layout patterns 642 are within the scope of the present disclosure.

In comparison with layout design 300 of FIG. 3, layout design 600A further includes via layout patterns 636*a*, 636*b* (collectively referred to as a "set of via layout patterns 636").

Via layout patterns 636*a*, 636*b* (collectively referred to as a "set of via layout patterns 636") are between the set of conductive feature layout patterns 630 and the set of metal over diffusion layout patterns 610. Via layout pattern 636*a*, 636*b* of the set of via layout patterns 636 is between a corresponding conductive feature layout pattern 330*a*, 330*c* and a corresponding metal over diffusion layout pattern 610*a*, 612*c*. The set of via layout patterns 636 is usable to manufacture a corresponding set of vias 636' (e.g., VD). As shown in FIGS. 6B-6E, vias 636*a*', 636*b*' couple corresponding conductive structures 430*a*, 430*c* to corresponding contacts 610*a*', 612*c*'.

In some embodiments, a via layout pattern 636*a*, 636*b* of the set of via layout patterns 636 is located where a corresponding layout pattern 330*a*, 330*c* overlaps a corresponding metal over diffusion layout pattern 610*a*, 612*c*. In some embodiments, a center of via layout pattern 636*a*, 636*b* of the set of via layout patterns 636 is over a center of a corresponding metal over diffusion layout pattern 610*a*, 612*c*. In some embodiments, a center of via layout pattern 636*a*, 636*b* of the set of via layout patterns 636 is below a center of a corresponding conductive feature layout pattern 330*a*, 330*c*. In some embodiments, a center of via layout pattern 636*a*, 636*b* of the set of via layout patterns 636 is aligned in at least the first direction X or the second direction Y with a center of a corresponding metal over diffusion layout pattern 610*a*, 612*c*. In some embodiments, a center of via layout pattern 636*a*, 636*b* of the set of via layout patterns 636 is aligned in at least the first direction X or the second direction Y with a center of a corresponding conductive feature layout pattern 330*a*, 330*c*. Other configurations of via layout patterns 636*a*, 636*b* of the set of via layout patterns 636 are within the scope of the present disclosure.

In comparison with layout design 300 of FIG. 3, conductive feature layout pattern 620*a* of layout design 600A replaces conductive feature layout pattern 320*a*, conductive feature layout patterns 630*b*, 630*b*' replace conductive feature layout pattern 330*b*, and conductive feature layout pattern 640*a* replaces conductive feature layout pattern 340*a*, and similar detailed description is therefore omitted.

Conductive feature layout pattern 620*a* is similar to conductive feature layout pattern 320*a* with the reference numerals increased by 300. Conductive feature layout pattern 620*a* is usable to manufacture a corresponding conductive structure 620*a*' (FIGS. 6B-6E). Other configurations of conductive feature layout pattern 620*a* of the set of conductive feature layout patterns 620 are within the scope of the present disclosure.

Conductive feature layout patterns 630*b*, 630*b*' are similar to conductive feature layout pattern 330*b* with the reference numerals increased by 300. Conductive feature layout patterns 630*b*, 630*b*' are usable to manufacture corresponding conductive structures 660*b*1', 660*b*2' (FIGS. 6B-6E). Conductive feature layout pattern 630*b* is separated or discontinuous from conductive feature layout pattern 630*b*'. In some embodiments, conductive feature layout pattern 630*b* extends in the first direction X to an edge of metal over diffusion layout pattern 610*b*. In some embodiments, conductive feature layout pattern 630*b*' extends in the first direction X to another edge of metal over diffusion layout pattern 610*b*. Other configurations of conductive feature layout patterns 630*b*, 630*b*' of the set of conductive feature layout patterns 630 are within the scope of the present disclosure.

Conductive feature layout pattern 640*a* is similar to conductive feature layout pattern 340*a* with the reference numerals increased by 300. Conductive feature layout pattern 640*a* is usable to manufacture corresponding conductive structure 440*a* (FIGS. 6B-6E). Conductive feature layout pattern 640*a* is positioned between gate layout patterns 204*b* and 204*c*. Other configurations of conductive feature layout pattern 640*a* of a set of conductive feature layout patterns 640 are within the scope of the present disclosure.

FIG. 6B is a cross-sectional view of integrated circuit 600B corresponding to layout design 600A as intersected by plane FIG. 6C is a cross-sectional view of integrated circuit 600B corresponding to layout design 600A as intersected by plane J-J', FIG. 6D is a cross-sectional view of integrated circuit 600B corresponding to layout design 600A as intersected by plane K-K', and FIG. 6E is a cross-sectional view of integrated circuit 600B corresponding to layout design 600A as intersected by plane L-L', in accordance with some embodiments. Structural relationships including alignment, lengths and widths, as well as configurations of integrated circuit 600B are similar to the structural relationships and configurations of layout design 600A of FIG. 6A, and will not be described in FIGS. 6B-6E for brevity.

Integrated circuit 600B is manufactured by layout design 600A. In some embodiments, integrated circuit 600B is similar to integrated circuit 400, and similar detailed description is therefore omitted for brevity.

In comparison with integrated circuit 400 of FIGS. 4A-4E, set of contacts 610' of integrated circuit 600B replaces set of contacts 410, set of vias 622', 632', 642' of integrated circuit 600B replace corresponding set of vias 422, 432, 442, conductive structure 620*a*' of integrated circuit 600B replaces conductive structure 420*a*, conductive structure 640*a*' of integrated circuit 600B replaces conductive structure 440*a*, conductive structures 660*b*1', 660*b*2' of integrated circuit 600B replaces conductive structure 430*b*, gate 604*b* of integrated circuit 600B replaces gates 404*b*1 and 404*b*2, and gate 604*c* of integrated circuit 600B replaces gates 404*c*1 and 404*c*2, and similar detailed description is therefore omitted for brevity.

In some embodiments, the set of contacts 610' includes one or more of contacts 610*a*', 610*b*', 610*c*', 612*a*' and 612*c*'. In some embodiments, the set of vias 622' includes one or more of vias 622*a*' or 622*b*'. In some embodiments, the set of vias 632' includes one or more of vias 632*a*' or 632*b*'. In some embodiments, the set of vias 642' includes one or more of vias 642*a*' or 642*b*'.

In comparison with contact 410*a* of integrated circuit 400 of FIGS. 4A-4E, contacts 610*a*' and 612*a*' are not a single, continuous structure. Contacts 610*a*' and 612*a*' are separated from each other in the second direction Y.

In comparison with contact 410*c* of integrated circuit 400 of FIGS. 4A-4E, contacts 610*c*' and 612*c*' are not a single, continuous structure. Contacts 610*c*' and 612*c*' are separated from each other in the second direction Y.

In comparison with conductive structure 430*b* of integrated circuit 400 of FIGS. 4A-4E, conductive structures 660*b*1', 660*b*2' are not a single, continuous structure. In other words, conductive structures 660*b*1' and 660*b*2'are separated from each other in the first direction X.

In comparison with integrated circuit 400 of FIGS. 4A-4E, integrated circuit 600B further includes a set of vias 636'. In some embodiments, the set of vias 636' includes one or more of vias 636*a*' or 636*b*'.

Set of vias 636' are similar to set of vias 432, except the set of vias 636' are positioned between the set of contacts 610' and one or more of conductive structures 430a, 430c, 660b1' or 600b2', and similar detailed description is therefore omitted for brevity. In other words, the set of vias 636' (e.g., VD level) are above the set of contacts 610' (e.g., MD level), and are configured to couple the set of contacts 610' to upper metal layers (e.g., M0 level). For example, vias 636a', 636b' couple corresponding conductive structures 430a, 430c to corresponding contacts 610a', 612c'. Other configurations of set of vias 636' are within the scope of the present disclosure.

In comparison with gates 404b1 and 404b2 of integrated circuit 400 of FIGS. 4A-4E, gate 604b is a continuous structure. In some embodiments, gate terminal A1 (manufactured by gate layout pattern 204b) of integrated circuit 600B is directly coupled to gate terminal A2 (manufactured by gate layout pattern 204b) by gate 604b.

In comparison with gates 404c1 and 404c2 of integrated circuit 400 of FIGS. 4A-4E, gate 604c is a continuous structure. In some embodiments, gate terminal B1 (manufactured by gate layout pattern 204c) of integrated circuit 600B is directly coupled to gate terminal B2 (manufactured by gate layout pattern 204c) by gate 604c.

In some embodiments, terminal A1D corresponds to contact 610a', and terminal B2D corresponds to contact 612c'. In these embodiments, terminal A1D or contact 610a' (manufactured by metal over diffusion layout pattern 610a) of integrated circuit 600B is electrically coupled to terminal B2D or contact 612c' (manufactured by metal over diffusion layout pattern 612c). For example, in some embodiments, contact 610a' (manufactured by metal over diffusion layout pattern 610a) is electrically connected through via 636a' (manufactured by via layout pattern 636a) to conductive structure 430a (manufactured by conductive feature layout pattern 330a). In some embodiments, conductive structure 430a is electrically coupled through via 642a' (manufactured by via layout pattern 642a) to conductive structure 640a' (manufactured by conductive feature layout pattern 640a). In some embodiments, conductive structure 640a' is electrically coupled through via 642b' (manufactured by via layout pattern 642b) to conductive structure 430c (manufactured by conductive feature layout pattern 330c). In some embodiments, conductive structure 430c is electrically coupled through via 636b' (manufactured by via layout pattern 636b) to contact 612c' (manufactured by metal over diffusion layout pattern 612c). Thus, terminal A1D or contact 610a' is electrically coupled to terminal B2D or contact 612c'.

In some embodiments, terminal B1D corresponds to contact 610c', and terminal A2D corresponds to contact 612a'. In these embodiments, terminal B1D or contact 610c' (manufactured by metal over diffusion layout pattern 610c) of integrated circuit 600B is electrically coupled to terminal A2D or contact 612a' (manufactured by metal over diffusion layout pattern 612a). For example, in some embodiments, contact 610c' (manufactured by metal over diffusion layout pattern 610c) is electrically connected through via 622b' (manufactured by via layout pattern 622b) to conductive structure 620a' (manufactured by conductive feature layout pattern 620a). In some embodiments, conductive structure 620a' is electrically coupled through via 622a' (manufactured by via layout pattern 622a) to contact 612a' (manufactured by metal over diffusion layout pattern 612a). Thus, terminal B1D or contact 610c' of integrated circuit 600B is electrically coupled to terminal A2D or contact 612a'.

Other configurations of terminals A1D, A2D, B1D or B2D are within the scope of the present disclosure. For example, in some embodiments, terminal A1D corresponds to contact 610c', and terminal B2D corresponds to contact 612a'. For example, in some embodiments, terminal A2D corresponds to contact 610a', and terminal B1D corresponds to contact 612c'.

FIG. 7A is a diagram of a layout design 700A of an integrated circuit, in accordance with some embodiments.

FIGS. 7B, 7C or 7D are cross-sectional views of integrated circuit 700B, in accordance with some embodiments.

Layout design 700A is a variation of layout design 600A (FIG. 6A). For example, layout design 700A illustrates an example of where the MU layer (e.g., a set of conductive feature layout patterns 720) extends in two directions.

Layout design 700A is usable to manufacture an integrated circuit similar to integrated circuit 100 (FIG. 1), integrated circuit 400 (FIGS. 4A-4E) or 700B (FIGS. 7B-7D).

In comparison with layout design 600A of FIG. 6A, conductive feature layout patterns 720a, 720b, and 720c of layout design 700A replace conductive feature layout pattern 620a, and similar detailed description is therefore omitted.

Conductive feature layout pattern 720a, 720b, 720c (hereinafter referred to as a "set of conductive feature layout patterns 720") is similar to corresponding conductive feature layout patterns 520a, 520b, 520c of FIG. 5A.

The set of conductive feature layout patterns 720 is usable to manufacture a corresponding set of two-dimensional (2D) conductive structures 720' of integrated circuit 100 or 700B (FIGS. 7B-7D).

In some embodiments, the set of conductive feature layout patterns 720 is located on the MU portion of the first layout level. The set of conductive feature layout patterns 720 extends in two directions (e.g., first direction X and second direction Y). Conductive feature layout pattern 720a and 720c each extend in the first direction X. Conductive feature layout pattern 720b extends in the second direction Y.

The set of conductive feature layout patterns 720 is between the set of active region layout patterns 202. Conductive feature layout pattern 720a is positioned between conductive feature layout pattern 330c and conductive feature layout pattern 630b. Conductive feature layout pattern 720c is positioned between conductive feature layout pattern 330a and conductive feature layout pattern 630b'.

Conductive feature layout pattern 720b is positioned between gate layout patterns 204b and 204c. In some embodiments, conductive feature layout pattern 720b is positioned between conductive feature layout pattern 330a and conductive feature layout pattern 330c. In some embodiments, metal over diffusion layout pattern 612a, 610b, 610c overlaps a corresponding conductive feature layout pattern 720a, 720b, 720c.

The set of gate layout patterns 204 overlaps the set of conductive feature layout patterns 720. In some embodiments, gate layout patterns 204a, 204b overlap conductive feature layout pattern 720a. In some embodiments, gate layout patterns 204c, 204d overlap conductive feature layout pattern 720c. Other configurations or quantities of patterns in the set of conductive feature layout patterns 720 are within the scope of the present disclosure.

FIG. 7B is a cross-sectional view of integrated circuit 700B corresponding to layout design 700A as intersected by plane M-M', FIG. 7C is a cross-sectional view of integrated circuit 700B corresponding to layout design 700A as intersected by plane N-N', and FIG. 7D is a cross-sectional view of integrated circuit 700B corresponding to layout design 700A as intersected by plane O-O' in accordance with some embodiments. Structural relationships including alignment, lengths and widths, as well as configurations of integrated circuit 700B are similar to the structural relationships and configurations of layout design 700A of FIG. 7A, and will not be described in FIGS. 7B-7D for brevity.

Integrated circuit 700B is manufactured by layout design 700A. In some embodiments, integrated circuit 700B is similar to integrated circuit 400 or 600A, and similar detailed description is therefore omitted for brevity.

In comparison with integrated circuit 600B of FIGS. 6B-6E, set of conductive structures 720' of integrated circuit 700B replaces set of conductive structures 620'.

In some embodiments, the set of conductive structures 720' includes one or more of conductive structures 720a', 720b' and 720c'.

Conductive structures 720a' and 720c' extend in the first direction X, and are separated from each other in the second direction Y. Conductive structure 720b' extends in the second direction Y. Conductive structure 720b' directly contacts conductive structures 720a' and 720c'. In some embodiments, conductive structures 720a', 720b' and 720c' are part of a same continuous conductive structure. In some embodiments, set of conductive structures 720' is referred to as a 2D conductive structure.

In some embodiments, gate terminal A1 (manufactured by gate layout pattern 204b) of integrated circuit 700B is directly coupled to gate terminal A2 (manufactured by gate layout pattern 204b) by gate 604b (manufactured by gate layout pattern 204b) similar to integrated circuit 600B FIGS. 6B-6E, and detailed description is therefore omitted.

In some embodiments, gate terminal B1 (manufactured by gate layout pattern 204c) of integrated circuit 700B is directly coupled to gate terminal B2 (manufactured by gate layout pattern 204c) by gate 604c (manufactured by gate layout pattern 204c) similar to integrated circuit 600B of FIGS. 6B-6E, and detailed description is therefore omitted.

In some embodiments, terminal A1D (manufactured by metal over diffusion layout pattern 610a) of integrated circuit 700B is electrically coupled to terminal B2D (manufactured by metal over diffusion layout pattern 612c) similar to integrated circuit 600B of FIGS. 6B-6E, and detailed description is therefore omitted.

In some embodiments, terminal B1D corresponds to contact 610c', and terminal A2D corresponds to contact 612a'. In these embodiments, terminal B1D or contact 610c' (manufactured by metal over diffusion layout pattern 610c) of integrated circuit 700B is electrically coupled to terminal A2D or contact 612a' (manufactured by metal over diffusion layout pattern 612a). For example, in some embodiments, contact 610c' (manufactured by metal over diffusion layout pattern 610c) is electrically connected through via 622b' (manufactured by via layout pattern 622b) to conductive structure 720c' (manufactured by conductive feature layout pattern 720c). In some embodiments, conductive structure 720c' (manufactured by conductive feature layout pattern 720c) is electrically connected to conductive structure 720a' (manufactured by conductive feature layout pattern 720a) by conductive structure 720b' (manufactured by conductive feature layout pattern 720b). In some embodiments, conductive structure 720a' (manufactured by conductive feature layout pattern 720a) is electrically coupled through via 622a' (manufactured by via layout pattern 622a) to contact 612a (manufactured by metal over diffusion layout pattern 612a).

Thus, terminal B1D or contact 610c' of integrated circuit 700B is electrically coupled to terminal A2D or contact 612a'.

Figure 8A:
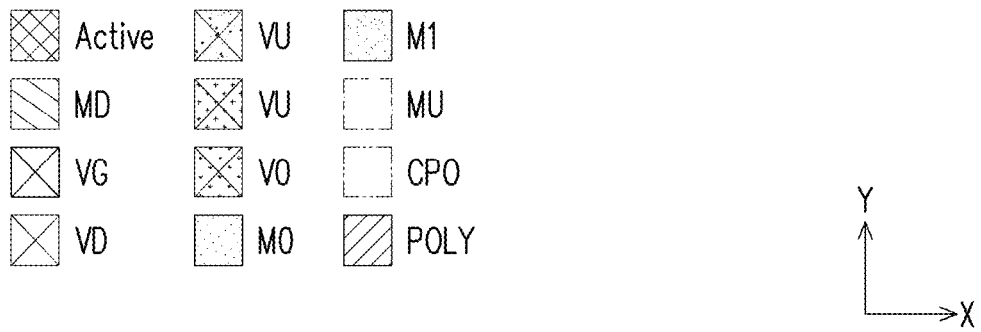
FIG. 8A is a diagram of a layout design of an integrated circuit, in accordance with some embodiments.
Figure 8A:
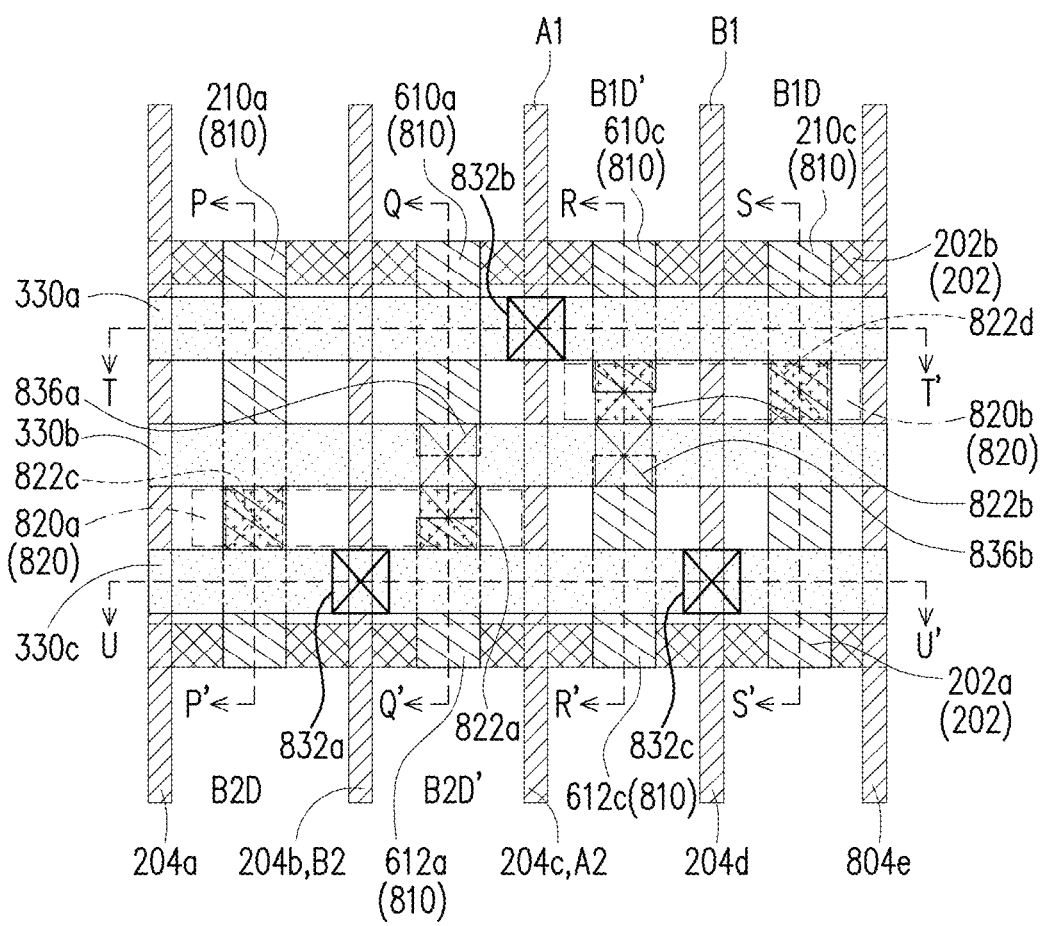

FIG. 8A is a diagram of a layout design 800A of an integrated circuit, in accordance with some embodiments.

FIGS. 8B, 8C, 8D, 8E, 8F and 8G are cross-sectional views of integrated circuit 800B, in accordance with some embodiments.

Layout design 800A is a variation of layout design 300 (FIG. 3) and layout design 700A (FIG. 7A). For example, layout design 800A illustrates an example layout design having a 4 poly pitch width in the first direction X, and the MU layer (e.g., a set of conductive feature layout patterns 820) extends in a single direction, but includes two portions (e.g., conductive feature layout patterns 820a and 820b).

Layout design 800A is usable to manufacture an integrated circuit similar to integrated circuit 100 (FIG. 1), integrated circuit 400 (FIGS. 4A-4E) or integrated circuit 800B (FIGS. 8B-8G).

In comparison with layout design 300 of FIG. 3, layout design 800A does not include set of cut feature layout patterns 304. By not including the set of cut feature layout patterns 304, layout design 800A is usable to manufacture an integrated circuit having gate terminal A1 directly coupled to gate terminal A2.

In comparison with layout design 200, 300, 500A, 600A or 700A, layout design 800A further includes an additional gate layout pattern 804e extending in the second direction Y, resulting in a wider layout design (e.g., layout design 800A). For example, layout design 800A has a 4 poly pitch width in the first direction X. Layout design 800A has features of layout design 300 and 600A. For example, layout design incorporates at least metal diffusion layout patterns 610a, 610c, 612a and 612c from layout design 600A. Similarly, layout design 800A incorporates at least metal diffusion layout patterns 210a, and 210c from layout design 300.

Layout design 800A includes set of active region layout patterns 202, gate layout patterns 204a, 204b, 204c, 204d, 804e (collectively referred to as a "set of gate layout patterns 804"), metal over diffusion layout patterns 210a, 210c, 610a, 610c, 612a, 612c (collectively referred to as a "set of metal over diffusion layout patterns 810"), set of conductive feature layout patterns 330, conductive feature layout pattern 820a, 820b (collectively referred to as a "set of conductive feature layout patterns 820"), via layout patterns 822a, 822b, 822c, 822d (collectively referred to as a "set of via layout patterns 822"), via layout patterns 832a, 832b, 832c (collectively referred to as a "set of via layout patterns 832") and via layout patterns 836a, 836b (collectively referred to as a "set of via layout patterns 836").

In comparison with layout design 200, 300, 500A, 600A or 700A, set of active region layout patterns 202 and set of conductive feature layout patterns 330 extend across at least gate layout patterns 204a and 804e.

Gate layout pattern 804e is similar to one or more of gate layout patterns 204a, 204b, 204c, 204d of the set of gate layout patterns 204, and detailed description is therefore omitted. Gate layout pattern 804e is separated from gate layout pattern 204d in the first direction X by a Poly pitch. The set of gate layout patterns 804 is usable to manufacture a corresponding set of gates 804' (FIGS. 8B-8G) of integrated circuit 800B. Gate layout pattern 804e is usable to manufacture a corresponding gate 804e' (FIGS. 8B-8G) of integrated circuit 800B.

Set of metal over diffusion layout patterns 810 is similar to set of metal over diffusion layout patterns 210 of FIG. 2 and set of metal over diffusion layout patterns 610 of FIGS.

6A & 7A, and detailed description is therefore omitted. The set of metal over diffusion layout patterns 810 is usable to manufacture a corresponding set of contacts 810' (FIGS. 8B-8G) of integrated circuit 800B. Metal over diffusion layout patterns 210a, 210c, 610a, 610c, 612a and 612c are usable to manufacture corresponding contacts 410a, 410c, 610a', 610c', 612a' and 612c' (FIGS. 8B-8G) of integrated circuit 800B.

Metal over diffusion layout pattern 210a is positioned between gate layout patterns 204a and 204b. Metal over diffusion layout pattern 210c is positioned between gate layout patterns 204d and 804e. Each of metal over diffusion layout patterns 610a and 612a are positioned between gate layout patterns 204b and 204c. Each of metal over diffusion layout patterns 610c and 612c are positioned between gate layout patterns 204c and 204d.

Set of conductive feature layout patterns 820 is similar to set of conductive feature layout patterns 320, 420, 520, 620, 720, and detailed description is therefore omitted. The set of conductive feature layout patterns 820 is usable to manufacture a corresponding set of conductive structures 820' (FIGS. 8B-8G) of integrated circuit 800B. Conductive feature layout patterns 820a and 820b are similar to corresponding conductive feature layout patterns 720a and 720c, and detailed description is therefore omitted. Conductive feature layout patterns 820a and 820b are usable to manufacture corresponding conductive structures 820a' and 820b' (FIGS. 8B-8G) of integrated circuit 800B.

Conductive feature layout pattern 820a extends in the first direction X, and is positioned between conductive feature layout pattern 330b and conductive feature layout pattern 330c. Conductive feature layout pattern 820a is positioned between gate layout pattern 204a and gate layout pattern 204c. Conductive feature layout pattern 820a is below at least metal over diffusion layout pattern 210a, 610a or 612a. In some embodiments, metal over diffusion layout pattern 210a or metal over diffusion layout pattern 612a overlaps conductive feature layout pattern 820a.

Conductive feature layout pattern 820b extends in the first direction X, and is positioned between conductive feature layout pattern 330a and conductive feature layout pattern 330b. Conductive feature layout pattern 820b is positioned between gate layout pattern 204c and gate layout pattern 804e. Conductive feature layout pattern 820b is below at least metal over diffusion layout pattern 210c, 610c or 612c. In some embodiments, metal over diffusion layout pattern 210c or metal over diffusion layout pattern 610c overlaps conductive feature layout pattern 820b.

Set of via layout patterns 822 is similar to set of via layout patterns 322, 522, 622, and detailed description is therefore omitted. The set of via layout patterns 822 is usable to manufacture a corresponding set of vias 822' (FIGS. 8B-8G) of integrated circuit 800B.

Via layout patterns 822a, 822b, 822c and 822d are usable to manufacture corresponding vias 822a', 822b', 822c' and 822d' (FIGS. 8B-8G) of integrated circuit 800B. Via layout patterns 822a, 822c is similar to via layout pattern 622a, and detailed description is therefore omitted. Via layout pattern 822c, 822a is between conductive feature layout pattern 820a and corresponding metal over diffusion layout patterns 210a, 612a. In some embodiments, via layout pattern 822c, 822a of the set of via layout patterns 822 is located where a corresponding layout pattern 210a, 612a of the set of metal over diffusion layout patterns 810 overlaps conductive feature layout pattern 820a of the set of conductive feature layout patterns 820. In some embodiments, a center of via layout patterns 822c, 822a of the set of via layout patterns 822 is below a center of a corresponding metal over diffusion layout pattern 210a, 612a of the set of metal over diffusion layout patterns 810. In some embodiments, a center of via layout patterns 822c, 822a of the set of via layout patterns 822 is aligned in at least the first direction X or the second direction Y with a center of a corresponding metal over diffusion layout pattern 210a, 612a of the set of metal over diffusion layout patterns 810.

Via layout patterns 822b, 822d is similar to via layout pattern 622b, and detailed description is therefore omitted. Via layout pattern 822b, 822d is between conductive feature layout pattern 820b and corresponding metal over diffusion layout patterns 610c, 210c. In some embodiments, a via layout pattern 822b, 822d of the set of via layout patterns 822 is located where a corresponding layout pattern 610c, 210c of the set of metal over diffusion layout patterns 810 overlaps conductive feature layout pattern 820b of the set of conductive feature layout patterns 820. In some embodiments, a center of via layout patterns 822b, 822d of the set of via layout patterns 822 is below a center of a corresponding metal over diffusion layout pattern 610c, 210c of the set of metal over diffusion layout patterns 810. In some embodiments, a center of via layout patterns 822b, 822d of the set of via layout patterns 822 is aligned in at least the first direction X or the second direction Y with a center of a corresponding metal over diffusion layout pattern 610c, 210c of the set of metal over diffusion layout patterns 810. Other configurations of via layout patterns 822a, 822b, 822c, 822d of the set of via layout patterns 822 are within the scope of the present disclosure.

Set of via layout patterns 832 is similar to set of via layout patterns 332, 632, and detailed description is therefore omitted. The set of via layout patterns 832 is usable to manufacture a corresponding set of vias 832' (FIGS. 8B-8G) of integrated circuit 800B. The set of via layout patterns 832 are between the set of conductive feature layout patterns 330 and the set of gate layout patterns 804. Via layout patterns 832a, 832b and 832c are usable to manufacture corresponding vias 832a', 832b' and 832c' (FIGS. 8B-8G) of integrated circuit 800B. Via layout patterns 832a, 832c of the set of via layout patterns 832 are between conductive feature layout pattern 330c and a corresponding gate layout pattern 204b, 204d of the set of gate layout patterns 804. Via layout pattern 832b of the set of via layout patterns 832 is between conductive feature layout pattern 330a and gate layout pattern 204c of the set of gate layout patterns 804.

In some embodiments, a via layout pattern 832a, 832c of the set of via layout patterns 832 is located where layout pattern 330c overlaps a corresponding gate layout pattern 204b, 204d of the set of gate layout patterns 804. In some embodiments, via layout pattern 832b of the set of via layout patterns 832 is located where layout pattern 330a overlaps gate layout pattern 204c of the set of gate layout patterns 804. In some embodiments, a center of via layout pattern 832a, 832c of the set of via layout patterns 832 is over a center of a corresponding gate layout pattern 204b, 204d of the set of gate layout patterns 804. In some embodiments, a center of via layout pattern 832b of the set of via layout patterns 832 is over a center of gate layout pattern 204c of the set of gate layout patterns 804. In some embodiments, a center of via layout pattern 832a, 832c of the set of via layout patterns 832 is below a center of conductive feature layout pattern 330c. In some embodiments, a center of via layout pattern 832b of the set of via layout patterns 832 is below a center of conductive feature layout pattern 330a.

Other configurations of via layout patterns 832a, 832b, 832c of the set of via layout patterns 832 are within the scope of the present disclosure.

Set of via layout patterns 836 is similar to set of via layout patterns 636, and detailed description is therefore omitted. The set of via layout patterns 836 is usable to manufacture a corresponding set of vias 836' (FIGS. 8B-8G) of integrated circuit 800B. Set of via layout patterns 836 are between the set of conductive feature layout patterns 330 and the set of metal over diffusion layout patterns 810. Via layout patterns 836a and 836b are usable to manufacture corresponding vias 836a' and 836b' (FIGS. 8B-8G) of integrated circuit 800B. Via layout patterns 836a, 836b of the set of via layout patterns 836 are between conductive feature layout pattern 330b and a corresponding metal over diffusion layout pattern 610a, 612c.

In some embodiments, a via layout pattern 836a, 836b of the set of via layout patterns 836 is located where layout pattern 330b at least partially overlaps a corresponding metal over diffusion layout pattern 610a, 612c. Via layout pattern 836a, 836b of the set of via layout patterns 836 is over a corresponding metal over diffusion layout pattern 610a, 612c. In some embodiments, a center of via layout pattern 836a, 836b of the set of via layout patterns 836 is over a center of a corresponding metal over diffusion layout pattern 610a, 612c. In some embodiments, a center of via layout pattern 836a, 836b of the set of via layout patterns 836 is below a center of conductive feature layout pattern 330b. In some embodiments, a center of via layout pattern 836a, 836b of the set of via layout patterns 836 is aligned in at least the first direction X or the second direction Y with a center of a corresponding metal over diffusion layout pattern 610a, 612c. In some embodiments, a center of via layout pattern 836a, 836b of the set of via layout patterns 836 is aligned in at least the first direction X or the second direction Y with a center of conductive feature layout pattern 330b. Other configurations of via layout patterns 836a, 836b of the set of via layout patterns 836 are within the scope of the present disclosure.

Figure 8B:
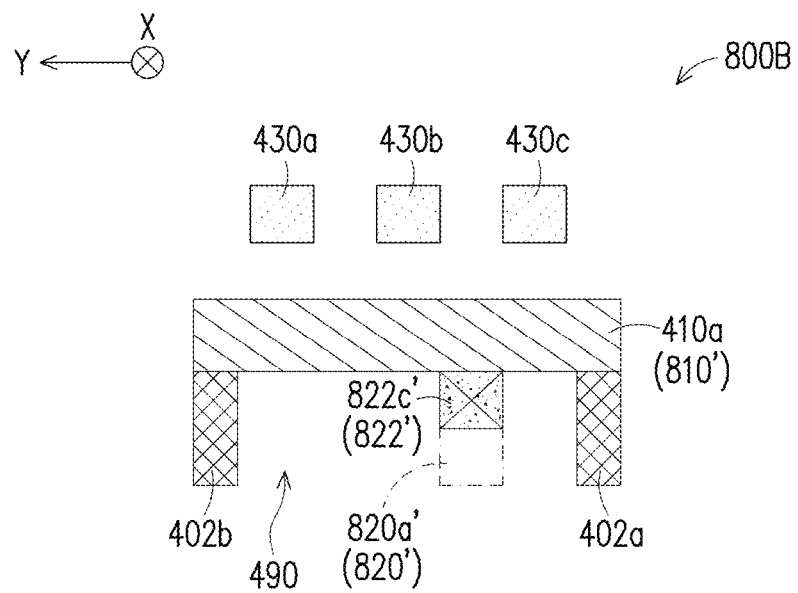
FIGS. 8B, 8C, 8D, 8E, 8F and 8G are cross-sectional views of an integrated circuit, in accordance with some embodiments.
Figure 8C:
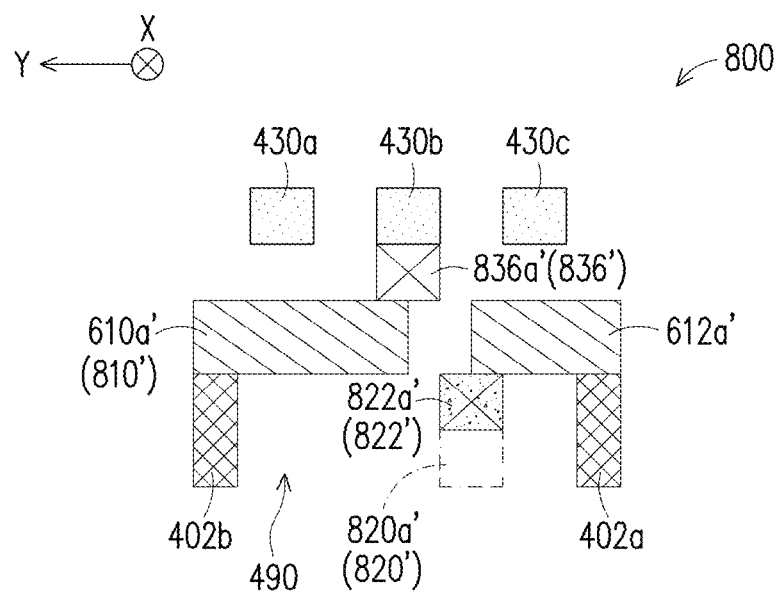
Figure 8D:
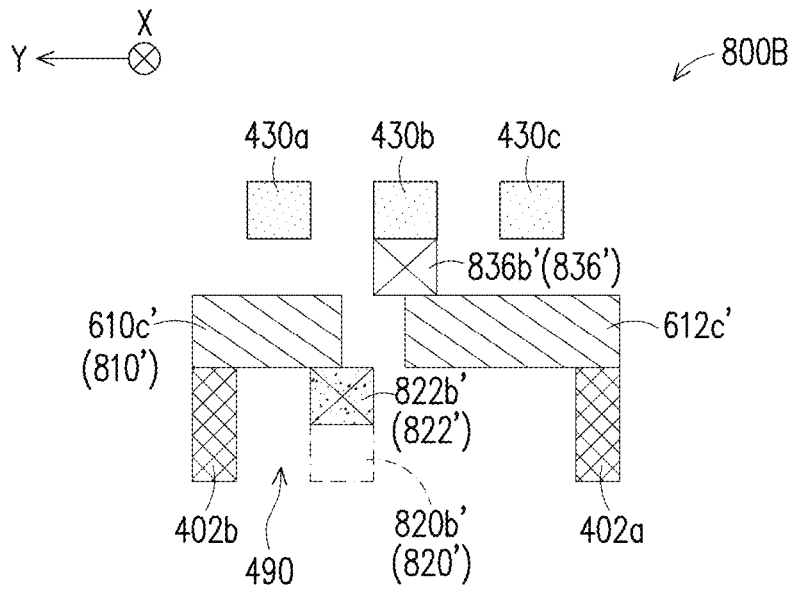
Figure 8E:
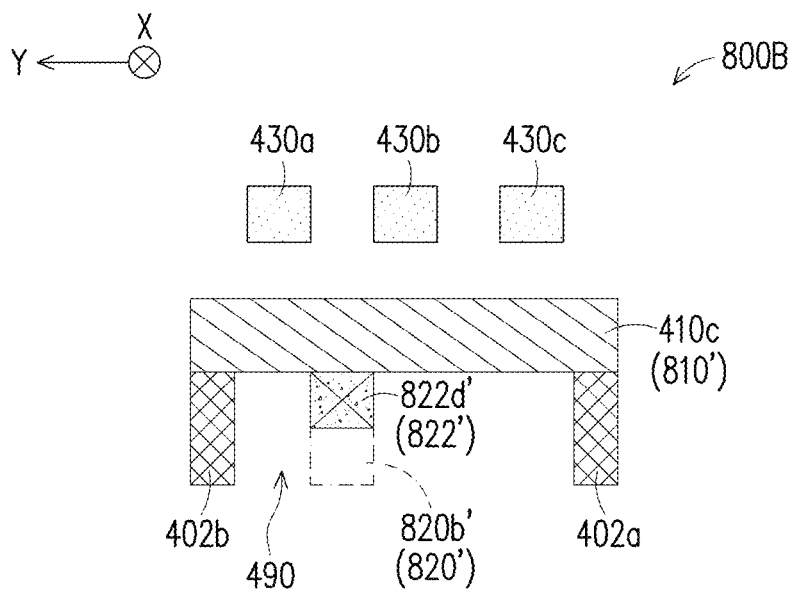
Figure 8F:
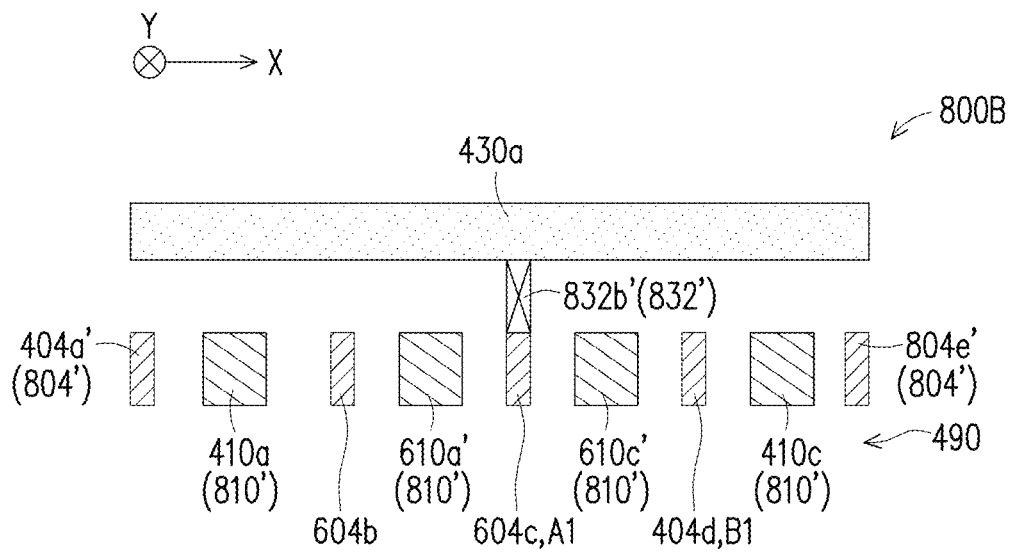
Figure 8G:
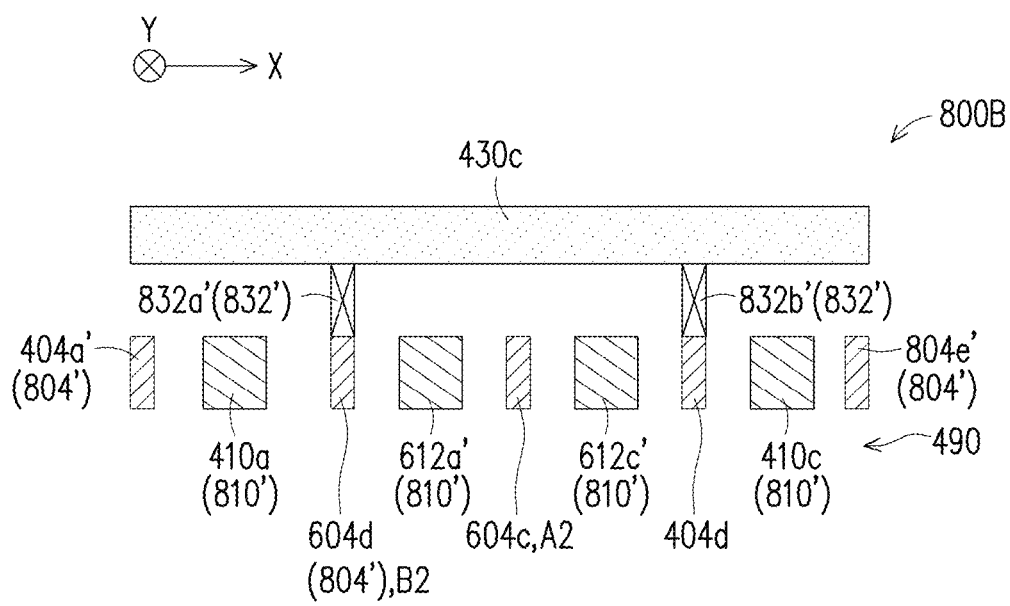

FIG. 8B is a cross-sectional view of integrated circuit 800B corresponding to layout design 800A as intersected by plane P-P', FIG. 8C is a cross-sectional view of integrated circuit 800B corresponding to layout design 800A as intersected by plane Q-Q', FIG. 8D is a cross-sectional view of integrated circuit 800B corresponding to layout design 800A as intersected by plane R-R', FIG. 8E is a cross-sectional view of integrated circuit 800B corresponding to layout design 800A as intersected by plane S-S', FIG. 8F is a cross-sectional view of integrated circuit 800B corresponding to layout design 800A as intersected by plane T-T', and FIG. 8G is a cross-sectional view of integrated circuit 800B corresponding to layout design 800A as intersected by plane U-U', in accordance with some embodiments. Structural relationships including alignment, lengths and widths, as well as configurations of integrated circuit 800B are similar to the structural relationships and configurations of layout design 800A of FIG. 8A, and will not be described in FIGS. 8B-8G for brevity.

Integrated circuit 800B is manufactured by layout design 800A. In some embodiments, integrated circuit 800B is similar to integrated circuit 400, 600B or 700B, and similar detailed description is therefore omitted for brevity.

Integrated circuit 800B has a 4 poly pitch width in the first direction X. Integrated circuit 800B has features of integrated circuit 400 and 600B. For example, integrated circuit 800B incorporates at least contacts 610a', 610c', 612a' and 612c' from integrated circuit 600B. Similarly, integrated circuit 800B incorporates at least contacts 410a and 410c from integrated circuit 400.

Integrated circuit 800B includes set of active regions 402, gates 404a, 404d, 604b, 604c and 804e' (collectively referred to as a set of gates 804'), contacts 410a, 410c, 610a', 610c', 612a', 612c' (collectively referred to as a set of contacts 810'), set of conductive structures 430, conductive structures 820a', 820b' (collectively referred to as a set of conductive structures 820'), vias 822a', 822b', 822c', 822d' (collectively referred to as a set of vias 822'), vias 832a', 832b', 832c' (collectively referred to as a set of vias 832') and vias 836a', 836b' (collectively referred to as a set of vias 836').

In comparison with integrated circuit 600 (FIGS. 6B-6E) or 700 (FIGS. 7B-7D), conductive structures 820a', 820b' replace conductive structures 720a', 720c' of integrated circuit 700B, vias 822a', 822b', 822c', 822d' replace vias 622a', 622b' of integrated circuit 700B, vias 832a', 832b', 832c' replace vias 632a', 632b' of integrated circuit 600B, vias 836a', 836b' replace vias 636a', 636b' of integrated circuit 600B, and similar detailed description is therefore omitted for brevity.

In comparison with integrated circuit 600B (FIGS. 6B-6E) or 700B (FIGS. 7B-7D), gate 804e' is similar to gate 404a, 404d, 604b or 604c, and similar detailed description is therefore omitted for brevity.

In comparison with conductive structures 720a' and 720c' of integrated circuit 700B of FIGS. 7B-7D, conductive structures 820a' and 820b' are not coupled together. In other words, conductive structures 820a' and 820b' are not coupled together through another conductive structure (e.g., conductive structure 720b').

The set of vias 822' electrically couple the set of conductive structures 820' to the set of contacts 810'. The set of vias 832' electrically couple the set of conductive structures 430 to the set of gates 804'. The set of vias 836' electrically couple the set of conductive structures 430 to the set of contacts 810'.

In some embodiments, terminal A1 or A2 corresponds to gate 604c. Gate 604c is a continuous structure. In some embodiments, gate terminal A1 is directly coupled to gate terminal A2 by gate 604c (manufactured by gate layout pattern 204c of layout design 800A).

In some embodiments, terminal B1 corresponds to gate 404d, and terminal B2 corresponds to gate 604b. In these embodiments, gate 404d (manufactured by gate layout pattern 204d of layout design 800A) of integrated circuit 800B is electrically coupled to gate 604b (manufactured by gate layout pattern 204b of layout design 800A). For example, in some embodiments, gate 404d (manufactured by gate layout pattern 204d of layout design 800A) is electrically connected through via 832c' (manufactured by via layout pattern 832c) to conductive structure 430c (manufactured by conductive feature layout pattern 330c), and conductive structure 430c is electrically coupled through via 832a' (manufactured by via layout pattern 832a) to gate 604b (manufactured by gate layout pattern 204b of layout design 800A).

In some embodiments, terminal B2D corresponds to contact 410a, and terminal B2D' corresponds to contact 612a'. In these embodiments, terminal B2D or contact 410a (manufactured by metal over diffusion layout pattern 210a) of integrated circuit 800B is electrically coupled to terminal B2D' or contact 612a' (manufactured by metal over diffusion layout pattern 612a). For example, in some embodiments, contact 410a (manufactured by metal over diffusion layout pattern 210*a*) is electrically connected through via 822*c*' (manufactured by via layout pattern 822*c*) to conductive structure 820*a*' (manufactured by conductive feature layout pattern 820*a*). In some embodiments, conductive structure 820*a*' is electrically coupled through via 822*a*' (manufactured by via layout pattern 822*a*) to contact 612*a*' (manufactured by metal over diffusion layout pattern 612*a*). Thus, terminal B2D or contact 410*a* is electrically coupled to terminal B2D' or contact 612*a*'.

In some embodiments, terminal B1D corresponds to contact 410*c*, and terminal BID' corresponds to contact 610*c*'. In these embodiments, terminal B1D or contact 410*c* (manufactured by metal over diffusion layout pattern 210*c*) of integrated circuit 800B is electrically coupled to terminal BID' or contact 610*c*' (manufactured by metal over diffusion layout pattern 610*c*). For example, in some embodiments, contact 410*c* (manufactured by metal over diffusion layout pattern 210*c*) is electrically connected through via 822*d*' (manufactured by via layout pattern 822*d*) to conductive structure 820*b*' (manufactured by conductive feature layout pattern 820*b*). In some embodiments, conductive structure 820*b* is electrically coupled through via 822*b*' (manufactured by via layout pattern 822*b*) to contact 610*c*' (manufactured by metal over diffusion layout pattern 610*c*). Thus, terminal B1D or contact 410*c* is electrically coupled to terminal BID' or contact 610*c*'.

Figure 9A:
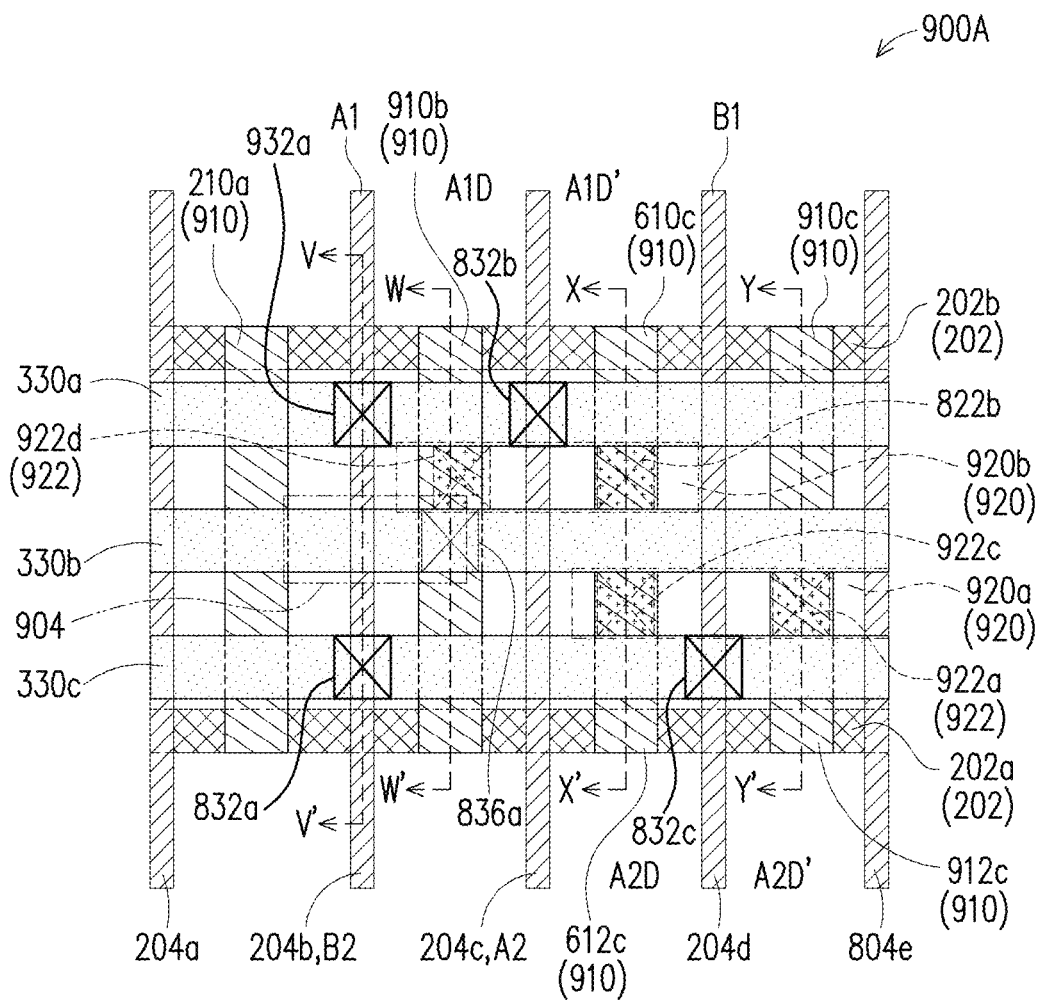
FIG. 9A is a diagram of a layout design of an integrated circuit, in accordance with some embodiments.

FIG. 9A is a diagram of a layout design 900A of an integrated circuit 900B, in accordance with some embodiments.

FIGS. 9B, 9C, 9D and 9E are cross-sectional views of integrated circuit 900B, in accordance with some embodiments.

Layout design 900A is a variation of layout design 800A (FIG. 8A). For example, layout design 900A illustrates an example where the gate (e.g., gate 904*b*1' and 904*b*2') manufactured by gate layout patterns 204*b* is not continuous, and the MU layer (e.g., a set of conductive feature layout patterns 920) extends in a single direction, but includes two portions (e.g., conductive feature layout patterns 920*a* and 920*b*).

Layout design 900A is usable to manufacture an integrated circuit similar to integrated circuit 100 (FIG. 1) or integrated circuit 400 (FIGS. 4A-4E).

In comparison with layout design 800A of FIG. 8A, layout design 900A further includes a set of cut feature layout patterns 904 and via layout pattern 932*a*. By including the set of cut feature layout patterns 904, layout design 900A is usable to manufacture an integrated circuit 900B (FIGS. 9B-9E) having gate terminal A1 not being coupled to gate terminal B2.

Set of cut feature layout patterns 904 is usable to cut gate 204*b* to form gates 904*b*1' and 904*b*2' of integrated circuit 900B (FIGS. 9B-9E). Set of cut feature patterns 904 is similar to the set of cut feature patterns 304, and detailed description is therefore omitted.

Via layout pattern 932*a* is similar to one or more layout patterns of set of via layout patterns 332, 632 and 832, and detailed description is therefore omitted. The via layout pattern 932*a* is usable to manufacture via 932*a*' in the set of vias 932' (FIGS. 9B-9E).

Via layout pattern 932*a* of layout design 900A is similar to via layout pattern 832*a*, and detailed description is therefore omitted. Via layout pattern 932*a* is between the set of conductive feature layout patterns 330 and the set of gate layout patterns 804. Via layout pattern 932*a* is between conductive feature layout pattern 330*a* and gate layout pattern 204*b* of the set of gate layout patterns 804. In some embodiments, via layout pattern 932*a* is located where layout pattern 330*a* overlaps gate layout pattern 204*b* of the set of gate layout patterns 804. In some embodiments, a center of via layout pattern 932*a* is over a center of gate layout pattern 204*b* of the set of gate layout patterns 804. In some embodiments, a center of via layout pattern 932*a* is below a center of conductive feature layout pattern 330*a*. Other configurations of via layout pattern 932*a* is within the scope of the present disclosure.

Layout design 900A is a variation of layout design 800A (FIG. 8A). In comparison with layout design 800A of FIG. 8A, layout design 900A does not include via layout pattern 836*b*. In comparison with layout design 800A of FIG. 8A, set of metal over diffusion layout patterns 910 of layout design 900A replaces set of metal over diffusion layout patterns 810, conductive feature layout patterns 920*a*, 920*b* (collectively referred to as "set of conductive feature layout patterns 920") replace a corresponding conductive feature layout pattern 820*a*, 820*b*, and via layout patterns 922*a*, 922*c*, 922*d* (collectively referred to as "set of via layout patterns 922") replace a corresponding via layout pattern 822*a*, 822*c*, 822*d*, and similar detailed description is therefore omitted.

The set of metal over diffusion layout patterns 910 is usable to manufacture a corresponding set of contacts 910' (FIGS. 9B-9E) of integrated circuit 900B. Set of metal over diffusion layout patterns 910 includes one or more of metal over diffusion layout patterns 210*a*, 910*b*, 610*c*, 612*c*, 910*c* and 912*c*. Metal over diffusion layout patterns 210*a*, 910*b*, 610*c*, 612*c*, 910*c* and 912*c* are usable to manufacture corresponding contacts 410*a*, 910*b*', 610*c*', 612*c*', 910*c*' and 912*c*' (FIGS. 9B-9E) of integrated circuit 900B. Metal over diffusion layout pattern 910*b* replaces metal over diffusion layout pattern 610*a* and metal over diffusion layout pattern 612*a* of layout design 800A, and similar detailed description is therefore omitted. Metal over diffusion layout patterns 910*c* and 912*c* replace metal over diffusion layout pattern 210*c* of layout design 800A, and similar detailed description is therefore omitted.

In some embodiments, metal over diffusion layout pattern 910*b* extends in the second direction Y from an edge of active region layout pattern 202*b* to an edge of active region layout pattern 202*a*. In some embodiments, metal over diffusion layout pattern 910*c* extends in the second direction Y from an edge of active region layout pattern 202*b* to an edge of conductive feature layout pattern 330*b*. In some embodiments, metal over diffusion layout pattern 912*c* extends in the second direction Y from an edge of active region layout pattern 202*a* to another edge of conductive feature layout pattern 330*b*. Other configurations of metal over diffusion layout patterns 210*a*, 910*b*, 610*c*, 612*c*, 910*c* and 912*c* of the set of metal over diffusion layout patterns 910 are within the scope of the present disclosure.

Set of conductive feature layout patterns 920 is similar to set of conductive feature layout patterns 320, 420, 520, 620, 720 and 820, and detailed description is therefore omitted. The set of conductive feature layout patterns 920 is usable to manufacture a corresponding set of conductive structures 920' (FIGS. 9B-9E) of integrated circuit 900B. Conductive feature layout patterns 920*a* and 920*b* are similar to corresponding conductive feature layout patterns 820*a* and 820*c*, and detailed description is therefore omitted. Conductive feature layout patterns 920*a* and 920*b* are usable to manufacture corresponding conductive structures 920*a*' and 920*b*' (FIGS. 9B-9E) of integrated circuit 900B.

Conductive feature layout pattern 920*a* extends in the first direction X, and is positioned between conductive feature layout pattern 330b and conductive feature layout pattern 330c. Conductive feature layout pattern 920a is positioned between gate layout pattern 204c and gate layout pattern 804e. Conductive feature layout pattern 920a is below at least metal over diffusion layout patterns 612c or 912c. In some embodiments, metal over diffusion layout pattern 612c or metal over diffusion layout pattern 912c overlaps conductive feature layout pattern 920a.

Conductive feature layout pattern 920b extends in the first direction X, and is positioned between conductive feature layout pattern 330a and conductive feature layout pattern 330b. Conductive feature layout pattern 920b is positioned between gate layout pattern 204b and gate layout pattern 204d. Conductive feature layout pattern 920b is below at least metal over diffusion layout pattern 910b or 610c. In some embodiments, metal over diffusion layout pattern 910b or metal over diffusion layout pattern 610c overlaps conductive feature layout pattern 920b. Other configurations of conductive feature layout patterns 920a, 920b of the set of conductive feature layout patterns 920 are within the scope of the present disclosure.

Set of via layout patterns 922 includes via layout patterns 922a, 822b 922c, 922d. Set of via layout patterns 922 is similar to set of via layout patterns 322, 522, 622 and 822 and detailed description is therefore omitted. The set of via layout patterns 922 is usable to manufacture a corresponding set of vias 922' (FIGS. 9B-9E) of integrated circuit 900B that couple the set of conductive structures 920' to the set of contacts 910'.

Via layout patterns 922a, 822b, 922c and 922d are usable to manufacture corresponding vias 922a', 822b', 922c' and 922d' (FIGS. 9B-9E) of integrated circuit 900B. Via layout patterns 922a, 922c is similar to corresponding via layout patterns 822a, 822c, and detailed description is therefore omitted. Via layout pattern 922c, 922a is between conductive feature layout pattern 920a and corresponding metal over diffusion layout patterns 612c, 912c. In some embodiments, via layout patterns 922c, 922a of the set of via layout patterns 922 is located where a corresponding layout pattern 612c, 912c of the set of metal over diffusion layout patterns 910 overlaps conductive feature layout pattern 920a of the set of conductive feature layout patterns 920. In some embodiments, a center of via layout patterns 922c, 922a of the set of via layout patterns 922 is below a center of a corresponding metal over diffusion layout pattern 612c, 912c of the set of metal over diffusion layout patterns 910. In some embodiments, a center of via layout patterns 922c, 922a of the set of via layout patterns 922 is aligned in at least the first direction X or the second direction Y with a center of a corresponding metal over diffusion layout pattern 612c, 912c of the set of metal over diffusion layout patterns 910.

Via layout patterns 922d is similar to via layout pattern 622b or 822d, and detailed description is therefore omitted. Via layout pattern 922d is between conductive feature layout pattern 920b and metal over diffusion layout pattern 910b. In some embodiments, via layout pattern 922d of the set of via layout patterns 922 is located where layout pattern 910b of the set of metal over diffusion layout patterns 910 overlaps conductive feature layout pattern 920b of the set of conductive feature layout patterns 920. In some embodiments, a center of via layout pattern 922d of the set of via layout patterns 922 is below a center of metal over diffusion layout pattern 910b of the set of metal over diffusion layout patterns 910. In some embodiments, a center of via layout pattern 922d of the set of via layout patterns 922 is aligned in at least the first direction X or the second direction Y with a center of metal over diffusion layout pattern 910b of the set of metal over diffusion layout patterns 910. Other configurations of via layout patterns 922a, 922c, 922d of the set of via layout patterns 922 are within the scope of the present disclosure.

Figure 9B:
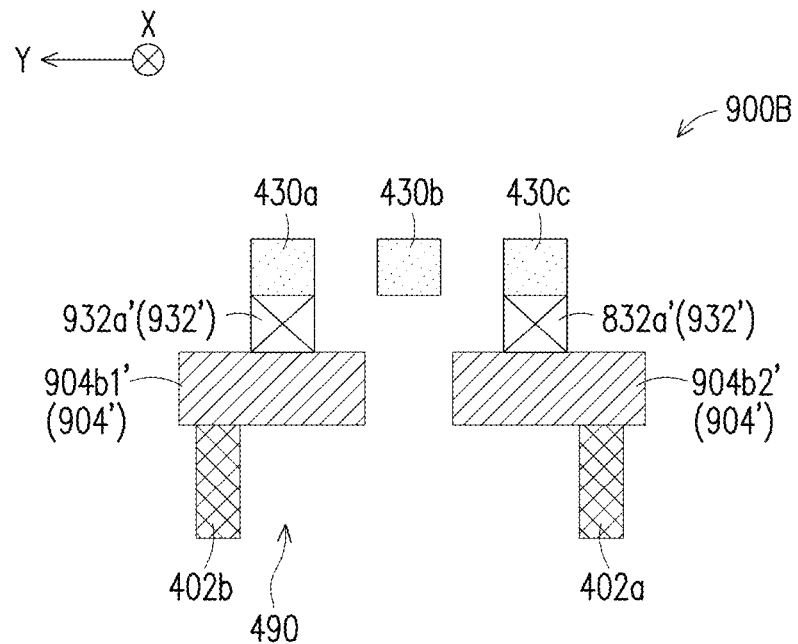
FIGS. 9B, 9C, 9D and 9E are cross-sectional views of an integrated circuit, in accordance with some embodiments.
Figure 9C:
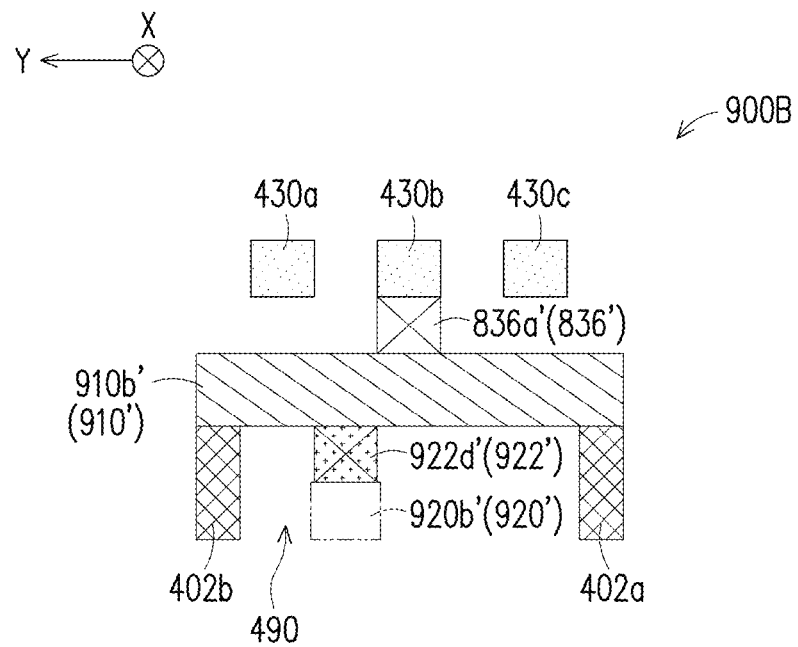
Figure 9D:
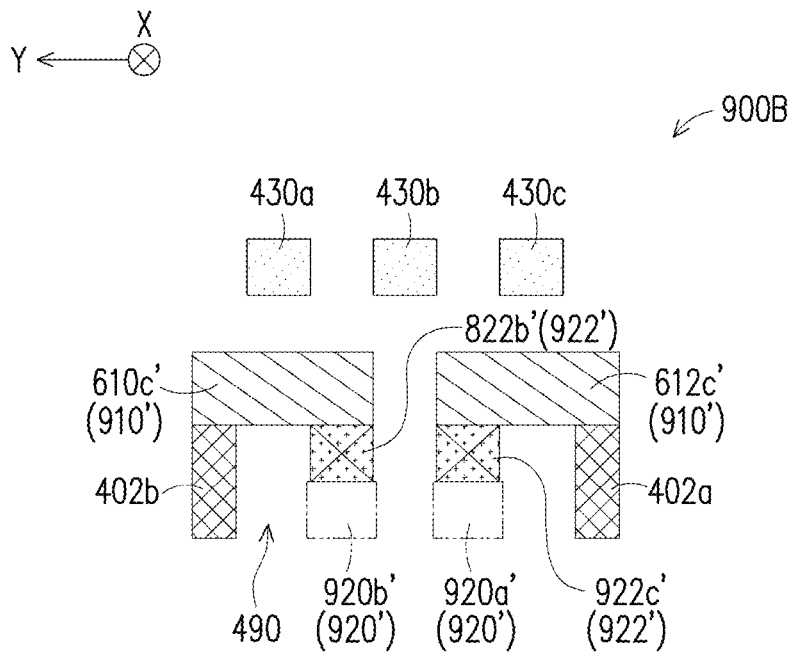
Figure 9E:
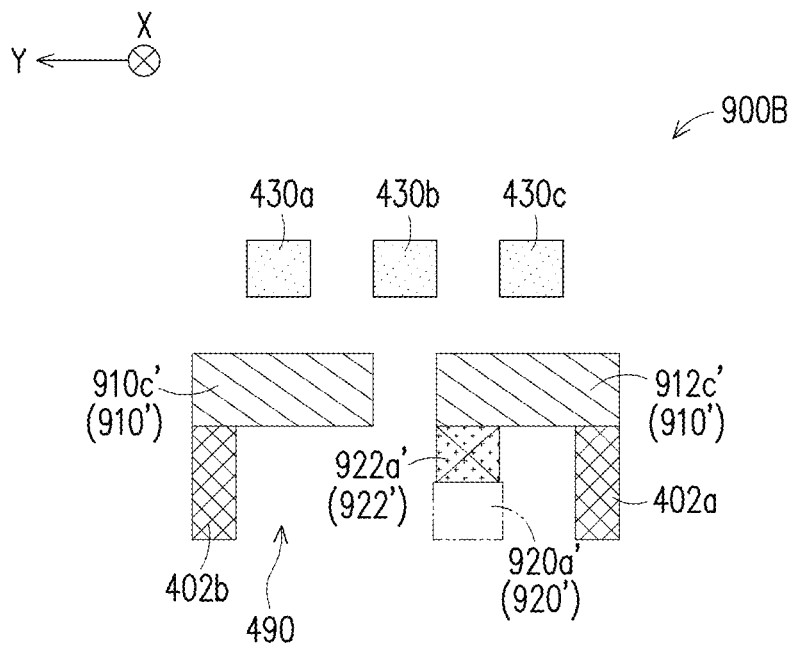

FIG. 9B is a cross-sectional view of integrated circuit 900B corresponding to layout design 900A as intersected by plane V-V', FIG. 9C is a cross-sectional view of integrated circuit 900B corresponding to layout design 900A as intersected by plane W-W', FIG. 9D is a cross-sectional view of integrated circuit 900B corresponding to layout design 900A as intersected by plane X-X', and FIG. 9E is a cross-sectional view of integrated circuit 900B corresponding to layout design 900A as intersected by plane Y-Y', in accordance with some embodiments. Structural relationships including alignment, lengths and widths, as well as configurations of integrated circuit 900B are similar to the structural relationships and configurations of layout design 900A of FIG. 9A, and will not be described in FIGS. 9B-9E for brevity.

Integrated circuit 900B is manufactured by layout design 900A. In some embodiments, integrated circuit 900B is similar to integrated circuit 400, 600B, 700B or 800B, and similar detailed description is therefore omitted for brevity.

Integrated circuit 900B has a 4 poly pitch width in the first direction X.

Integrated circuit 900B includes set of active regions 402, gates 404a, 404d, 904b1', 904b2', 604c and 804e' (collectively referred to as a set of gates 904'), contacts 410a, 910b', 610c', 612c', 910c' and 912c' (collectively referred to as a set of contacts 910'), set of conductive structures 430, conductive structures 920a', 920b' (collectively referred to as a set of conductive structures 920'), vias 922a', 822b', 922c', 922d' (collectively referred to as a set of vias 922'), vias 832a', 832b', 832c', 932a' (collectively referred to as a set of vias 932') and via 836a'.

In comparison with integrated circuit 800B (FIGS. 8B-8G), gates 904b1' and 904b2' replace gate 604b, contacts 910b' replaces contacts 610a' and 612a', contacts 910c' and 912c' replace contact 410c, conductive structures 920a' and 920b' replace corresponding conductive structures 820a' and 820b', vias 922a', 922c' and 922d' replace corresponding vias 822a', 822c' and 822d', and similar detailed description is therefore omitted for brevity.

In comparison with integrated circuit 800B (FIGS. 8B-8G), integrated circuit 900B further includes via 932a'. Via 932a' is similar to via 832a', and similar detailed description is therefore omitted for brevity. Via 932a' electrically couples conductive structures 430a to gate 904b1'.

In comparison with integrated circuit 800B (FIGS. 8B-8G), integrated circuit 900B does not include via 836b'.

The set of vias 932' electrically couple the set of conductive structures 430 to the set of gates 904'. The set of vias 922' electrically couple the set of conductive structures 920' to the set of contacts 910'.

In some embodiments, terminal A1 corresponds to gate 904b1', terminal B2 corresponds to gate 904b2' and terminal A2 corresponds to gate 604c. In these embodiments, gate 904b1' (manufactured by gate layout pattern 204b of layout design 900A) is not directly coupled to gate 904b2' (manufactured by gate layout pattern 204b of layout design 900A) because of cut feature layout pattern 904 of layout design 900A. In other words, in some embodiments, cut feature layout pattern 904 of layout design 900A is used to identify a removed portion of gate 604b (shown in FIGS. 8F-8G) thereby forming discontinuous gates 904b1' and 904b2'.

In some embodiments, terminal A1 corresponds to gate 904b1' and terminal A2 corresponds to gate 604c. In these embodiments, gate 904b1' (manufactured by gate layout pattern 204b of layout design 900A) of integrated circuit 900B is electrically coupled to gate 604c (manufactured by gate layout pattern 204c of layout design 900A). For example, in some embodiments, gate 904b1' (manufactured by gate layout pattern 204b of layout design 900A) is electrically connected through via 932a' (manufactured by via layout pattern 932a) to conductive structure 430a (manufactured by conductive feature layout pattern 330a), and conductive structure 430a is electrically coupled through via 832b' (manufactured by via layout pattern 832b) to gate 604c (manufactured by gate layout pattern 204c of layout design 900A).

In some embodiments, terminal B1 corresponds to gate 404d and terminal B2 corresponds to gate 904b2'. In these embodiments, gate 404d (manufactured by gate layout pattern 204d of layout design 900A) is electrically coupled to gate 904b2' (manufactured by gate layout pattern 204b of layout design 900A). For example, in some embodiments, gate 404d (manufactured by gate layout pattern 204d of layout design 900A) is electrically connected through via 832c' (manufactured by via layout pattern 832c) to conductive structure 430c (manufactured by conductive feature layout pattern 330c), and conductive structure 430c is electrically coupled through via 832a' (manufactured by via layout pattern 832a) to gate 904b2' (manufactured by gate layout pattern 204b of layout design 900A).

In some embodiments, terminal A2D corresponds to contact 612c', and terminal A2D' corresponds to contact 912c'. In these embodiments, terminal A2D or contact 612c' (manufactured by metal over diffusion layout pattern 612c of layout design 900A) is electrically coupled to terminal A2D' or contact 912c' (manufactured by metal over diffusion layout pattern 912c of layout design 900A). For example, in some embodiments, contact 612c' (manufactured by metal over diffusion layout pattern 612c) is electrically connected through via 922c' (manufactured by via layout pattern 922c) to conductive structure 920a' (manufactured by conductive feature layout pattern 920a). In some embodiments, conductive structure 920a' (manufactured by conductive feature layout pattern 920a) is electrically coupled through via 922a' (manufactured by via layout pattern 922a) to contact 912c' (manufactured by metal over diffusion layout pattern 912c of layout design 900A). Thus, terminal A2D or contact 612c' is electrically coupled to terminal A2D' or contact 912c'.

In some embodiments, terminal A1D corresponds to contact 910b', and terminal A1D' corresponds to contact 610c'. In these embodiments, terminal A1D or contact 910b' (manufactured by metal over diffusion layout pattern 910b of layout design 900A) is electrically coupled to terminal A1D' or contact 610c' (manufactured by metal over diffusion layout pattern 610c of layout design 900A). For example, in some embodiments, contact 910b' (manufactured by metal over diffusion layout pattern 910b) is electrically connected through via 922d' (manufactured by via layout pattern 922d) to conductive structure 920b' (manufactured by conductive feature layout pattern 920b of layout design 900A). In some embodiments, conductive structure 920b' is electrically coupled through via 822b' (manufactured by via layout pattern 822b) to contact 610c' (manufactured by metal over diffusion layout pattern 610c). Thus, terminal A1D or contact 910b' is electrically coupled to terminal A1D' or contact 610c'.

In some embodiments, the set of conductive feature layout patterns 320, 520, 620, 720, 820 and 920 are located below the set of gate layout patterns 304 and the metal-0 (M0) level of layout design 300 & 500A-900A.

In some embodiments, by using the set of conductive feature layout patterns 320, 520, 620, 720, 820 and 920, one M0 track is reduced in the set of conductive feature layout patterns 330 of FIGS. 3 & 5A-9A, yielding a standard cell with a smaller height and smaller area compared with other approaches. In some embodiments, by using the set of conductive feature layout patterns 320, 520, 620, 720, 820 and 920, the width of one or more layout patterns in the set of conductive feature layout patterns 330 of FIGS. 3 & 5A-9A is increased since one M0 track is reduced, yielding a standard cell with better current resistance (IR) and Electromigration (EM) compared with other approaches.

In some embodiments, by utilizing the set of conductive feature layout patterns 320, 520, 620, 720, 820 and 920 of the present disclosure, the gate density of the set of gate layout patterns of a standard cell is increased by up to 30% compared with other approaches. In some embodiments, by utilizing the set of conductive feature layout patterns 320, 520, 620, 720, 820 and 920 of the present disclosure, layout design 200-300 and 500A-900A and integrated circuits 400 and 500B-900B of FIGS. 2-3 & 5A-9E offer more routing flexibility and increases routing resources compared to other approaches.

FIG. 10 is a flowchart of a method 1000 of forming an integrated circuit in accordance with some embodiments. It is understood that additional operations may be performed before, during, and/or after the method 1000 depicted in FIG. 10, and that some other processes may only be briefly described herein. In some embodiments, the method 1000 is usable to form integrated circuits, such as integrated circuit 100 (FIG. 1), integrated circuit 400 (FIGS. 4A-4E), integrated circuit 500B, integrated circuit 600B, integrated circuit 700B, integrated circuit 800B or integrated circuit 900B.

In operation 1002 of method 1000, a layout design 300 (FIG. 3) of an integrated circuit (e.g., integrated circuit 100 (FIG. 1) or integrated circuit 400 (FIGS. 4A-4E)) is generated. Operation 1002 is performed by a processing device (e.g., processor 1202 (FIG. 12)) configured to execute instructions for generating a layout design (e.g., layout design 200 or 300). In some embodiments, layout design 200 or 300 is a graphic database system (GDSII) file format. In some embodiments, operation 1002 of method 1000 is utilized to generate one or more of layout design 200 (FIG. 2), layout design 300 (FIG. 3), layout design 500A (FIG. 5A), layout design 600A (FIG. 6A), layout design 700A (FIG. 7A), layout design 800A (FIG. 8A) or layout design 900A (FIG. 9A).

Method 1000 continues with operation 1004, where the integrated circuit (e.g., integrated circuit 100 (FIG. 1) or integrated circuit 400 (FIGS. 4A-4E)) is manufactured based on the layout design 300 (FIG. 3). In some embodiments, operation 1004 includes manufacturing integrated circuit 500B, 600B, 700B, 800B or 900B based on corresponding layout design 500A, 600A, 700A, 800A or 900A. In some embodiments, integrated circuit 100 (FIG. 1) or integrated circuit 400 (FIGS. 4A-4E) includes gate 404b1, 404b2, 404c1 or 404c2. In some embodiments, operation 1004 comprises manufacturing at least one mask based on one or more of layout design 200 (FIG. 2), layout design 300 (FIG. 3), layout design 500A (FIG. 5A), layout design 600A (FIG. 6A), layout design 700A (FIG. 7A), layout design 800A (FIG. 8A) or layout design 900A (FIG. 9A), and manufacturing the integrated circuit (e.g., integrated circuit 100 (FIG. 1), integrated circuit 400 (FIGS. 4A-4E), or integrated circuit 500B, 600B, 700B, 800B or 900B) based on the at least one mask. In some embodiments, operation 1004 of method 1000 is utilized to manufacture integrated circuit (e.g., integrated circuit 100 (FIG. 1), integrated circuit 400 (FIGS. 4A-4E), or integrated circuit 500B, 600B, 700B, 800B or 900B) based on one or more of layout design 200 (FIG. 2), layout design 300 (FIG. 3), layout design 500A (FIG. 5A), layout design 600A (FIG. 6A), layout design 700A (FIG. 7A), layout design 800A (FIG. 8A) or layout design 900A (FIG. 9A).

Method 1000 continues with operation 1006, where a portion of a gate (e.g., gate A1, A2, B1 or B2) is removed thereby forming a first gate structure (e.g., gate 404b1 or 404c1) and a second gate structure (e.g., gate 404b2 or 404c2) of integrated circuit 100, 400, 500B, 600B, 700B, 800B or 900B. In some embodiments, the portion of the gate (e.g., gate A1, A2, B1 or B2) that is removed in operation 1006 is identified in layout designs 300, 500A and 900A by cut feature layout pattern 304a or 304b (FIGS. 3 and 5A) or cut feature layout pattern 904 (FIG. 9A). In some embodiments, operation 1006 of method 1000 is referred to as a cut-poly (CPO) process. In some embodiments, operation 1006 results in the formation of integrated circuit 100 (FIG. 1), 400 (FIGS. 4A-4E), 500B, 600B, 700B, 800B or 900B. In some embodiments, the removed gate portion of gates 404b1 and 404b2 and gates 404c1 and 404c2 is referred to as a cut region.

In some embodiments, operation 1006 is performed by a removal process. In some embodiments, the removal process includes one or more etching processes suitable to remove a portion of gate (e.g., gate A1, A2, B1 or B2). In some embodiments, the etching process of operation 1006 includes identifying a portion of the gate (e.g., gate A1, A2, B1 or B2) that is to be removed, and etching the portion of the gate (e.g., gate A1, A2, B1 or B2) that is to be removed.

In some embodiments, a mask is used to specify portions of the gate (e.g., gate A1, A2, B1 or B2) that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like.

In some embodiments, method 1000 is utilized with layout designs other than layout design 200 or 300. For example, in some embodiments, layout design 200 (FIG. 2) or 300 (FIG. 3) of operation 1004 or 1006 is replaced with one or more of layout design 500A (FIG. 5A), layout design 600A (FIG. 6A), layout design 700A (FIG. 7A), layout design 800A (FIG. 8A) or layout design 900A (FIG. 9A).

In some embodiments, operation 1006 is not performed. For example, in some embodiments, operation 1006 is not performed to manufacture integrated circuit 100 or 400. In some embodiments, method 1000 is performed to manufacture an integrated circuit, 600B, 700B or 800B based on one or more of layout designs 600A, 700A or 800A, and operation 1006 is not performed on the manufactured integrated circuit.

Figure 11A:
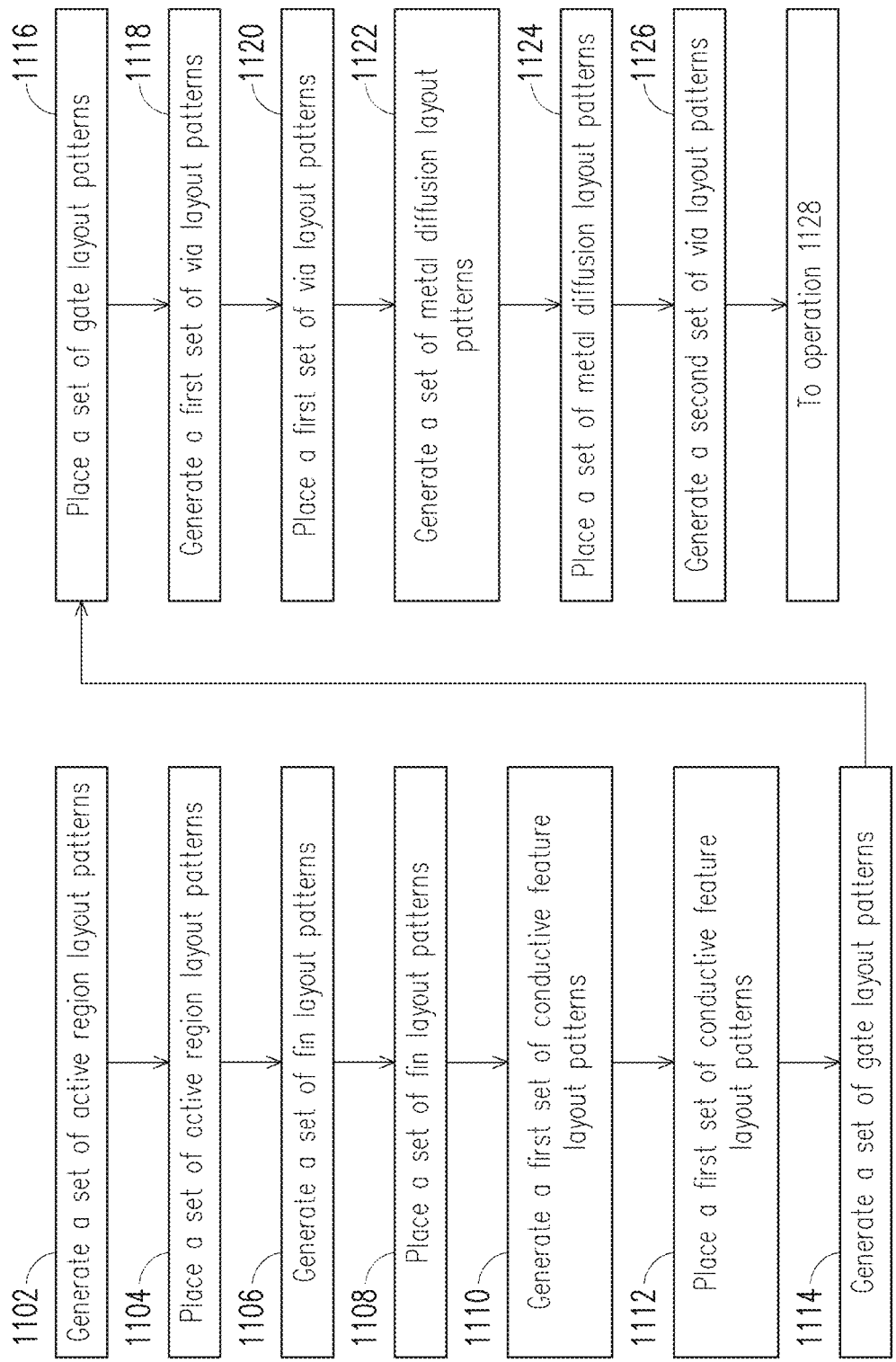
FIGS. 11A and 11B are a flowchart of a method of generating a layout design of an integrated circuit, in accordance with some embodiments.
Figure 11B:
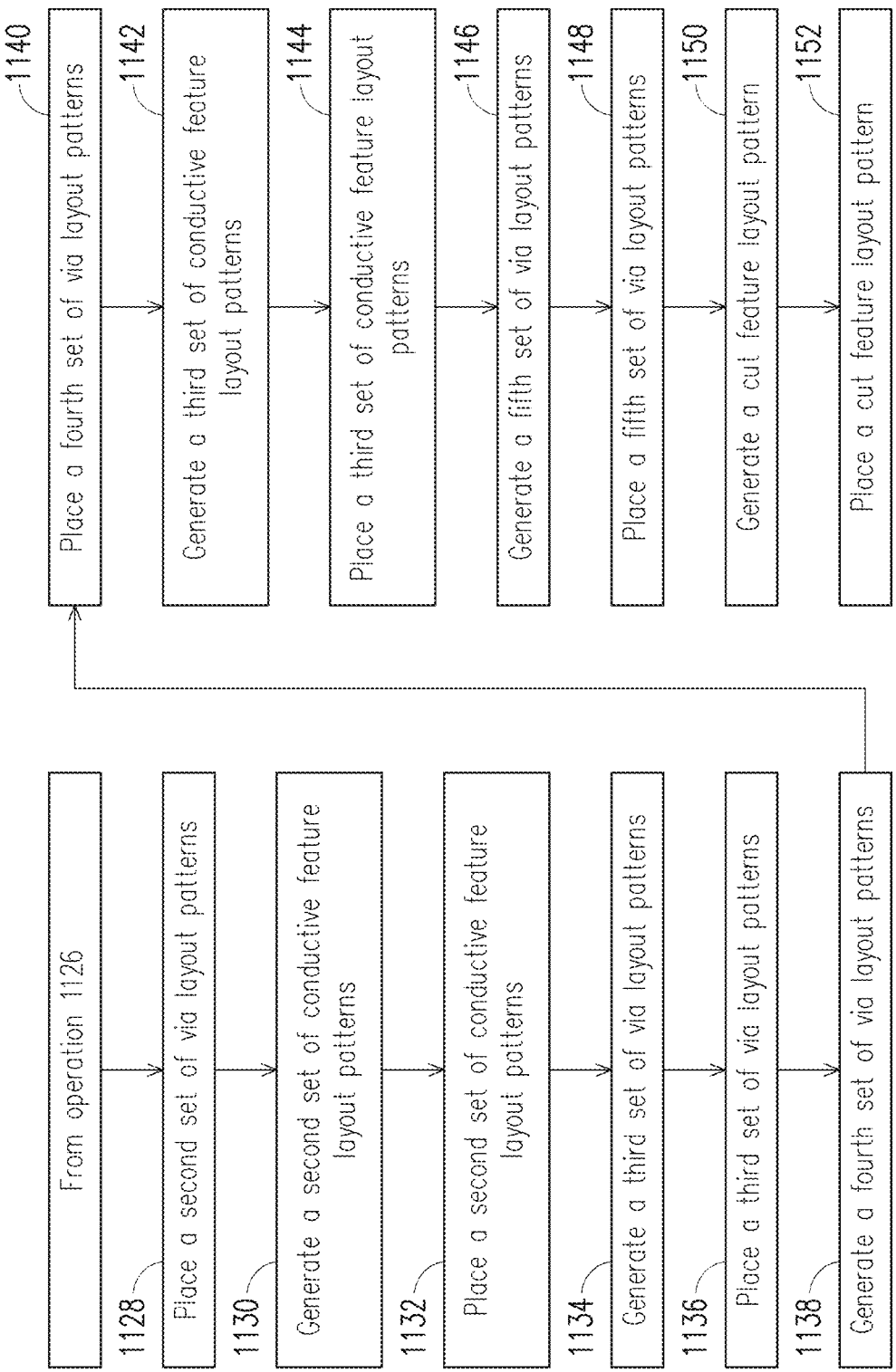

FIGS. 11A-11B is a flowchart of a method 1100 of generating a layout design of an integrated circuit in accordance with some embodiments. It is understood that additional operations may be performed before, during, and/or after the method 1100 depicted in FIGS. 11A-11B, and that some other processes may only be briefly described herein. In some embodiments, the method 1100 is usable to generate one or more layout designs, such as layout design 200 (FIG. 2), layout design 300 (FIG. 3), layout design 500A (FIG. 5A), layout design 600A (FIG. 6A), layout design 700A (FIG. 7A), layout design 800A (FIG. 8A) or layout design 900A (FIG. 9A) of an integrated circuit, such as integrated circuit 100 (FIG. 1), integrated circuit 400 (FIGS. 4A-4E) or integrated circuit 500B, 600B, 700B, 800B or 900B. In some embodiments, the method 1100 is usable to form integrated circuits having similar structural relationships as one or more of layout designs 200-300 or 500A-900A (FIG. 2-3 or 5A-9A). In some embodiments, method 1100 is performed by a processing device (e.g., processor 1202 (FIG. 12)) configured to execute instructions for generating layout design 200 (FIG. 2), layout design 300 (FIG. 3), layout design 500A (FIG. 5A), layout design 600A (FIG. 6A), layout design 700A (FIG. 7A), layout design 800A (FIG. 8A) or layout design 900A (FIG. 9A).

In operation 1102 of method 1100, a set of active region layout patterns is generated. In some embodiments, the set of active region layout patterns of method 1100 includes one or more patterns of the set of active region layout patterns 202 of FIGS. 2-3 and 5A-9A, and detailed description of these layout patterns is therefore omitted.

In operation 1104 of method 1100, the set of active region layout patterns is placed on a first layout level of layout design 200, 300 or 500A-900A. In some embodiments, the first layout level corresponds to the OD layout level.

In operation 1106 of method 1100, a set of fin layout patterns is generated. In some embodiments, the set of fin layout patterns of method 1100 includes one or more patterns of the set of fin layout patterns 316 of FIG. 3, and detailed description of these layout patterns is therefore omitted.

In operation 1108 of method 1100, the set of fin layout patterns is placed on a second layout level of layout design 200, 300 or 500A-900A. In some embodiments, the second layout level corresponds to the FIN layout level. In some embodiments, the second layout level is the same as the first layout level. In some embodiments, the second layout level is different from the first layout level. In some embodiments, the second layout level is above the first layout level. In some embodiments, the second layout level is below the first layout level.

In operation 1110 of method 1100, a first set of conductive feature layout patterns is generated. In some embodiments, the first set of conductive feature layout patterns of method 1100 includes one or more patterns of the set of conductive feature layout patterns 320, 520, 620, 720, 820 or 920 of FIGS. 3 & 5A-9A, and detailed description of these layout patterns is therefore omitted.

In operation 1112 of method 1100, the first set of conductive feature layout patterns is placed on a first portion of the first layout level of layout design 200, 300 or 500A-900A. In some embodiments, the first portion of the first layout level corresponds to the MU layout level.

In operation 1114 of method 1100, a set of gate layout patterns is generated. In some embodiments, the set of gate layout patterns of method 1100 includes one or more patterns of the set of gate layout patterns 205 of FIG. 2, set of gate layout patterns 206 of FIG. 2, set of gate layout patterns 204 of FIGS. 3 & 5A-7A, and set of gate layout patterns 804 of FIGS. 8A-9A, and detailed description of these layout patterns is therefore omitted.

In operation 1116 of method 1100, the set of gate layout patterns is placed on a third layout level of layout design 200, 300 or 500A-900A. In some embodiments, the third layout level corresponds to the Poly layout level or MD layout level. In some embodiments, the third layout level is different from the first layout level and the second layout level. In some embodiments, the third layout level is above one or more of the first or second layout level. In some embodiments, the third layout level is below one or more of the first or second layout level.

In operation 1118 of method 1100, a first set of via layout patterns is generated. In some embodiments, the first set of via layout patterns of method 1100 includes one or more patterns of the set of via layout patterns 322, 522, 622, 822, 922 of FIGS. 3 & 5A-9A, and detailed description of these layout patterns is therefore omitted.

In operation 1120 of method 1100, the first set of via layout patterns is placed between the first layout level and the third layout level of layout design 200, 300 or 500A-900A. In some embodiments, the first set of via layout patterns is placed on the VU layout level of layout design 200, 300 or 500A-900A. In some embodiments, the first set of via layout patterns is placed between the set of gate layout patterns and the first set of conductive feature layout patterns.

In operation 1122 of method 1100, a set of metal over diffusion layout patterns is generated. In some embodiments, the set of metal over diffusion layout patterns of method 1100 includes one or more layout patterns of the set of metal over diffusion layout patterns 210, 610, 612, 810 or 910 of FIGS. 2-3 & 5A-9A, and detailed description of these layout patterns is therefore omitted.

In operation 1124 of method 1100, the set of metal over diffusion layout patterns is placed on the third layout level of layout design 200, 300 or 500A-900A. In some embodiments, the third layout level corresponds to the MD layout level.

In operation 1126 of method 1100, a second set of via layout patterns is generated. In some embodiments, the second set of via layout patterns of method 1100 includes one or more patterns of the set of via layout patterns 322, 522, 622, 822, 922 of FIGS. 3 & 5A-9A, and detailed description of these layout patterns is therefore omitted.

In operation 1128 of method 1100, the second set of via layout patterns is placed between the third layout level and the first layout level of layout design 200, 300 or 500A-900A. In some embodiments, the second set of via layout patterns is placed on the VU layout level of layout design 200, 300 or 500A-900A. In some embodiments, the second set of via layout patterns is placed between the set of metal over diffusion layout patterns and the first set of conductive feature layout patterns.

In operation 1130 of method 1100, a second set of conductive feature layout patterns is generated. In some embodiments, the second set of conductive feature layout patterns of method 1100 includes one or more patterns of the set of conductive feature layout patterns 330 of FIGS. 3 & 5A-9A, or conductive feature layout pattern 630*b*, 630*b*' of FIGS. 3 & 5A-9A, and detailed description of these layout patterns is therefore omitted.

In operation 1132 of method 1100, the second set of conductive feature layout patterns is placed on a fourth layout level of layout design 200, 300 or 500A-900A. In some embodiments, the fourth layout level is different from the first layout level, the second layout level and the third layout level. In some embodiments, the fourth layout level is above one or more of the first, second or third layout level. In some embodiments, the fourth layout level is below one or more of the first, second or third layout level. In some embodiments, the fourth layout level corresponds to the M0 layout level.

In operation 1134 of method 1100, a third set of via layout patterns is generated. In some embodiments, the third set of via layout patterns of method 1100 includes one or more patterns of the set of via layout patterns 332, 632, 832 or via layout pattern 932*a* of FIGS. 3 & 5A-9A, and detailed description of these layout patterns is therefore omitted.

In operation 1136 of method 1100, the third set of via layout patterns is placed between the third layout level and the fourth layout level of layout design 200, 300 or 500A-900A. In some embodiments, the third set of via layout patterns is placed on the VG layout level of layout design 200, 300 or 500A-900A. In some embodiments, the third set of via layout patterns is placed between the set of gate layout patterns and the second set of conductive feature layout patterns.

In operation 1138 of method 1100, a fourth set of via layout patterns is generated. In some embodiments, the fourth set of via layout patterns of method 1100 includes one or more patterns of the set of via layout patterns 636, 836 of FIGS. 6A-9A, and detailed description of these layout patterns is therefore omitted.

In operation 1140 of method 1100, the fourth set of via layout patterns is placed between the third layout level and the fourth layout level of layout design 200, 300 or 500A-900A. In some embodiments, the fourth set of via layout patterns is placed on the VD layout level of layout design 200, 300 or 500A-900A. In some embodiments, the fourth set of via layout patterns is placed between the set of metal over diffusion layout patterns and the second set of conductive feature layout patterns.

In operation 1142 of method 1100, a third set of conductive feature layout patterns is generated. In some embodiments, the third set of conductive feature layout patterns of method 1100 includes one or more patterns of the set of conductive feature layout patterns 340, 640 of FIGS. 3 & 5A-7A, and detailed description of these layout patterns is therefore omitted.

In operation 1144 of method 1100, the third set of conductive feature layout patterns is placed on a fifth layout level of layout design 200, 300 or 500A-700A. In some embodiments, the fifth layout level is different from the first layout level, the second layout level, the third layout level, and the fourth layout level. In some embodiments, the fifth layout level is above one or more of the first, second, third or fourth layout level. In some embodiments, the fifth layout level is below one or more of the first, second, third or fourth layout level. In some embodiments, the fifth layout level corresponds to the M1 layout level.

In operation 1146 of method 1100, a fifth set of via layout patterns is generated. In some embodiments, the fifth set of via layout patterns of method 1100 includes one or more patterns of the set of via layout patterns 342, 642 of FIGS. 3 & 5A-7A, and detailed description of these layout patterns is therefore omitted.

In operation 1148 of method 1100, the fifth set of via layout patterns is placed between the fourth layout level and the fifth layout level of layout design 200, 300 or 500A-700A. In some embodiments, the fifth set of via layout patterns is placed on the V0 layout level of layout design 200, 300 or 500A-700A. In some embodiments, the fifth set of via layout patterns is placed between the first set of conductive layout patterns and the second set of conductive feature layout patterns.

In operation 1150 of method 1100, a cut feature layout pattern is generated. In some embodiments, the cut feature layout pattern of method 1100 includes cut feature layout pattern 304*a* or 304*b* (FIGS. 3 and 5A) or cut feature layout pattern 904 (FIG. 9A), and detailed description of these layout patterns is therefore omitted.

In operation 1152 of method 1100, the cut feature layout pattern is placed on one or more of the third, fourth or fifth layout level of layout design 200, 300 or 500A-900A.

In some embodiments, one or more of the operations of method 1100 is not performed. One or more of the operations of methods 1000-1100 is performed by a processing device configured to execute instructions for manufacturing an integrated circuit, such as integrated circuit 100, 400, 500B, 600B, 700B, 800B or 900B. In some embodiments, one or more operations of methods 1000-1100 is performed using a same processing device as that used in a different one or more operations of methods 1000-1100. In some embodiments, a different processing device is used to perform one or more operations of methods 1000-1100 from that used to perform a different one or more operations of methods 1000-1100.

Figure 12:
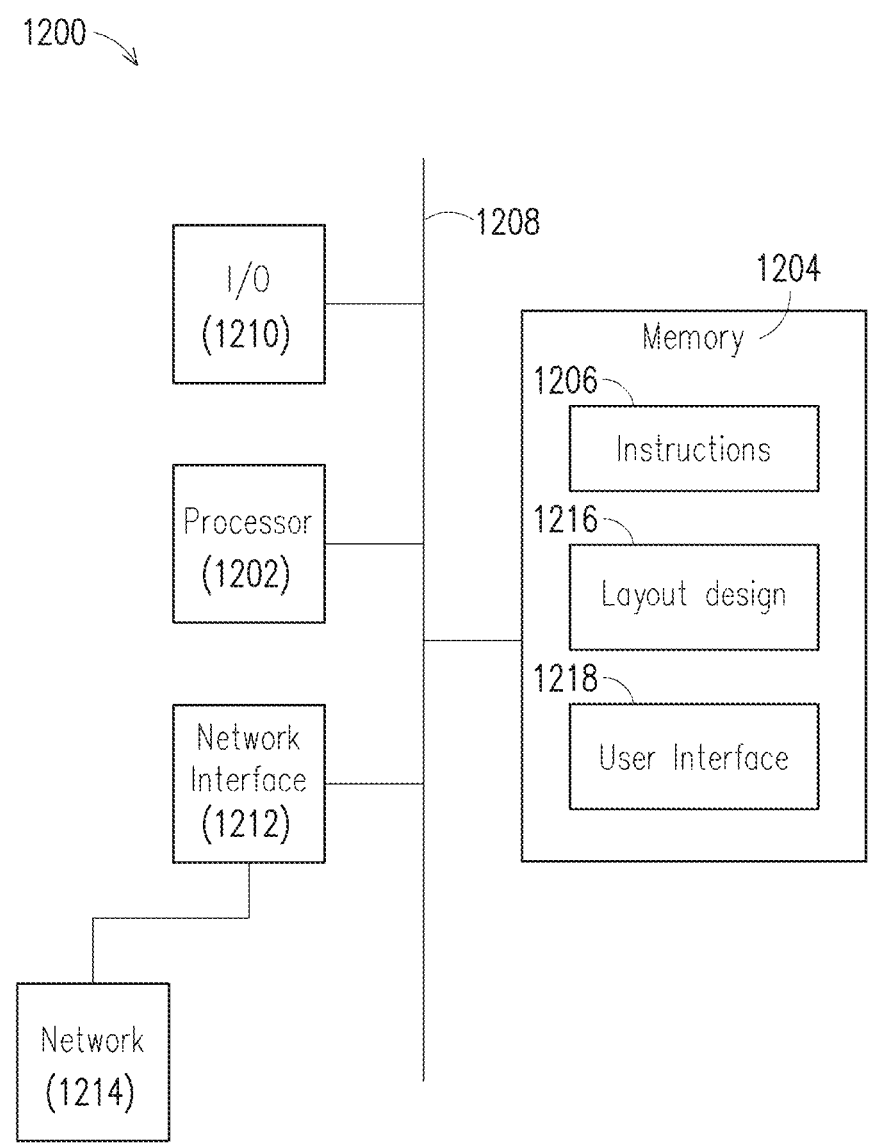
FIG. 12 is a block diagram of a system of designing an IC layout design, in accordance with some embodiments.

FIG. 12 is a schematic view of a system 1200 for designing an IC layout design in accordance with some embodiments. In some embodiments, system 1200 generates or places one or more IC layout designs described herein. System 1200 includes a hardware processor 1202 and a non-transitory, computer readable storage medium 1204 encoded, i.e., storing, with the computer program code 1206, i.e., a set of executable instructions. Computer readable storage medium 1204 is configured for interfacing with manufacturing machines for producing the integrated circuit. The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described in method 1000 or 1100.

In some embodiments, the processor 1202 is a central processing unit (CPU), a multi-processor, a distributed processing system, an application specific integrated circuit (ASIC), and/or a suitable processing unit.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform method 1000 or 1100. In some embodiments, the storage medium 1204 also stores information needed for performing method 1000 or 1100 as well as information generated during performing method 1000 or 1100, such as layout design 1216 and user interface 1218, and/or a set of executable instructions to perform the operation of method 1000 or 1100. In some embodiments, layout design 1216 comprises one or more of layout designs 200-300 or 500A-900A. In some embodiments, layout design 1216 comprises one or more layout patterns of layout designs 200-300 or 500A-900A.

In some embodiments, the storage medium 1204 stores instructions (e.g., computer program code 1206) for interfacing with manufacturing machines. The instructions (e.g., computer program code 1206) enable processor 1202 to generate manufacturing instructions readable by the manufacturing machines to effectively implement method 1000 or 1100 during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interface such as ETHERNET, USB, or IEEE-1394. In some embodiments, method 1000 or 1100 is implemented in two or more systems 1200, and information such as layout design, and user interface are exchanged between different systems 1200 by network 1214.

System 1200 is configured to receive information related to a layout design through I/O interface 1210 or network interface 1212. The information is transferred to processor 1202 by bus 1208 to determine a layout design for producing an integrated circuit, e.g., integrated circuit 100, 400, 500B, 600B, 700B, 800B or 900B. The layout design is then stored in computer readable medium 1204 as layout design 1216. System 1200 is configured to receive information related to a user interface through I/O interface 1210 or network interface 1212. The information is stored in computer readable medium 1204 as user interface 1218.

In some embodiments, method 1000 or 1100 is implemented as a standalone software application for execution by a processor. In some embodiments, method 1000 or 1100 is implemented as a software application that is a part of an additional software application. In some embodiments, method 1000 or 1100 is implemented as a plug-in to a software application. In some embodiments, method 1000 or 1100 is implemented as a software application that is a portion of an EDA tool. In some embodiments, method 1000 or 1100 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1000 or 1100 is implemented by a manufacturing device to manufacture an integrated circuit (e.g., integrated circuit 100, 400, 500B, 600B, 700B, 800B or 900B) using a set of masks manufactured based on one or more layout designs (e.g., layout design 200-300 or 500A-900A) generated by system 1200. System 1200 of FIG. 12 generates layout designs (e.g., layout design 200-300 or 500A-900A) of an integrated circuit (e.g, integrated circuit 100, 400, 500B, 600B, 700B, 800B or 900B) that are smaller than other approaches.

One aspect of this description relates to an integrated circuit including a set of active regions in a substrate, a first set of conductive structures, a shallow trench isolation (STI) region, a set of gates and a first set of vias. The set of active regions extending in a first direction, being located on a first level, and being separated from one another in a second direction different from the first direction. The first set of conductive structures extending in at least the first direction or the second direction, being located on the first level, and being between the set of active regions. The STI region extending in at least the first direction or the second direction, being located on at least the first level, and being between the set of active regions and the first set of conductive structures. The set of gates extending in the second direction, overlapping at least the first set of conductive structures and being located on a second level different from the first level, each of the gates of the set of gates being separated from an adjacent gate of the set of gates in the first direction by a first pitch. The first set of vias coupling the first set of conductive structures to the set of gates, the first set of vias being between the first set of conductive structures and the set of gates, and a via of the first set of vias being located where a gate of the set of gates overlaps a conductive structure of the first set of conductive structures. In some embodiments, a set of contacts extending in the second direction, overlapping the first set of conductive structures, and being located on the second level, each of the contacts of the set of contacts being separated from an adjacent contact of the set of contacts in the first direction; and a second set of vias coupling the first set of conductive structures to the set of contacts, the second set of vias being between the first set of conductive structures and the set of contacts, and a via of the second set of vias being located where a contact of the set of contacts overlaps the conductive structure of the first set of conductive structures. In some embodiments, a second set of conductive structures extending in the first direction, being between the set of active regions, overlapping at least the set of gates, and being located on a third level different from the first level and the second level, and each of the conductive structures of the second set of conductive structures being separated from an adjacent conductive structure of the second set of conductive structures in the second direction; and a third set of vias coupling the second set of conductive structures to the set of contacts, the third set of vias being between the second set of conductive structures and the set of contacts, and a via of the third set of vias being located where a conductive structure of the second set of conductive structures overlaps another contact of the set of contacts. In some embodiments, a second set of conductive structures extending in the first direction, being between the set of active regions, overlapping at least the set of gates, and being located on a third level different from the first level and the second level, and each of the conductive structures of the second set of conductive structures being separated from an adjacent conductive structure of the second set of conductive structures in the second direction; and a third set of vias coupling the second set of conductive structures to the set of gates, the third set of vias being between the second set of conductive structures and the set of gates, and a via of the third set of vias being located where a conductive structure of the second set of conductive structures overlaps another gate of the set of gates. In some embodiments, a third set of conductive structures extending in the second direction, being between the set of gates, overlapping at least the first set of conductive structures, and being located on a fourth level different from the first level, the second level and the third level, and each of the structures of the fourth set of conductive structures being separated from an adjacent structure of the fourth set of conductive structures in the first direction; and a fourth set of vias coupling the third set of conductive structures to the second set of conductive structures, the fourth set of vias being between the third set of conductive structures and the second set of conductive structures, and a via of the fourth set of vias being located where a structure of the third set of conductive structures overlaps another structure of the second set of conductive structures. In some embodiments, a set of fins extending in the first direction and below the set of gates, each of the fins being separated from an adjacent fin of the set of fins in the second direction by a fin pitch. In some embodiments, a top surface of the conductive structure of the first set of conductive structures is below a top surface of an active region of the set of active regions or a top surface of a fin of the set of fins. In some embodiments, the integrated circuit comprises a transmission gate.

Another aspect of this description relates to an integrated circuit. The integrated circuit includes a set of active regions, a first set of conductive structures, a set of gates, a first set of vias and a set of contacts. The set of active regions are in a substrate. In some embodiments, the set of active regions extend in a first direction, is located on a first level, and is separated from one another in a second direction different from the first direction. In some embodiments, the first set of conductive structures extends in at least the first direction or the second direction, is located on the first level, and is between the set of active regions. In some embodiments, the set of gates extends in the second direction, overlaps at least the first set of conductive structures and is located on a second level different from the first level. In some embodiments, each of the gates of the set of gates is separated from an adjacent gate of the set of gates in the first direction by a first pitch. In some embodiments, the first set of vias couples the first set of conductive structures to the set of gates. In some embodiments, the first set of vias is between the first set of conductive structures and the set of gates, and a via of the first set of vias being located where a first gate of the set of gates overlaps a first conductive structure of the first set of conductive structures. In some embodiments, the set of contacts extends in the second direction, overlaps the first set of conductive structures, and is located on the second level. In some embodiments, each of the contacts of the set of contacts being separated from an adjacent contact of the set of contacts in the first direction.

Still another aspect of this description relates to an integrated circuit. In some embodiments, the integrated circuit includes a set of active regions in a substrate, a first conductive structure, a first gate, a second gate, a first via and a set of contacts. In some embodiments, the set of active regions extends in a first direction, is located on a first level, and is separated from one another in a second direction different from the first direction. In some embodiments, the first conductive structure extends in the first direction, is located on the first level, and is between the set of active regions. In some embodiments, the first gate extends in the second direction, overlaps the first conductive structure and is located on a second level different from the first level. In some embodiments, the second gate extends in the second direction, is located on the second level, and is separated from the first gate in at least the first direction. In some embodiments, the first via couples the first conductive structure to the first gate, and is between the first conductive structure and the first gate. In some embodiments, the set of contacts extends in the second direction, overlaps the first conductive structure, and is located on the second level. In some embodiments, each of the contacts of the set of contacts is separated from an adjacent contact of the set of contacts in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a set of active regions in a substrate, the set of active regions extending in a first direction, being located on a first level, and being separated from one another in a second direction different from the first direction;
    a first set of conductive structures extending in at least the first direction or the second direction, being located on the first level, and being between the set of active regions;
    a shallow trench isolation (STI) region extending in at least the first direction or the second direction, being located on at least the first level, and being between the set of active regions and the first set of conductive structures;
    a set of gates extending in the second direction, overlapping at least the first set of conductive structures and being located on a second level different from the first level, each of the gates of the set of gates being separated from an adjacent gate of the set of gates in the first direction by a first pitch; and
    a set of contacts extending in the second direction, overlapping the first set of conductive structures, and being located on the second level, each of the contacts of the set of contacts being separated from an adjacent contact of the set of contacts in the first direction.

2. The integrated circuit of claim 1, further comprising:
    a first set of vias coupling the first set of conductive structures to the set of contacts, the first set of vias being between the first set of conductive structures and the set of contacts, and a via of the first set of vias being located where a contact of the set of contacts overlaps a conductive structure of the first set of conductive structures.

3. The integrated circuit of claim 2, further comprising:
    a second set of conductive structures extending in the first direction, being between the set of active regions, overlapping at least the set of gates, and being located on a third level different from the first level and the second level, and each of the conductive structures of the second set of conductive structures being separated from an adjacent conductive structure of the second set of conductive structures in the second direction.

4. The integrated circuit of claim 3, further comprising:
    a second set of vias coupling the second set of conductive structures to the set of contacts, the second set of vias being between the second set of conductive structures and the set of contacts, and a via of the second set of vias being located where a conductive structure of the second set of conductive structures overlaps another contact of the set of contacts.

5. The integrated circuit of claim 4, further comprising:
    a third set of vias coupling the second set of conductive structures to the set of gates, the third set of vias being between the second set of conductive structures and the set of gates, and a via of the third set of vias being located where another conductive structure of the second set of conductive structures overlaps a gate of the set of gates.

6. The integrated circuit of claim 5, further comprising:
    a third set of conductive structures extending in the second direction, being between the set of gates, overlapping at least the first set of conductive structures, and being located on a fourth level different from the first level, the second level and the third level, and each of the structures of the third set of conductive structures being separated from an adjacent structure of the third set of conductive structures in the first direction; and
    a fourth set of vias coupling the third set of conductive structures to the second set of conductive structures, the fourth set of vias being between the third set of conductive structures and the second set of conductive structures, and a via of the fourth set of vias being located where a structure of the third set of conductive structures overlaps the conductive structure of the second set of conductive structures.

7. The integrated circuit of claim 1, further comprising:
    a set of fins extending in the first direction and below the set of gates, each of the fins being separated from an adjacent fin of the set of fins in the second direction by a fin pitch.

8. The integrated circuit of claim 7, wherein a top surface of a conductive structure of the first set of conductive structures is below a top surface of an active region of the set of active regions or a top surface of a fin of the set of fins.

9. The integrated circuit of claim 1, wherein the integrated circuit comprises a transmission gate.

10. An integrated circuit comprising:
    a set of active regions in a substrate, the set of active regions extending in a first direction, being located on a first level, and being separated from one another in a second direction different from the first direction;
    a first set of conductive structures extending in at least the first direction or the second direction, being located on the first level, and being between the set of active regions;
    a set of gates extending in the second direction, overlapping at least the first set of conductive structures and being located on a second level different from the first level, each of the gates of the set of gates being separated from an adjacent gate of the set of gates in the first direction by a first pitch;
    a first set of vias coupling the first set of conductive structures to the set of gates, the first set of vias being between the first set of conductive structures and the set of gates, and a via of the first set of vias being located where a first gate of the set of gates overlaps a first conductive structure of the first set of conductive structures; and
    a set of contacts extending in the second direction, overlapping the first set of conductive structures, and being located on the second level, each of the contacts of the set of contacts being separated from an adjacent contact of the set of contacts in the first direction.

11. The integrated circuit of claim 10, further comprising:
    a second set of conductive structures extending in the first direction, being between the set of active regions, overlapping at least the set of gates, and being located on a third level different from the first level and the second level, and each of the conductive structures of the second set of conductive structures being separated from an adjacent conductive structure of the second set of conductive structures in the second direction.

12. The integrated circuit of claim 11, further comprising:
a second set of vias coupling the second set of conductive structures to the set of gates, the second set of vias being between the second set of conductive structures and the set of gates, and a via of the second set of vias being located where a first conductive structure of the second set of conductive structures overlaps the first gate of the set of gates.

13. The integrated circuit of claim 12, further comprising:
a third set of conductive structures extending in the second direction, being between the set of gates, overlapping at least the second set of conductive structures, and being located on a fourth level different from the first level, the second level and the third level, and each of the structures of the third set of conductive structures being separated from an adjacent structure of the third set of conductive structures in the first direction; and
a third set of vias coupling the third set of conductive structures to the second set of conductive structures, the third set of vias being between the third set of conductive structures and the second set of conductive structures, and a via of the third set of vias being located where a first structure of the third set of conductive structures overlaps the first conductive structure of the second set of conductive structures.

14. The integrated circuit of claim 10, wherein the integrated circuit comprises a transmission gate.

15. An integrated circuit comprising:
a set of active regions in a substrate, the set of active regions extending in a first direction, being located on a first level, and being separated from one another in a second direction different from the first direction;
a first conductive structure extending in the first direction, being located on the first level, and being between the set of active regions;
a first gate extending in the second direction, overlapping the first conductive structure and being located on a second level different from the first level;
a second gate extending in the second direction, being located on the second level, and being separated from the first gate in at least the first direction;
a first via coupling the first conductive structure to the first gate, and being between the first conductive structure and the first gate; and
a set of contacts extending in the second direction, overlapping the first conductive structure, and being located on the second level, each of the contacts of the set of contacts being separated from an adjacent contact of the set of contacts in the first direction.

16. The integrated circuit of claim 15, further comprising:
a second via coupling the first conductive structure to the second gate, and being between the first conductive structure and the second gate, wherein the second gate overlaps the first conductive structure.

17. The integrated circuit of claim 15, further comprising:
a second conductive structure extending in the first direction, being located on the first level, being between the set of active regions, and being separated from the first conductive structure in the second direction; and
a third conductive structure extending in the second direction, being located on the first level, being between the set of active regions, and being between the first gate and the second gate; and
a second via coupling the second conductive structure to the second gate, and being between the second conductive structure and the second gate.

18. The integrated circuit of claim 17, further comprising:
a third gate extending in the second direction, being separated from the first gate in the second direction, being separated from the second gate in the first direction, and being located on the second level; and
a fourth gate extending in the second direction, being separated from the first gate in the first direction, being separated from the second gate in the second direction, and being located on the second level.

19. The integrated circuit of claim 18, further comprising:
a fourth conductive structure extending in the first direction, being between the set of active regions, overlapping the first gate and the fourth gate, and being located on a third level different from the first level and the second level;
a fifth conductive structure extending in the first direction, being between the set of active regions, overlapping the second gate and the third gate, being located on the third level, and being separated from the fifth conductive structure in the second direction; and
a sixth conductive structure extending in the first direction, being between the fourth conductive structure and the fifth conductive structure, overlapping the third conductive structure, being located on the third level, and being separated from the fourth conductive structure and the fifth conductive structure in the second direction.

20. The integrated circuit of claim 19, further comprising:
a third via coupling the fifth conductive structure to the third gate, and being between the fifth conductive structure and the third gate; and
a fourth via coupling the fourth conductive structure to the fourth gate, and being between the fourth conductive structure and the fourth gate.

* * * * *